United States Patent [19]

Miwa et al.

[11] Patent Number: 5,352,624
[45] Date of Patent: Oct. 4, 1994

[54] SOI TYPE SEMICONDUCTOR DEVICE AND MANUFACTURING METHOD THEREFOR

[75] Inventors: Hiroyuki Miwa; Norikazu Ouchi, both of Kanagawa, Japan

[73] Assignee: Sony Corporation, Tokyo, Japan

[21] Appl. No.: 7,232

[22] Filed: Jan. 21, 1993

[30] Foreign Application Priority Data

| Jan. 23, 1992 [JP] | Japan | 4-034402 |
| Jan. 23, 1992 [JP] | Japan | 4-034403 |
| Feb. 4, 1992 [JP] | Japan | 4-047881 |
| Mar. 30, 1992 [JP] | Japan | 4-103738 |

[51] Int. Cl.$^5$ ............................................. H01L 21/86
[52] U.S. Cl. ..................................... 437/63; 437/32; 437/59
[58] Field of Search .................. 437/21, 32, 33, 59, 437/63; 148/DIG. 9, DIG. 10

[56] References Cited

U.S. PATENT DOCUMENTS

| 5,073,506 | 12/1991 | Maszara et al. | 437/32 |
| 5,100,810 | 3/1992 | Yoshimi et al. | 437/59 |
| 5,187,109 | 2/1993 | Cook et al. | 437/32 |

Primary Examiner—Tom Thomas
Assistant Examiner—Chandra Chaudhari
Attorney, Agent, or Firm—Hill, Steadman & Simpson

[57] ABSTRACT

A lateral bipolar transistor including a transistor forming region provided on an insulating substrate; a first impurity diffusing region provided on the insulating substrate on one side of the transistor forming region; an emitter region formed in a first portion of the transistor forming region adjacent to the first impurity diffusing region, the emitter region being formed by diffusing a first conduction type of impurity from the first impurity diffusing region into the first portion of the transistor forming region; a base region formed in a second portion of the transistor forming region adjacent to the emitter region, the base region being formed by diffusing a second conduction type of impurity from the first impurity diffusing region into the second portion of the transistor forming region; and a collector region formed in a third portion of the transistor forming region adjacent to the base region. Accordingly, a base width can be reduced, and a dimensional accuracy of the base width can be improved.

13 Claims, 32 Drawing Sheets

FIG. I
PRIOR ART
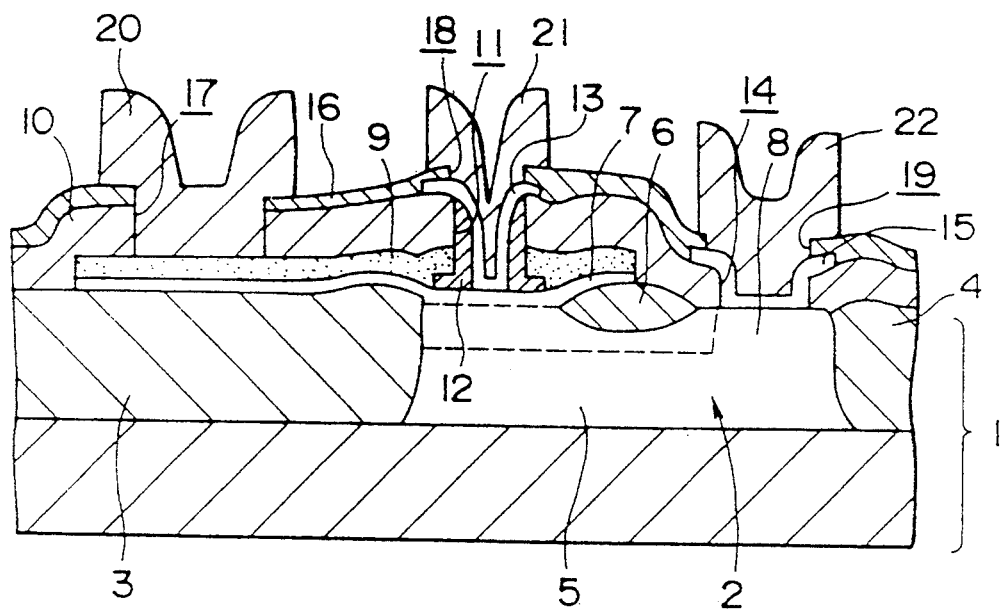
FIG. 2
PRIOR ART
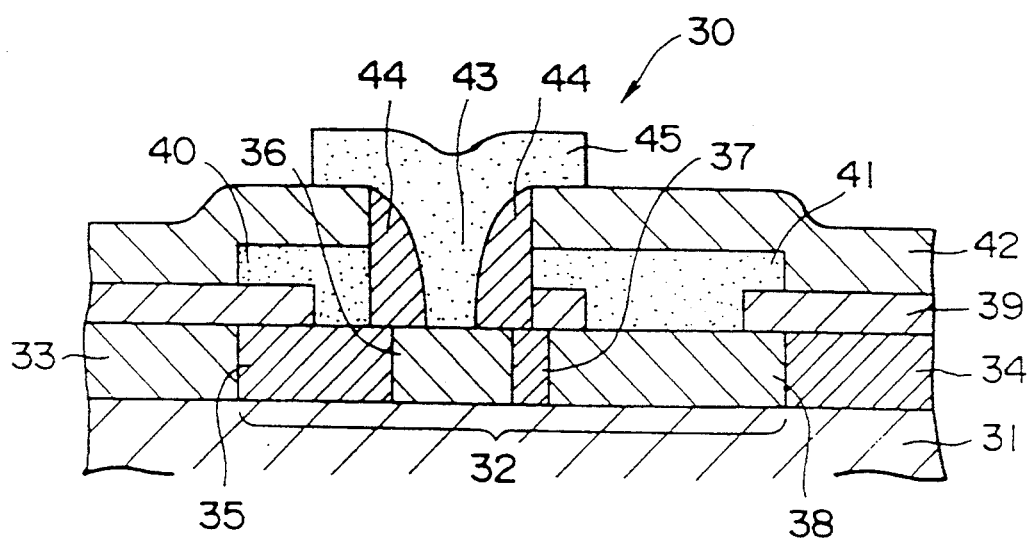

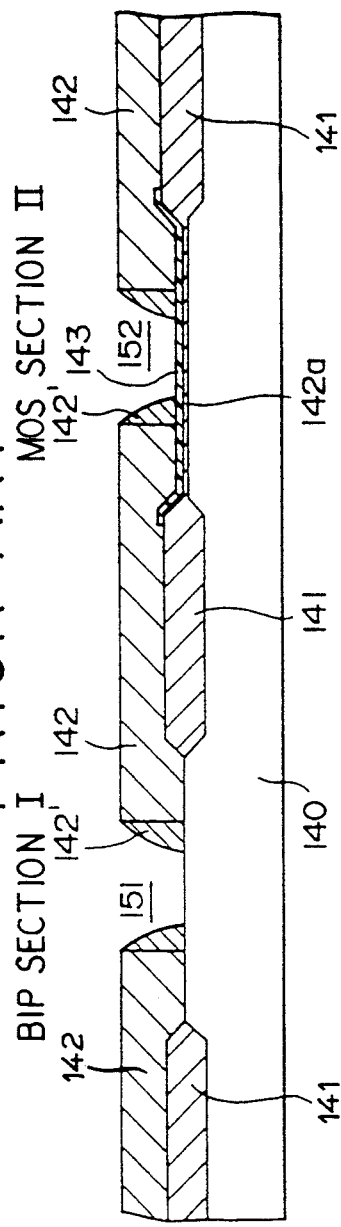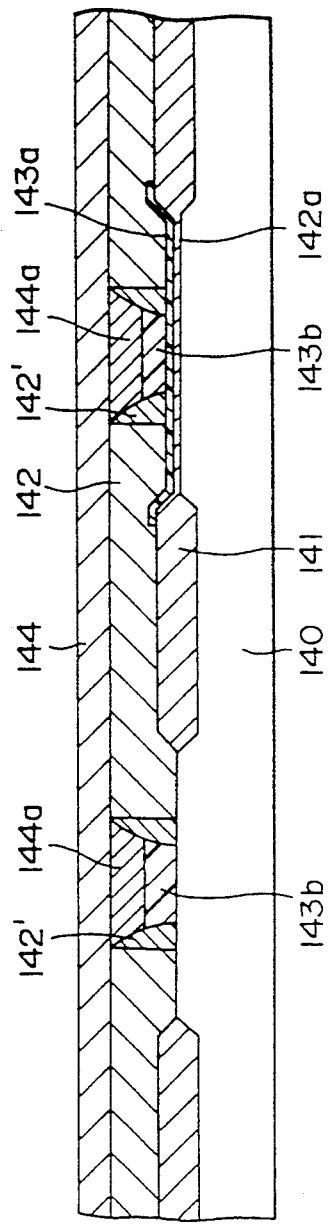

FIG. IIA
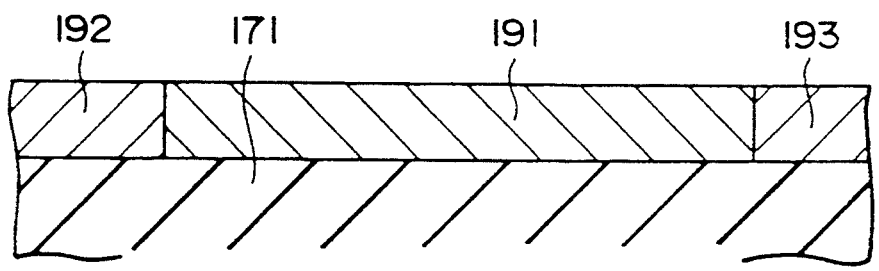
FIG. IIB
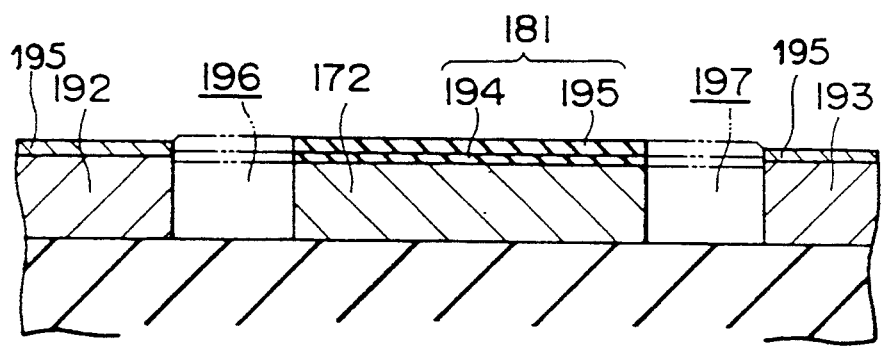
FIG. IIC
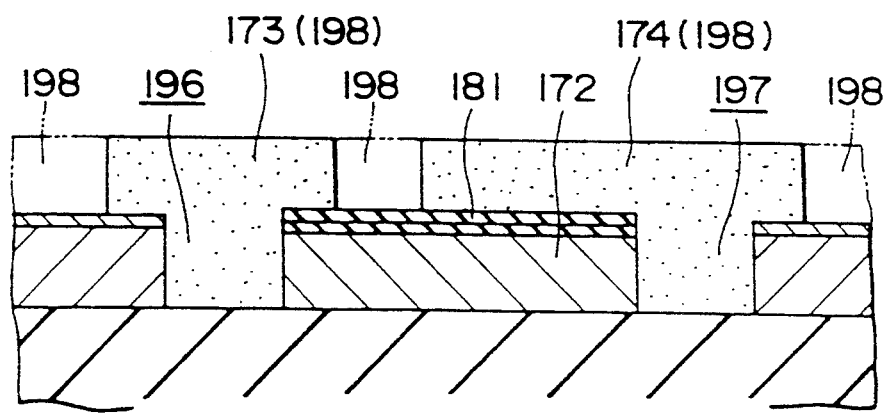

F I G. 11D
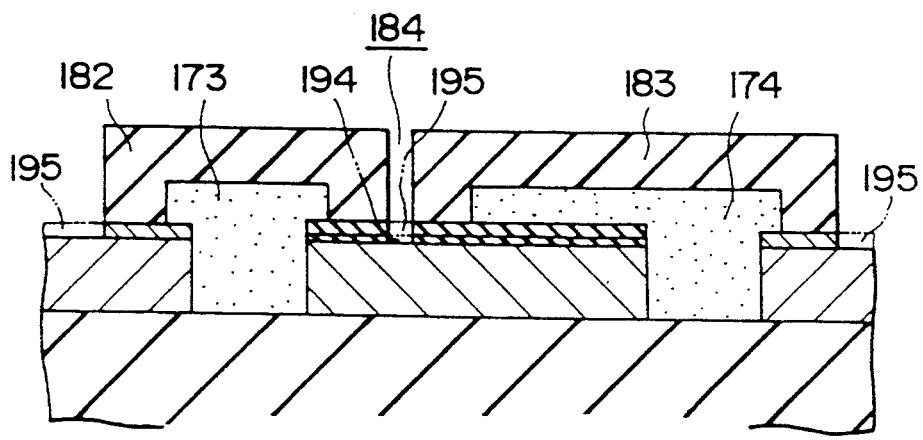
F I G. 11E
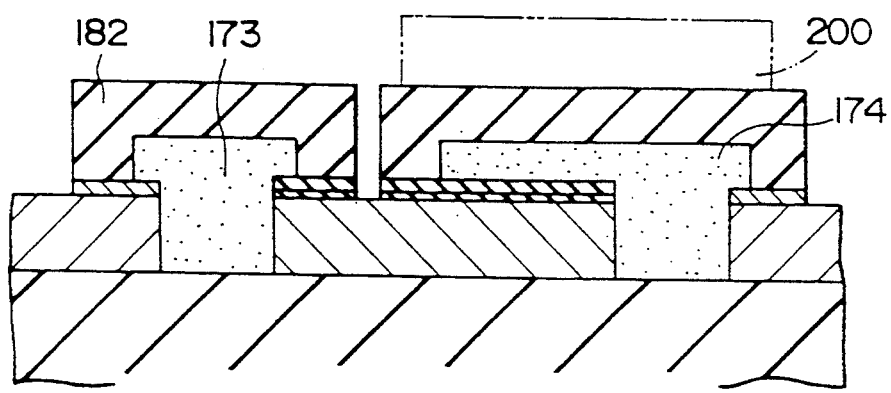
F I G. 11F
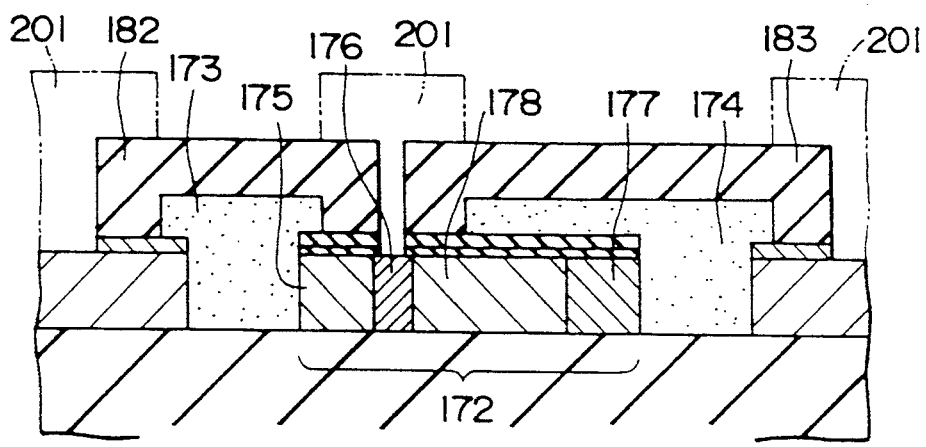

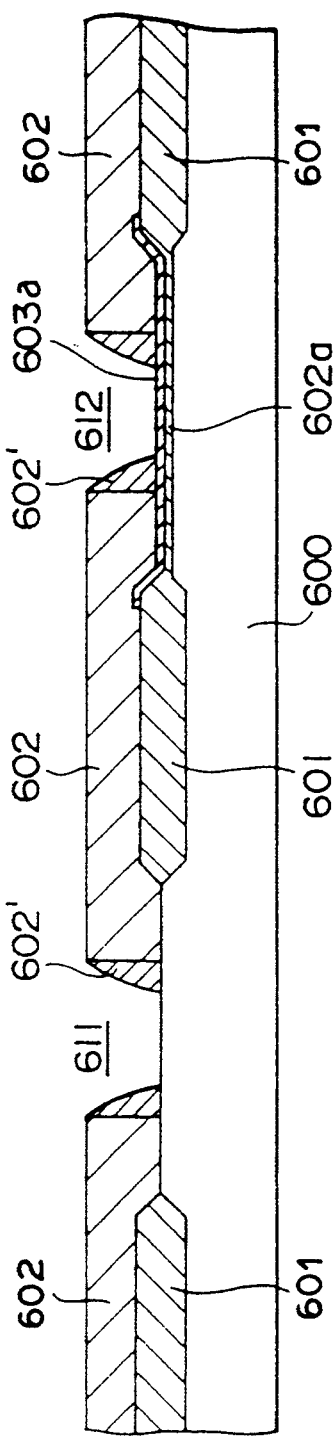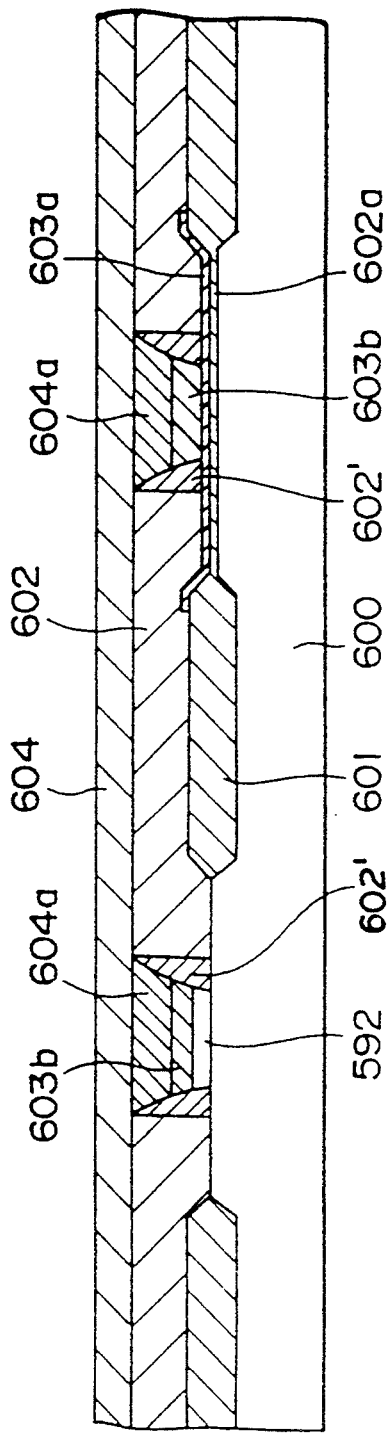

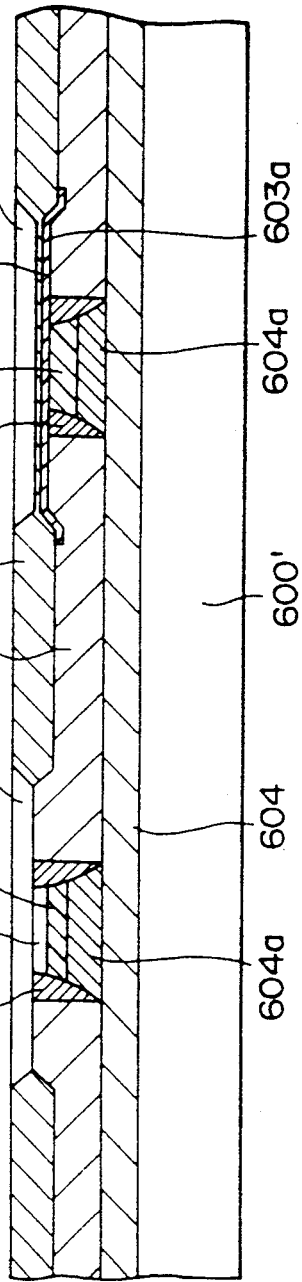
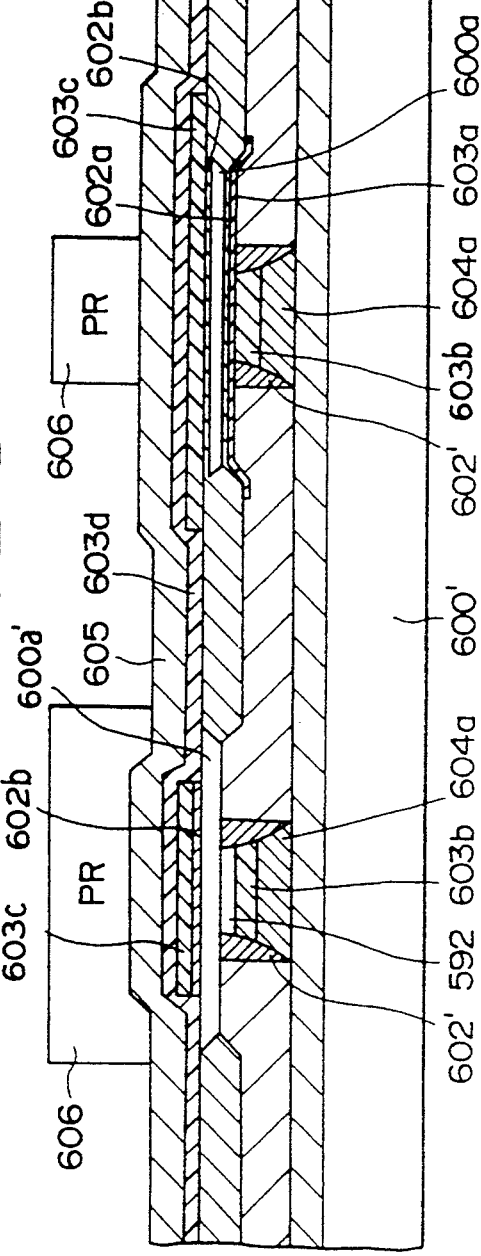

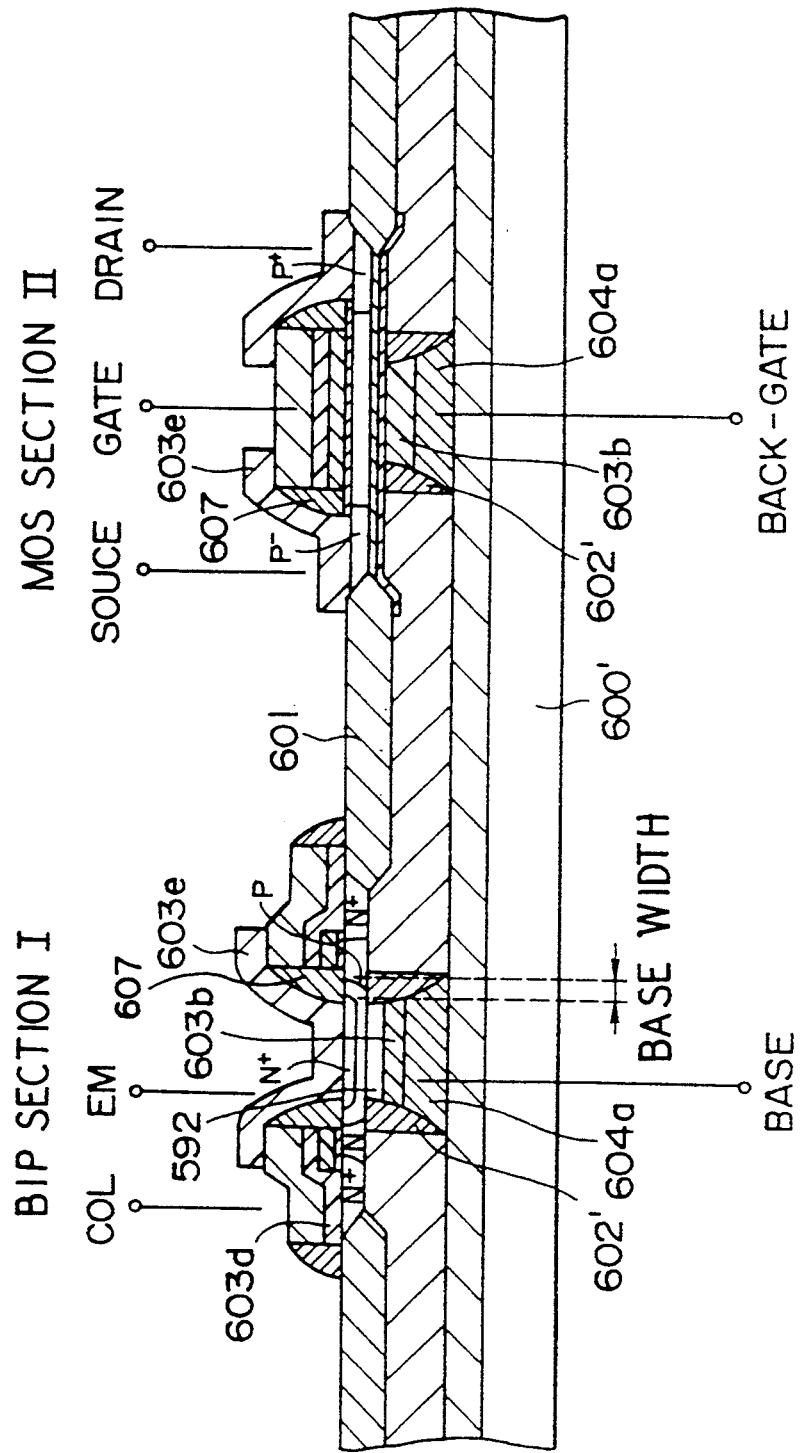

SOI TYPE SEMICONDUCTOR DEVICE AND MANUFACTURING METHOD THEREFOR

BACKGROUND OF THE INVENTION

The present invention relates generally to an SOI type semiconductor device and a manufacturing method therefor, and more particularly to a bipolar transistor, a Bi-MOS device and a manufacturing method therefor.

A bipolar transistor having an SOI structure has been proposed to aim at a reduction in junction capacitance Cjs, an improvement in α-ray resistance, etc.

On the other hand, a vertical bipolar transistor having an improved operating performance has also been proposed. Such a vertical bipolar transistor can make it possible to reduce a base width.

In forming an NPN bipolar transistor having a maximum cut-off frequency of about 32 GHz, for example, it must be formed as a vertical NPN bipolar transistor.

An example of such a vertical NPN bipolar transistor employing an SOI substrate will be described with reference to FIG. 1.

Referring to FIG. 1, reference numeral 1 designates an SOI substrate having an n-type silicon thin film 2. Element isolating regions 3 and 4 are formed in the n-type silicon thin film 2.

An n+ buried diffusion layer 5 is formed in a lower layer of the n-type silicon thin film 2. An element isolating region 6 is formed in an upper layer of the n-type silicon thin film 2 at a portion thereof above the n+ buried diffusion layer 5.

A p+ base region 7 is formed on an upper surface of the n-type silicon thin film 2 between the element isolating regions 3 and 6. The p+ base region 7 is formed from a p+ epitaxial silicon thin film. An n+ collector leading region 8 is formed in the upper layer of the n-type silicon thin film 2 between the element isolating regions 6 and 4 so as to be connected with the n+ buried diffusion layer 5.

A p+ polysilicon film 9 is formed on the p+ base region 7.

A first insulating film 10 is formed on the whole upper surface so as to cover the p+ polysilicon film 9.

A contact hole 11 is formed through the first insulating film 10 and the p+ polysilicon film 9 on the p+ base region 7. A side wall insulating film 12 is formed on a side wall of the contact hole 11. An n+ emitter region 13 is formed along a side wall of the side wall insulating film 12 so as to be connected with the p+ base region 7.

A contact hole 14 is formed through the first insulating film 10 on the n+ collector leading region 8. An n+ collector leading electrode 15 is formed in the contact hole 14 so as to be connected with the n+ collector leading region 8.

A second insulating film 16 is formed on the first insulating film 10 so as to overlap the n+ emitter region 13 and the n+ collector leading electrode 15. A contact hole 17 is formed through the first and second insulating films 10 and 16 on the p+ polysilicon film 9. A contact hole 18 is formed through the second insulating film 16 on the n+ emitter region 13. A contact hole 19 is formed through the second insulating film 16 on the n+ collector leading electrode 15.

A base electrode 20 is formed in the contact hole 17 so as to be connected with the p+ polysilicon film 9. An emitter electrode 21 is formed in the contact hole 18 so as to be connected with the n+ emitter region 13. A collector electrode 22 is formed in the contact hole 19 so as to be connected with the n+ collector leading electrode 15.

Thus, the vertical NPN bipolar transistor has the above construction.

In the vertical NPN bipolar transistor, the silicon thin film of the SOI substrate is required to have a thickness of about 1.0 μm. Accordingly, in the case of using a thin film MOS FET wherein a silicon thin film has a thickness of about 0.15 μm in combination with the above vertical NPN bipolar transistor, it is difficult to mount both the above thin film MOS FET and the above vertical NPN bipolar transistor on the same silicon thin film of the SOI substrate.

Further, in the vertical bipolar transistor, it is necessary to form the buried diffusion layer, so as to reduce a parasitic resistance. The formation of the buried diffusion layer causes enlargement of a bipolar transistor forming area, resulting in difficulty of high integration.

Under the above circumstances, there has been proposed a lateral bipolar transistor having an SOI structure which can make it possible to reduce a base width.

An SOI type lateral bipolar transistor in the prior art will be described with reference to FIG. 2.

Referring to FIG. 2, reference numeral 30 generally designates a lateral bipolar transistor. A transistor forming region 32 of monosilicon is formed on an insulating substrate (e.g., silicon oxide substrate) 31. Element isolating regions 33 and 34 are also formed on the insulating substrate 31 on both sides of the transistor forming region 32.

An emitter region 35, a base region 36, a collector region 37 and a high-concentration impurity region (which will be hereinafter referred to as a collector contact region) 38 for contact formation are formed in the transistor forming region 32 in this order from the element isolating region 33 side. The collector region 37 is formed as a portion of the transistor forming region 32.

An emitter leading electrode 40 is formed on the transistor forming region 32 so as to be connected with the emitter region 35 through a first silicon oxide film 39. A collector leading electrode 41 is formed on the transistor forming region 32 so as to be connected with the collector contact region 38 through the first silicon oxide film 39. A second silicon oxide film 42 is formed so as to cover the first silicon oxide film 39, the emitter leading electrode 40 and the collector leading electrode 41. A base contact portion 43 is formed between the emitter leading electrode 40 and the collector leading electrode 41 and through the second silicon oxide film 42. A side wall insulating film 44 is formed on a side wall of the base contact portion 43. A base leading electrode 45 is formed in the base contact portion 43 so as to be connected with the base region 36.

Thus, the lateral bipolar transistor 30 has the above construction.

A manufacturing method for such a lateral bipolar transistor will be described with reference to FIGS. 3A to 3E.

In the first step shown in FIG. 3A, an insulating substrate 51 and a monosilicon substrate 71 are bonded together by a usual wafer bonding method. Then, the monosilicon substrate 71 is polished to remove a portion shown by a two-dot chain line and thereby form a monosilicon region 72 on the insulating substrate 51.

In the second step shown in FIG. 3B, element isolating regions 53 and 54 are formed in the monosilicon region 72 by a LOCOS process. Thus, a portion of the monosilicon region 72 between the element isolating regions 53 and 54 is formed as a transistor forming region 52.

In the third step shown in FIG. 3C, a first silicon oxide film 59 is formed on the whole upper surface of the transistor forming region 52 and the element isolating regions 53 and 54 by a CVD process. Then, a portion of the first silicon oxide film 59 shown by a two-dot chain line is removed by a photolithography and etching process to form grooves 73 and 74.

In the fourth step shown in FIG. 3D, a polysilicon film 75 containing a first conduction type of impurity is formed in the grooves 73 and 74 and on the upper surface of the first silicon oxide film 59 by a CVD process. Then, a polysilicon region 76 is formed from the polysilicon film 75 by a photolithography and etching process. Then, a second silicon oxide film 62 is formed on the whole upper surface of the polysilicon region 76 and the first silicon oxide film 59 by a CVD process.

In the fifth step shown in FIG. 3E, a base contact portion 63 is formed through the second silicon oxide film 62 and the polysilicon region 76 by a photolithography and etching process. At the same time, an emitter leading electrode 60 and a collector leading electrode 61 are formed from the polysilicon region 76.

Then, a third silicon oxide film 77 is formed in the base contact portion 63 and on the upper surface of the second silicon oxide film 62, and is then etched back to form a side wall insulating film 64 on a side wall of the base contact portion 63 from the third silicon oxide film 77.

Then, a polysilicon film 78 containing a second conduction type of impurity is formed on the upper surface of the second silicon oxide film 62 so as to fill the base contact portion 63. Then, a portion of the polysilicon film 78 shown by a two-dot chain line is removed by a photolithography and etching process to form a base leading electrode 65 from the polysilicon film 78.

Then, the first conduction type of impurity contained in the emitter leading electrode 60 and the collector leading electrode 61 is diffused into the transistor forming region 52 by a thermal diffusion process to form an emitter region 55 and a collector contact region 58 in the transistor forming region 52. Similarly, the second conduction type of impurity contained in the base leading electrode 65 is diffused into the transistor forming region 52 by a thermal diffusion process to form a base region 56 in the transistor forming region 52. Further, the remaining portion of the transistor forming region 52 where no impurity has been diffused between the base region 56 and the collector region 58 is formed as a collector region 57.

In this way, a lateral bipolar transistor 50 shown in FIG. 3E is formed.

However, in the above lateral bipolar transistor, the base region is formed by diffusing the second conduction type of impurity from the base leading electrode into the transistor forming region. Therefore, the width of the base region is defined by the junction width of the base leading electrode and the transistor forming region between the opposed portions of the side wall insulating film. Accordingly, the width of the base region is fluctuated with variations in the width of the side wall insulating film, resulting in variations in electrical characteristics such as current amplification factor $h_{FE}$ and cut-off frequency $f_T$ to cause a reduction in reliability.

Recent LSIs having been practically applied are demanded to have a larger scale and higher performance. In particular, there has been proposed a Bi-CMOS device including a CMOS transistor allowing low power consumption and high integration and a bipolar transistor superior in high-speed operability, both being mounted on a common substrate.

However, in a field effect MOS transistor (MOS FET) having a very minute construction such that a gate length is in a subhalf micron level, there is a problem that a subthreshold characteristic is deteriorated because of a short channel effect. As measures for solving the problem, there has been proposed a MOS transistor having a complete depletion type thin film SOI structure.

In such a MOS transistor having a complete depletion type thin film SOI structure, the thickness of a thin silicon film having an SOI structure is set to be equal to or smaller than the thickness of a depletion layer to thereby terminate a drain electric field at a gate and prevent that the drain electric field will reach a source region. Therefore, the deterioration in the subthreshold characteristic due to the short channel effect can be suppressed.

Furthermore, in a MOS FET having a thin film SOI structure, bending of a band in a thin silicon film upon formation of an inversion layer is suppressed to reduce surface scattering of carriers. Therefore, a carrier mobility can be increased.

In particular, a MOS FET having a so-called double gate structure such that a thin silicon film of an SOI is sandwiched between two gate electrodes has an advantage that a transconductance gm can be enlarged more than that in a MOS FET having a single gate structure such that a single gate is formed on a thin silicon film of an SOI substrate.

FIG. 4 shows such a double gate type MOS FET in the prior art.

Referring to FIG. 4, reference numeral 80 generally designates a double gate MOS FET. An insulating layer 82 of silicon oxide is formed on a substrate 81. A thin silicon film 83 is formed in an upper layer of the insulating layer 82. A channel forming region 84 is formed in the thin silicon film 83. A source region 85 is formed in the thin silicon film 83 on one side of the channel forming region 84, and a drain region 86 is formed in the thin silicon film 83 on the other side of the channel forming region 84. A back gate electrode 88 is formed under the channel forming region 84 with a back gate insulating film 87 interposed therebetween. A front gate electrode 90 is formed over the channel forming region 84 with a front gate insulating film 89 interposed therebetween.

An insulating film 91 is formed on the whole upper surface of the insulating layer 82 so as to cover the thin silicon film 83 and the front gate electrode 90. Contact holes 92 and 93 are formed through the insulating film 91 on the source region 85 and the drain region 86, respectively. Electrodes 94 and 95 are formed in the contact holes 92 and 93 so as to be connected with the source region 85 and the drain region 86, respectively.

Thus, formed is the MOS FET 80 having a double gate structure such that the thin silicon film 83 of the SOI substrate is sandwiched between the back gate electrode 88 and the front gate electrode 90.

FIGS. 5 and 6 show a conventional bipolar transistor which can be mounted in combination with the MOS FET 80 mentioned above on the same SOI substrate.

Referring to FIG. 5, reference numeral 100 generally designates a lateral NPN bipolar transistor. An SOI substrate 101 is constituted of an insulating layer 102 and an n-type thin silicon film 103. Element isolating regions 104 and 105 are formed in the n-type thin silicon film 103. A silicon oxide film 106 is formed in an upper layer of the n-type thin silicon film 103 at a portion thereof adjacent to the element isolating region 104. An n+ collector electrode 107 is formed on an upper surface of the n-type thin silicon film 103 so as to overlap a portion of the silicon oxide film 106. A side wall insulating film 108 is formed on a side wall of the n+ collector electrode 107 on the element isolating region 104 side. An n+ emitter region 109 is formed in the n-type thin silicon film 103 at the portion thereof adjacent to the element isolating region 104. A p-type base region 110 is formed in the n-type thin silicon film 103 at a portion thereof adjacent to the n+ emitter region 109 under the side wall insulating film 108.

As shown in FIG. 6, p-type base contact portions 111 and 112 are connected with the p-type base region 110. Each of the p-type base contact portions 111 and 112 is formed as a diffusion layer in which a p-type impurity is diffused as similar to the p-type base region 110.

A remaining portion of the n-type thin silicon film 103 adjacent to the element isolating region 105 is formed as an n-type collector region 113.

Thus, the lateral NPN bipolar transistor 100 has the above construction.

The lateral NPN bipolar transistor 100 mentioned above is formed in the n-type thin silicon film 103 of the SOI substrate 101. Accordingly, the lateral NPN bipolar transistor 100 shown in FIGS. 5 and 6 and the MOS FET 80 shown in FIG. 4 can be mounted on the same SOI substrate.

However, in the lateral NPN bipolar transistor as mentioned above, the width of the side wall insulating film becomes the width of the base region. Therefore, if the width of the base region is equal to or smaller than 100 nm, the direct contact with the base region cannot be made, so that the contact with the base region should be located apart from the base region. As a result, a parasitic capacitance is increased to reduce electrical characteristics. Further, since the base region becomes large in size, an element area is increased to cause a bottleneck to high integration.

FIG. 7 shows another example of a double gate type MOS FET employing a thin film SOI. As shown in FIG. 7, an insulating layer 123 is formed on a base substrate 120 by a known bonding technique, and a thin bulk silicon film 123a is formed in an upper layer of the insulating layer 123. A front gate electrode 121a and a back gate electrode 121b are formed so as to interpose the silicon film 123a therebetween. A source region 122a and a drain region 122b are formed in the silicon film 123a on both sides of the front gate electrode 121a.

FIGS. 8A to 8F show a manufacturing process for the double gate structure of the MOS FET mentioned above.

As shown in FIG. 8A, field oxide films 131 and an insulating film (CVD oxide film) 132 are formed on a silicon substrate 130, and then the insulating film 132 is etched to form a back gate region.

As shown in FIG. 8B, a back gate oxide film 132a is formed in the back gate region, and then a polysilicon film 133 as a back gate electrode is formed on the back gate oxide film 132a.

As shown in FIG. 8C, an insulating film (CVD oxide film) 134 is formed on the insulating layer 132, and then an upper surface of the insulating film 134 is flattened by polishing.

As shown in FIG. 8D, a base substrate 130' having an oxide film 132' is bonded to the insulating film 134 of the silicon substrate 130 by a thermal bonding method utilizing vacuum electrostatic adsorption.

As shown in FIG. 8E (vertically inverted from FIG. 8D), the silicon substrate 130 is partially removed from its back surface (i.e., the lower surface as viewed in FIG. 8D) by grinding and selective polishing with use of the field oxide films 131 as a polish stopper. As a result, a thin silicon film (SOI) 130a is residually formed between the field oxide films 131.

As shown in FIG. 8F, a front gate electrode 135 is formed on the thin silicon film 130a through a front gate insulating film in a known manner.

As described above, such a double gate type MOS FET employing a thin film SOI is considered to be primarily applied as a MOS FET in a Bi-CMOS LSI of a subhalf micron class. Accordingly, it has been greatly demanded to realize a bipolar transistor which can suitably match the double gate type MOS FET.

In view of the above demand, there has already been proposed a high-performance bipolar transistor having an SOI structure and a manufacturing method therefor which can well match the double gate type MOS FET.

In this proposed bipolar transistor, an emitter region and a base region are formed by double diffusion from a common polysilicon film. Further, the contact with the base region (intrinsic base) is made on a bottom surface of the base region, so that a small base width to be determined at a side portion of the base region can be realized. Further, a reduction in electrical characteristics and degree of integration due to separation between the base region and the base contact can be prevented.

A manufacturing method for such a thin film SOI type bipolar transistor and a double gate thin film SOI type MOS FET to be mounted on a common SOI substrate will be described with reference to FIGS. 9A to 9E.

In the first step shown in FIG. 9A, a silicon substrate 140 with a crystal orientation of <100> is oxidized by LOCOS to form field oxide films (SiO$_2$) 141 for element isolation. These field oxide films 141 also serve as a polish stopper in a wafer polishing step to be hereinafter described.

The thickness of a thin silicon layer constituting a thin film SOI substrate to be formed later is about ½ of the thickness of each field oxide film. For example, when the thickness of each field oxide film is set to 200 nm, the thickness of the thin silicon layer becomes about 100 nm.

Then, a back gate oxide film 142a is formed on the upper surface of the silicon substrate 140, and then a polysilicon film 143a is formed on the back gate oxide film 142a. Then, the polysilicon film 143a and the back gate oxide film 142a on a bipolar transistor forming region only are removed.

Then, an insulating layer (SiO$_2$) 142 is formed by CVD on the upper surface of the silicon substrate 140, and then the upper surface of the insulating layer 142 is flattened by etch-back after resist coating. The thickness of the insulating layer 142 after flattened is about 100–200 nm.

Then, grooves 151 and 152 are formed through the insulating layer 142 at the bipolar transistor forming region and a MOS FET forming region, respectively.

Then, side wall films (SiO$_2$) 142' are formed on side walls of the grooves 151 and 152 by CVD and RIE. These side wall films 142' serve to allow for alignment between a base region (intrinsic base) and a base contact of the bipolar transistor and between a back gate electrode and a gate electrode of the MOS FET.

In the second step shown in FIG. 9B, a polysilicon film 143b is formed by CVD on the upper surface of the insulating layer 142 so as to fill the grooves 151 and 152, and then the polysilicon film 143b is removed by etchback after resist coating to form a base leading electrode of the bipolar transistor and a back gate electrode of the MOS FET in the grooves 151 and 152, respectively.

The formation of the base leading electrode and the back gate electrode may be effected by selective CVD. The thickness of each polysilicon film 143b formed in the grooves 151 and 152 is about 50–100 nm.

Then, as required, a suitable conduction type of impurity is introduced into the polysilicon film 143b and diffused therein by ion implantation and annealing. For example, when forming an NPN bipolar transistor, the polysilicon film 143b in the groove 151 is doped with a p-type impurity; when forming a PMOS FET, the polysilicon film 143b in the groove 152 is doped with a p-type impurity; and when forming an NMOS FET, the polysilicon film 143b in the groove 152 is doped with an n-type impurity.

Then, tungsten (W) electrodes 144a are formed in the grooves 151 and 152 by selective CVD, so as to reduce wiring resistances of the base leading electrode and the back gate electrode. Then, an insulating film (SiO$_2$) 144 is formed by CVD on the insulating film 142.

In the third step shown in FIG. 9C (vertically inverted from FIG. 9B), a silicon substrate 140' as a back wafer is bonded to a back surface of the insulating film 144, and then the silicon substrate 140 is polished from its upper surface as viewed in FIG. 9C until the field oxide films 141 are exposed, so that thin silicon layers 140a as SOI regions are residually formed between the field oxide films 141.

In the fourth step shown in FIG. 9D, a gate oxide film 142b is formed on the thin silicon layers 140a by thermal oxidation, and then a polysilicon film 143c is formed on the gate oxide film 142b by CVD. Then, the polysilicon film 143c and the gate oxide film 142b are etched by RIE with a resist mask covering an emitter and base region forming area and a MOS FET forming area.

Then, a polysilicon film 143d is formed so as to fully cover the polysilicon film 143c patterned above. The polysilicon films 143c and 143d function as a collector leading electrode of the bipolar transistor and a gate electrode of the MOS FET. Then, as required, a suitable conduction type of impurity is introduced into the polysilicon film 143d and diffused therein by ion implantation and annealing. For example, when forming an NPN bipolar transistor, the polysilicon film 143d for the collector leading electrode is doped with an n-type impurity; when forming a PMOS FET, the polysilicon film 143d for the gate electrode is doped with a p-type impurity; and when forming an NMOS FET, the polysilicon film 143d is doped with an n-type impurity.

Then, an insulating film (SiO$_2$) 145 is formed by CVD on the polysilicon film 143d. Then, a resist mask 146 is formed on the insulating film 145 so as to cover the bipolar transistor forming region and a gate electrode forming region.

In the fifth step shown in FIG. 9E, the insulating film 145 and the polysilicon film 143d are etched by RIE with the resist mask 146.

Then, the insulating film 145, the polysilicon film 143d, the polysilicon film 143c and the gate oxide film 142b existing on the bipolar transistor forming region are etched by RIE to form an emitter contact hole.

Then, side wall insulating films (SiO$_2$) 147 are formed by CVD and RIE on side walls of the emitter contact hole and the gate electrode. In the case of making an LDD structure in the MOS FET, ion implantation for forming an LDD is performed before forming the side wall insulating films 147. In this case, the side wall insulating film 147 on the side wall of the gate electrode also serves as an LDD spacer.

Then, a polysilicon film 143e is formed on the whole upper surface. The polysilicon film 143e on the bipolar transistor forming region functions as an emitter leading electrode, and the polysilicon film 143e on the MOS FET forming region functions as source and drain leading electrodes.

Then, in the case of an NPN bipolar transistor, a p-type impurity such as boron ions (B+) is implanted into the polysilicon film 143e on the bipolar transistor forming region, and then annealing is performed to form a p-type base region in the thin silicon layer 140a. Then, an n-type impurity such as arsenic ions (As+) is implanted into the polysilicon film 143e on the bipolar transistor forming region, and then annealing is performed to form an n+ emitter region in the thin silicon layer 140a on the p-type base region. Further, in the case of a PMOS FET, a p-type impurity such as boron ions (B+) is implanted into the polysilicon film 143e on the MOS FET forming region, and then annealing is performed to form p+ source and drain regions in the thin silicon layer 140a, while in the case of an NMOS FET, an n-type impurity such as arsenic ions (As+) is implanted into the polysilicon film 143e on the MOS FET forming region, and then annealing is performed to form n+ source and drain regions in the thin silicon layer 140a.

Then, the polysilicon film 143e is etched to form the emitter leading electrode and the source and drain leading electrodes.

Then, although not shown, an insulating film (SiO$_2$) is formed on the whole upper surface, and then contact holes are formed through the insulating film so as to expose the emitter leading electrode, the collector leading electrode, the source leading electrode and the drain leading electrode. Then, metal electrodes are formed in the contact holes from Ti/TiN/Al-Si, polysilicon/tungsten silicide, etc.

In this manner, the thin film SOI type bipolar transistor and the double gate thin film SOI type MOS FET are simultaneously formed on the same substrate. This bipolar transistor is constituted of an intrinsic region and a minimum contact region, and is substantially surrounded by an insulator, thus effecting high performance and high integration.

According to this technique, the base contact is formed just under the base region to thereby form a high-performance lateral bipolar transistor. Further, the polysilicon film for forming the base leading electrode of the bipolar transistor and the polysilicon film for forming the back gate electrode of the MOS FET are simultaneously buried in the same substrate, thus easily simultaneously forming the high-performance thin film SOI type bipolar transistor and the double gate thin film SOI type MOS FET on the same substrate.

However, this technique still has the following problem. That is, while the base contact is formed from the polysilicon film buried just under the base region, there is a possibility that the high-concentration impurity introduced into the polysilicon film forming the base contact is undesirably diffused into the base region by a thermal process upon forming elements.

This problem is considered to be due to the fact that:

(1) the base contact of the polysilicon film is located close to the base region (intrinsic base); and (2) a diffusion coefficient of the impurity in the polysilicon film is large.

The diffusion of the high-concentration impurity into the base region causes an increase in base Gummel Number, which will in turn cause various adverse effects on characteristics such as a fluctuation in Hfe, a reduction in Vebo and an increase in Cje.

SUMMARY OF THE INVENTION

It is a first object of the present invention to provide a lateral bipolar transistor and a manufacturing method therefor which can reduce a base width and improve a dimensional accuracy of the base width.

It is a second object of the present invention to provide a vertical bipolar transistor and a manufacturing method therefor which can ensure high integration and high performance.

It is a third object of the present invention to provide a semiconductor device having a bipolar transistor and a MOS transistor mounted on a common SOI substrate and a manufacturing method therefor which can ensure high integration and high performance.

It is a fourth object of the present invention to provide a bipolar transistor, a semiconductor device and a manufacturing method therefor which can prevent a reduction in characteristics and degree of integration due to separation between a base region and a base contact and further prevent that a high-concentration impurity introduced into a contact region is diffused into the base region.

According to a first aspect of the present invention, there is provided a lateral bipolar transistor comprising a transistor forming region provided on an insulating substrate; a first impurity diffusing region provided on said insulating substrate on one side of said transistor forming region; an emitter region formed in a first portion of said transistor forming region adjacent to said first impurity diffusing region, said emitter region being formed by diffusing a first conduction type of impurity from said first impurity diffusing region into said first portion of said transistor forming region; a base region formed in a second portion of said transistor forming region adjacent to said emitter region, said base region being formed by diffusing a second conduction type of impurity from said first impurity diffusing region into said second portion of said transistor forming region; and a collector region formed in a third portion of said transistor forming region adjacent to said base region.

According to a second aspect of the present invention, there is provided a lateral bipolar transistor comprising a first conduction type of transistor forming region provided on an insulating substrate; a first impurity diffusing region provided on said insulating substrate on one side of said transistor forming region; a second impurity diffusing region provided on said insulating substrate on the other side of said transistor forming region; an emitter region formed in a first portion of said transistor forming region adjacent to said first impurity diffusing region, said emitter region being formed by diffusing a first conduction type of impurity from said first impurity diffusing region into said first portion of said transistor forming region; a base region formed in a second portion of said transistor forming region adjacent to said emitter region, said base region being formed by diffusing a second conduction type of impurity from said first impurity diffusing region into said second portion of said transistor forming region; a collector region formed in a third portion of said transistor forming region adjacent to said base region so as to be connected to said base region; and a collector contact region formed in a fourth portion of said transistor forming region adjacent to said collector region so as to be connected to said collector region, said collector contact region being formed by diffusing said first conduction type of impurity from said second impurity diffusing region into said fourth portion of said transistor forming region.

With the above construction according to the first and second aspects, the base region is formed in the transistor forming region by diffusing the second conduction type of impurity contained in the first impurity diffusing region into the transistor forming region, and the emitter region is formed in the transistor forming region by diffusing the first conduction type of impurity contained in the first impurity diffusing region into the transistor forming region. Therefore, the width of the base region can be reduced with a high dimensional accuracy. Accordingly, electrical characteristics such as current amplification factor $h_{FE}$ and cut-off frequency $f_T$ can be improved to thereby improve the reliability.

According to a third aspect of the present invention, there is provided a manufacturing method for a lateral bipolar transistor, comprising the first step of forming a transistor forming region on an upper surface of an insulating substrate; the second step of forming a first insulating film on an upper surface of said transistor forming region; the third step of forming a first impurity diffusing region on one side of said transistor forming region; and the fourth step of introducing a second conduction type of impurity into said first impurity diffusing region, then introducing a first conduction type of impurity into said first impurity diffusing region, then diffusing said second conduction type of impurity from said first impurity diffusing region into a first portion of said transistor forming region near said first impurity diffusing region to form a base region in said first portion, and simultaneously diffusing said first conduction type of impurity from said first impurity diffusing region into a second portion of said transistor forming region between said first portion and said first impurity diffusing region to form an emitter region in said second portion.

According to a fourth aspect of the present invention, there is provided a manufacturing method for a lateral bipolar transistor, comprising the first step of forming a transistor forming region on an upper surface of an insulating substrate; the second step of forming a first insulating film on an upper surface of said transistor forming region: the third step of forming a first impurity diffusing region on one side of said transistor forming region; and the fourth step of introducing a second conduction type of impurity into said first impurity diffusing region, and then diffusing said second conduction type of impurity from said first impurity diffusing region into a first portion of said transistor forming region near said first impurity diffusing region to form a base region in said first portion; and the fifth step of introducing a first conduction type of impurity into said first impurity diffusing region, and then diffusing said first conduction type of impurity from said first impurity diffusing region into a second portion of said transistor forming region between said first portion and said first impurity diffusing region to form an emitter region in said second portion.

According to a fifth aspect of the present invention, there is provided a manufacturing method for a lateral bipolar transistor, comprising the first step of forming a transistor forming region of a first conduction type on an upper surface of an insulating substrate; the second step of forming a first insulating film on an upper surface of said transistor forming region: the third step of forming a first impurity diffusing region on one side of said transistor forming region and forming a second impurity diffusing region on the other side of said transistor forming region; the fourth step of forming a second insulating film on a surface of said first impurity diffusing region and forming a third insulating film on a surface of said second impurity diffusing region; and the fifth step of introducing a second conduction type of impurity into said first impurity diffusing region, then introducing a first conduction type of impurity into said first impurity diffusing region and said second impurity diffusing region, then diffusing said second conduction type of impurity from said first impurity diffusing region into a first portion of said transistor forming region near said first impurity diffusing region to form a base region in said first portion, simultaneously diffusing said first conduction type of impurity from said first impurity diffusing region into a second portion of said transistor forming region between said first portion and said first impurity diffusing region to form an emitter region in said second portion, and simultaneously diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion.

According to a sixth aspect of the present invention, there is provided a manufacturing method for a lateral bipolar transistor, comprising the first step of forming a transistor forming region of a first conduction type on an upper surface of an insulating substrate; the second step of forming a first insulating film on an upper surface of said transistor forming region; the third step of forming a first impurity diffusing region on one side of said transistor forming region and forming a second impurity diffusing region on the other side of said transistor forming region; the fourth step of forming a second insulating film on a surface of said first impurity diffusing region and forming a third insulating film on a surface of said second impurity diffusing region; the fifth step of introducing a second conduction type of impurity into said first impurity diffusing region and then diffusing said second conduction type of impurity from said first impurity diffusing region into a first portion of said transistor forming region near said first impurity diffusing region to form a base region in said first portion: and the sixth step of introducing a first conduction type of impurity into said first impurity diffusing region and said second impurity diffusing region, then diffusing said first conduction type of impurity from said first impurity diffusing region into a second portion of said transistor forming region between said first portion and said first impurity diffusing region to form an emitter region in said second portion, and simultaneously diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion.

With the above construction according to the third to sixth aspects, the first conduction type of impurity and the second conduction type of impurity are introduced into the first impurity diffusing region, and thereafter diffused into the transistor forming region. Therefore, the width of the base region is defined by a difference in diffusion coefficient between the first conduction type of impurity and the second conduction type of impurity. Accordingly, the width of the base region can be controlled accurately and easily.

According to a seventh aspect of the present invention, there is provided a manufacturing method for a lateral bipolar transistor, comprising the first step of forming a transistor forming region on an upper surface of an insulating substrate; the second step of forming a first insulating film on an upper surface of said transistor forming region; the third step of forming a first impurity diffusing region on one side of said transistor forming region and forming a second impurity diffusing region on the other side of said transistor forming region; the fourth step of forming a second insulating film on a surface of said first impurity diffusing region and forming a third insulating film on a surface of said second impurity diffusing region in a self-alignment manner; and the fifth step of diffusing a second conduction type of impurity from said first impurity diffusing region into a first portion of said transistor forming region below a spacing between said second insulating film and said third insulating film to form a base region in said first portion, diffusing a first conduction type of impurity from said first impurity diffusing region into a second portion of said transistor forming region adjacent to said first impurity diffusing region to form an emitter region in said second portion, diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion, forming a base contact portion through said first insulating film in said spacing between said second insulating film and said third insulating film, and forming a base leading electrode in said base contact portion.

With this construction according to the seventh aspect, the first insulating film and the second insulating film are formed in a self-aligned manner to reduce the spacing between the first and second insulating films. Accordingly, a base electrode can be accurately formed in the narrow base region.

According to an eighth aspect of the present invention, there is provided a bipolar transistor formed in an SOI substrate having a laminated structure of an insulating layer and a silicon layer, comprising a base region formed in an upper layer of said silicon layer; an emitter region formed in an upper layer of said base region; a graft base region formed in the upper layer of said silicon layer on at least one side of said base region so as to be connected with said base region; a collector region formed in said insulating layer under said base region so as to be connected with said base region; and a collector leading electrode formed in said insulating layer under said collector region so as to be connected with said collector region.

With the above construction according to the eighth aspect, the collector region and the collector leading electrode are formed in the insulating layer of the SOI substrate under the emitter region and the base region of the bipolar transistor. Therefore, the bipolar transistor can be formed as a vertical bipolar transistor. Accordingly, a high level of maximum cutoff frequency in characteristics of the bipolar transistor can be ensured to thereby improve the transistor performance.

Further, since the bipolar transistor is formed in the SOI substrate, the bipolar transistor is substantially surrounded by the insulating layer. Accordingly, high performance of the bipolar transistor can be ensured.

According to a ninth aspect of the present invention, there is provided a manufacturing method for a bipolar transistor, comprising the first step of forming first and second element isolating regions spaced from each other in a surface layer of a silicon substrate, then forming a first insulating layer on an entire surface where said first and second element isolating regions are formed, and then forming a groove reaching said silicon substrate through said first insulating layer; the second step of forming a collector region connected with said silicon substrate in said groove, then forming a collector leading electrode connected with said collector region in said groove, and then forming a second insulating layer on an entire surface where said collector leading electrode is formed; the third step of partially removing said silicon substrate to such an extent that said first and second element isolating regions are exposed, and thereby forming a silicon layer from said silicon substrate remaining between said first and second element isolating regions; the fourth step of forming an isolating pattern on a portion of said silicon layer over said collector region; the fifth step of forming a polysilicon film and an insulating film on an entire surface where said isolating pattern is formed, then forming a graft base region in an upper layer of said silicon layer at a portion thereof adjacent to at least one of said first and second element isolating regions, and then partially removing said insulating film, said polysilicon film and said isolating pattern on a portion of said silicon layer to form an emitter contact portion; and the sixth step of forming an emitter side wall insulating film on a side wall of said emitter contact portion, then forming a leading electrode forming film in said emitter contact portion, then diffusing an impurity from said leading electrode forming film into the upper layer of said silicon layer to form a base region connected with said graft base region and form an emitter region in an upper layer of said base region, and then forming an emitter leading electrode from said leading electrode forming film.

With the above construction according to the ninth aspect, the groove is first formed in the first insulating layer of the SOI substrate; the collector region is secondly formed in the groove; and the silicon layer is thirdly formed on the collector region. Thereafter, the base region and the emitter region are formed in the silicon layer. Thus, the bipolar transistor in the SOI substrate can be formed as a high-performance vertical bipolar transistor.

According to a tenth aspect of the present invention, there is provided a semiconductor device comprising a bipolar transistor and a MOS transistor both formed in an SOI substrate having an insulating layer, a first silicon layer and a second silicon layer; said bipolar transistor comprising a base region formed in an upper layer of said first silicon layer; an emitter region formed in an upper layer of said base region; a graft base region formed in the upper layer of said first silicon layer on at least one side of said base region so as to be connected with said base region; a collector region formed in said insulating layer under said base region so as to be connected with said base region; and a collector leading electrode formed in said insulating layer under said collector region so as to be connected with said collector region; said MOS transistor comprising a gate insulating film formed on an upper surface of said second silicon layer: a gate electrode formed on an upper surface of said gate insulating film; a pair of source and drain regions formed in said second silicon layer on both sides of said gate electrode; a back gate insulating film formed so as to be connected with a lower surface of said second silicon layer; and a back gate electrode formed in said insulating layer under said gate electrode so as to be connected with a lower surface of said back gate insulating film.

With the above construction according to the tenth aspect, a high-performance bipolar transistor and a back gate type MOS transistor can be mounted on the common SOI substrate. Accordingly, a high-performance Bi-CMOS device for example can be provided.

According to an eleventh aspect of the present invention, there is provided a manufacturing method for a semiconductor device having a bipolar transistor and a MOS transistor, comprising the first step of forming first, second and third element isolating elements spaced from each other for isolating a bipolar transistor forming region from a MOS transistor forming region in a surface layer of a silicon substrate, then forming a back gate insulating film on an entire surface of said silicon substrate in said MOS transistor forming region, then forming a first insulating layer on an entire surface where said first, second and third element isolating regions are formed, and then forming first and second grooves reaching said silicon substrate through said first insulating layer in said bipolar transistor forming region and said MOS transistor forming region, respectively: the second step of forming a collector region connected with said silicon substrate in said first groove, then forming a collector leading electrode connected with said collector region in said first groove and a back gate electrode in said second groove, and then forming a second insulating layer on an entire surface where said first insulating layer is formed; the third step of partially removing said silicon substrate to such an extent that said first, second and third element isolating regions are exposed, and thereby forming a first silicon layer from said silicon substrate remaining between said first and second element isolating regions and a second silicon layer from said silicon substrate remaining between said second and third element isolating regions; the fourth step of forming an isolating pattern on a portion of said first silicon layer over said collector region and simultaneously forming a gate insulator forming film on an upper surface of said second silicon layer to thereafter form a gate electrode forming film on said gate insulator forming film; the fifth step of forming a polysilicon film and an insulating film on an entire surface where said isolating pattern and said gate electrode forming film are formed, then forming a graft base region in an upper layer of said first silicon layer at a portion thereof adjacent to at least one of said first and second element isolating regions, then partially removing said insulating film, said polysilicon film and said isolating pattern on a portion of said first silicon layer to there form an emitter contact portion and a base leading electrode from said polysilicon film, and simultaneously partially removing said insulating film, said polysilicon film, said gate electrode forming film and said gate insulator forming film on a portion of said second silicon layer to thereby form a gate electrode from said polysilicon film and said gate electrode forming film and a gate insulating film from said gate insulator forming film; and the sixth step of forming an emitter side wall insulating film on a side wall of said emitter contact portion, then forming a leading electrode forming film on an entire surface where said insulating film is formed, then forming a base region connected with said graft base region in the upper layer of said first silicon layer, an emitter region in an upper layer of said base region, and a pair of source and drain regions in said second silicon layer on both sides of said gate electrode, and then forming an emitter leading electrode in said emitter contact portion from said leading electrode forming film and a pair of source and drain leading electrodes respectively connected with said source and drain regions on both sides of said gate electrode from said leading electrode forming film.

With the above construction according to the eleventh aspect, the first and second grooves are first formed in the first insulating layer of the SOI substrate; the collector region and the collector leading electrode are secondly formed in the first groove, and the back gate electrode is simultaneously formed in the second groove; and the first and second silicon layers are thirdly formed on the collector region and the back gate electrode. Thus, a vertical bipolar transistor and a back gate type MOS transistor can be formed in the common SOI substrate by substantially the same process.

According to a twelfth aspect of the present invention, there is provided a bipolar transistor formed in an SOI substrate having a laminated structure of an insulating layer and a silicon layer, comprising a base region formed in an upper layer of said silicon layer; an emitter region formed in an upper layer of said base region; a collector region formed in said silicon layer on at least one side of said base region so that a portion of said silicon layer remains between said base region and said collector region; and a base leading electrode formed in said insulating layer under said base region so as to be connected with said base region.

With the above construction according to the twelfth aspect, the base leading electrode is formed in the insulating layer of the SOI substrate under the emitter region and the base region of the bipolar transistor. Therefore, a forming area of a base contact portion in a bipolar transistor forming region can be made small. Furthermore, since the base leading electrode can be located near the base region, a parasitic capacitance can be reduced to thereby improve the characteristics of the bipolar transistor. Furthermore, since the bipolar transistor is formed in the SOI substrate, the bipolar transistor is substantially surrounded by an insulator, so that high performance of the bipolar transistor can be achieved.

According to a thirteenth aspect of the present invention, there is provided a manufacturing method for a bipolar transistor, comprising the first step of forming first and second element isolating regions spaced from each other in a surface layer of a silicon substrate, then forming a first insulating layer on an entire surface where said first and second element isolating regions are formed, and then forming a groove reaching said silicon substrate through said first insulating layer; the second step of forming a base leading electrode connected with said silicon substrate in said groove, and then forming a second insulating layer on an entire surface where said base leading electrode is formed; the third step of partially removing said silicon substrate to such an extent that said first and second element isolating regions are exposed, and thereby forming a silicon layer from said silicon substrate remaining between said first and second element isolating regions; the fourth step of forming an isolating pattern on a portion of said silicon layer over said base leading electrode: the fifth step of forming a polysilicon film and an insulating film on an entire surface where said isolating pattern is formed, then forming a collector region in said silicon layer at a portion thereof adjacent to at least one of said first and second element isolating regions, and then partially removing said insulating film, said polysilicon film and said isolating pattern on a portion of said silicon layer to form an emitter contact portion; and the sixth step of forming an emitter side wall insulating film on a side wall of said emitter contact portion, then forming a leading electrode forming film in said emitter contact portion, then diffusing an impurity from said leading electrode forming film into said silicon layer to form a base region connected with said base leading electrode and form an emitter region in an upper layer of said base region, and then forming an emitter leading electrode from said leading electrode forming film.

With the above construction according to the thirteenth aspect, the groove is first formed in the first insulating layer; the base leading electrode is secondly formed in the groove; and the silicon layer is thirdly formed on the base leading electrode. Thereafter, the base region is formed in the silicon layer. Accordingly, a forming area of the bipolar transistor to be formed in the SOI can be reduced.

According to a fourteenth aspect of the present invention, there is provided a semiconductor device comprising a bipolar transistor and a MOS transistor both formed in an SOI substrate having an insulating layer, a first silicon layer and a second silicon layer; said bipolar transistor comprising a base region formed in an upper layer of said first silicon layer; an emitter region formed in an upper layer of said base region; a collector region formed in said first silicon layer on at least one side of said base region so that a portion of said silicon layer remains between said base region and said collector region; and a base leading electrode formed in said insulating layer under said base region so as to be connected with said base region; said MOS transistor comprising a gate insulating film formed on an upper surface of said second silicon layer; a gate electrode formed on an upper surface of said gate insulating film; a pair of source and drain regions formed in said second silicon layer on both sides of said gate electrode; a back gate insulating film formed so as to be connected with a lower surface of said second silicon layer; and a back gate electrode formed in said insulating layer under said gate electrode so as to be connected with a lower surface of said back gate insulating film.

With the above construction according to the fourteenth aspect, a high-performance bipolar transistor and a back gate type MOS transistor can be mounted on the common SOI substrate. Accordingly, a high-performance Bi-CMOS device for example can be provided.

According to a fifteenth aspect of the present invention, there is provided a manufacturing method for a semiconductor device having a bipolar transistor and a MOS transistor, comprising the first step of forming first, second and third element isolating elements spaced from each other for isolating a bipolar transistor forming region from a MOS transistor forming region in a surface layer of a silicon substrate, then forming a back gate insulating film on an entire surface of said silicon substrate in said MOS transistor forming region, then forming a first insulating layer on an entire surface where said first, second and third element isolating regions are formed, and then forming first and second grooves reaching said silicon substrate through said first insulating layer in said bipolar transistor forming region and said MOS transistor forming region, respectively; the second step of forming a base leading electrode connected with said silicon substrate in said first groove and a back gate electrode in said second groove, and then forming a second insulating layer on an entire surface where said first insulating layer is formed; the third step of partially removing said silicon substrate to such an extent that said first, second and third element isolating regions are exposed, and thereby forming a first silicon layer from said silicon substrate remaining between said first and second element isolating regions and a second silicon layer from said silicon substrate remaining between said second and third element isolating regions; the fourth step of forming an isolating pattern on a portion of said first silicon layer over said base leading electrode and simultaneously forming a gate insulator forming film on an upper surface of said second silicon layer to thereafter form a gate electrode forming film on said gate insulator forming film; the fifth step of forming a polysilicon film and an insulating film on an entire surface where said isolating pattern and said gate electrode forming film are formed, then forming a collector region in said first silicon layer at a portion thereof adjacent to at least one of said first and second element isolating regions, then partially removing said insulating film, said polysilicon film and said isolating pattern on a portion of said first silicon layer to there form an emitter contact portion and a collector leading electrode from said polysilicon film, and simultaneously partially removing said insulating film, said polysilicon film, said gate electrode forming film and said gate insulator forming film on a portion of said second silicon layer to thereby form a gate electrode from said polysilicon film and said gate electrode forming film and a gate insulating film from said gate insulator forming film; and the sixth step of forming an emitter side wall insulating film on a side wall of said emitter contact portion and a gate side wall insulating film on a side wall of said gate electrode, then forming a leading electrode forming film on an entire surface where said insulating film is formed, then forming a base region in said first silicon layer, an emitter region in an upper layer of said base region, and a pair of source and drain regions in said second silicon layer on both sides of said gate electrode, and then forming an emitter leading electrode in said emitter contact portion from said leading electrode forming film and a pair of source and drain leading electrodes respectively connected with said source and drain regions on both sides of said gate electrode from said leading electrode forming film.

With the above construction according to the fifteenth aspect of the present invention, the first and second grooves are first formed in the first insulating layer; the base leading electrode is secondly formed in the first groove, and the back gate electrode is simultaneously formed in the second groove; and the first and second silicon layers are thirdly formed on the base leading electrode and the back gate electrode. Thus, a lateral bipolar transistor and a back gate type MOS transistor can be formed in the common SOI substrate by substantially the same process.

According to a sixteenth aspect of the present invention, there is provided in a bipolar transistor formed in an SOI substrate having a laminated structure of an insulating layer and a silicon layer, comprising a base region formed in an upper layer of said silicon layer; an emitter region formed in an upper layer of said base region; a collector region formed in said silicon layer on at least one side of said base region so that a portion of said silicon layer remains between said base region and said collector region; and a base leading electrode formed in said insulating layer under said base region so as to be connected with said base region; the improvement wherein said base leading electrode comprises a monosilicon layer formed just under said base region so as to contact said base region and a polysilicon layer formed just under said monosilicon layer.

According to a seventeenth aspect of the present invention, there is provided in a semiconductor device comprising a bipolar transistor and a MOS transistor both formed in an SOI substrate having an insulating layer, a first silicon layer and a second silicon layer; said bipolar transistor comprising a base region formed in an upper layer of said first silicon layer; an emitter region formed in an upper layer of said base region; a collector region formed in said first silicon layer on at least one side of said base region so that a portion of said silicon layer remains between said base region and said collector region; and a base leading electrode formed in said insulating layer under said base region so as to be connected with said base region; said MOS transistor comprising a gate insulating film formed on an upper surface of said second silicon layer; a gate electrode formed on an upper surface of said gate insulating film; a pair of source and drain regions formed in said second silicon layer on both sides of said gate electrode; a back gate insulating film formed so as to be connected with a lower surface of said second silicon layer; and a back gate electrode formed in said insulating layer under said gate electrode so as to be connected with a lower surface of said back gate insulating film; the improvement wherein said base leading electrode comprises a monosilicon layer formed just under said base region so as to contact said base region and a polysilicon layer formed just under said monosilicon layer.

According to an eighteenth aspect of the present invention, there is provided a manufacturing method for a semiconductor device having a bipolar transistor and a MOS transistor, comprising the first step of forming a back gate insulating film on a silicon substrate in a MOS transistor forming region, then forming a first insulating layer on said silicon substrate, and then forming first and second grooves through said first insulating layer in a bipolar transistor forming region and said MOS transistor forming region, respectively; the second step of forming a monosilicon layer in said first groove, then forming first and second polysilicon layers in said first and second grooves to simultaneously form a base leading electrode and a back gate electrode, respectively, and then forming a second insulating layer on said first insulating layer; the third step of bonding a back wafer to said second insulating layer, then polishing said silicon substrate to form first and second silicon layers in said bipolar transistor forming region and said MOS transistor forming region, respectively; the fourth step of forming a gate insulating film on said first and second silicon layers, then forming third and fourth polysilicon layers on said gate insulating film over said first and silicon layers, respectively, then forming a collector region in said first silicon layer, then forming a collector leading electrode and a gate electrode from said third and fourth polysilicon layers, respectively, then forming a base region in said first silicon layer and source and drain regions in said second silicon layer by diffusion of an impurity from said third and fourth polysilicon layers, respectively, and then forming an emitter region in an upper layer of said base region by diffusion of an impurity from said third polysilicon layer.

With the above construction according to the sixteenth to eighteenth aspects, the monosilicon layer as the base contact is formed just under the base region. Accordingly, a reduction in characteristics and degree of integration due to separation between the base region and the base contact can be prevented. Furthermore, a high-concentration impurity introduced into a contact region can be prevented from being diffused into the base region. Further, a high-performance SOI type lateral bipolar transistor can be realized.

Other objects and features of the invention will be more fully understood from the following detailed description and appended claims when taken with the accompanying drawings.

BRIEF DESCRIPTION OF THE DRAWINGS

FIG. 1 is a schematic sectional view of a vertical NPN bipolar transistor as a first example in the prior art;

FIG. 2 is a schematic sectional view of a lateral bipolar transistor as a second example in the prior art;

FIGS. 9A to 9E are schematic sectional views illustrating a manufacturing method for a Bi-MOS transistor having an SOI structure as a sixth example in the prior art;

FIGS. 11A to 11F are schematic sectional views illustrating a manufacturing method for the lateral bipolar transistor shown in FIG. 10;

FIGS. 21A to 21E are schematic sectional views illustrating a manufacturing method for a Bi-MOS transistor according to a sixth preferred embodiment of the present invention.

DETAILED DESCRIPTION OF THE PREFERRED EMBODIMENTS

A first preferred embodiment of the present invention will be described with reference to FIG. 10.

Figure 10:
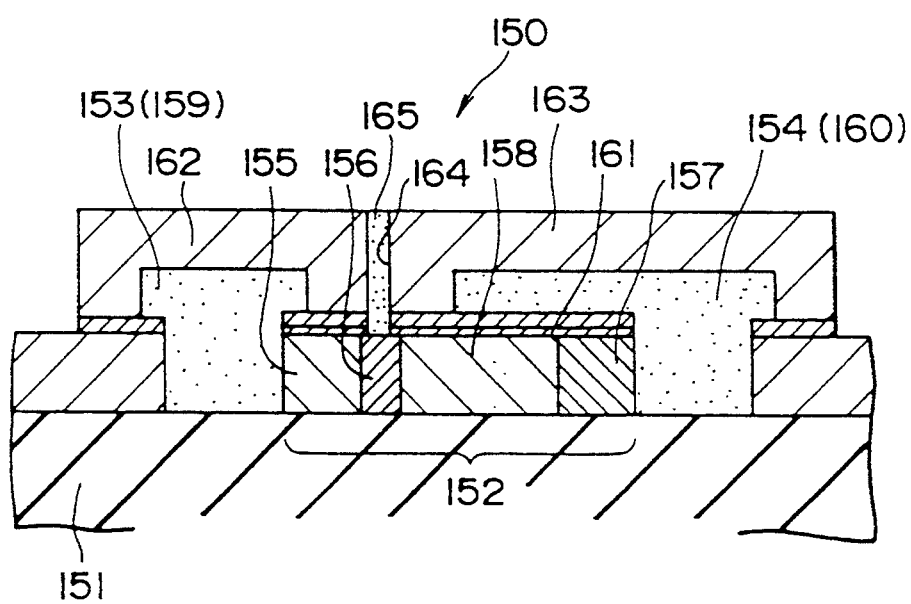
FIG. 10 is a schematic sectional view of a lateral bipolar transistor according to a first preferred embodiment of the present invention.

Referring to FIG. 10, reference numeral 150 generally designates a lateral bipolar transistor according to the first preferred embodiment. A transistor forming region 152 of monosilicon is formed on the upper surface of an insulating substrate 151 of silicon oxide.

A first impurity diffusing region 153 of polysilicon is formed on the insulating substrate 151 on one side of the transistor forming region 152.

A second impurity diffusing region 154 of polysilicon is formed on the insulating substrate 151 on the other side of the transistor forming region 152.

An emitter region 155 is formed in one side portion of the transistor forming region 152 adjacent to the first impurity diffusing region 153. The emitter region 155 is formed by diffusing a first conduction type of impurity from the first impurity diffusing region 153 into the transistor forming region 152.

A base region 156 is formed in an inner portion of the transistor forming region 152 adjacent to the emitter region 155. The base region 156 is formed by diffusing a second conduction type of impurity from the first impurity diffusing region 153 into the transistor forming region 152.

A collector contact region 157 is formed in the other side portion of the transistor forming region 152 adjacent to the second impurity diffusing region 154. The collector contact region 157 is formed by diffusing the first conduction type of impurity from the second impurity diffusing region 154 into the transistor forming region 152. The remaining portion of the transistor forming region 152 between the base region 156 and the collector contact region 157 is formed as a collector region 158.

An emitter leading electrode 159 is formed as the first impurity diffusing region 153, and a collector leading electrode 160 is formed as the second impurity diffusing region 154.

A first insulating film 161 constituted of a silicon oxide film and a silicon nitride film is formed on the upper surface of the transistor forming region 152.

A second insulating film 162 of silicon oxide is formed on the surface of the first impurity diffusing region 153, and a third insulating film 163 of silicon oxide is formed on the surface of the second impurity diffusing region 154.

A base contact portion 164 is formed between the second and third insulating films 162 and 163 and through the first insulating film 161. A base leading electrode 165 is formed in the base contact portion 164 so as to be connected to the base region 156.

Thus, the lateral bipolar transistor 150 has the above construction.

In the lateral bipolar transistor 150, the base region 156 is formed by diffusing the second conduction type of impurity contained in the first impurity diffusing region 153 into the transistor forming region 152, and the emitter region 155 is formed by diffusing the first conduction type of impurity contained in the first impurity diffusing region 153 into the transistor forming region 152. Therefore, the width of the base region 156 is defined by a difference in diffusion coefficient between the first conduction type of impurity and the second conduction type of impurity. Accordingly, the width of the base region 156 can be reduced.

A manufacturing method for a lateral bipolar transistor according to the first preferred embodiment will be described with reference to FIGS. 11A to 11F and 12.

In the first step shown in FIG. 11A, a monosilicon substrate 191 of a first conduction type is bonded to the upper surface of an insulating substrate 171 by a usual wafer bonding method. Then, the monosilicon substrate 191 is polished to reach a thickness of 50–100 nm.

Then, element isolating regions 191 and 193 are formed in the monosilicon substrate 191 by a LOCOS process.

In the second step shown in FIG. 11B, a silicon oxide film 194 having a thickness of 30 nm is formed in the upper layer of the monosilicon substrate 191 by a thermal oxidation process.

The thermal oxidation process is performed under the condition where the monosilicon substrate 191 bonded to the insulating substrate 171 is allowed to stand in an oxidative atmosphere at 900° C. for 10 minutes.

Then, a silicon nitride film 195 having a thickness of 100 nm is formed on the whole upper surface of the silicon oxide film 194 and the element isolating regions 192 and 193 by an LPCVD process.

Then, portions of the silicon nitride film 195, the silicon oxide film 194 and the monosilicon substrate 191 shown by two-dot chain lines in FIG. 11B are removed by a photolithography and anisotropic etching process to form a transistor forming region 172 from the monosilicon substrate 191 and a first insulating film 181 from the silicon oxide film 194 and the silicon nitride film 195. Accordingly, a groove (or hole) 196 is formed between the element isolating region 192 and the transistor forming region 172, and a groove (or hole) 197 is formed between the element isolating region 193 and the transistor forming region 172.

The anisotropic etching is performed by using a reactive ion etching device, for example. The silicon nitride film 195 and the silicon oxide film 194 are etched by using trifluoromethane ($CHF_3$) for example as an etching gas, and the monosilicon substrate 191 is etched by using nitrogen trifluoride ($NF_3$) for example as an etching gas.

In the third step shown in FIG. 11C, a polysilicon film 198 is formed on the whole upper surface of the silicon nitride film 195 so as to fill the grooves 196 and 197 by an LPCVD process. The polysilicon film 198 has a thickness about twice the depth of the grooves 196 and 197. In the case where the depth of the grooves 196 and 197 is 50–100 nm, for example, the thickness of the polysilicon film 198 is set to about 100–200 nm.

Then, a portion of the polysilicon film 198 shown by a two-dot chain line in FIG. 11C is removed by a photolithography and etching process to form a first impurity diffusing region 173 and a second impurity diffusing region 174 from the remaining polysilicon film 198. The first and second impurity diffusing regions 173 and 174 are formed in such a manner that they overlap the first insulating film 181 on the transistor forming region 172 and a spacing between the first and second impurity diffusing regions 173 and 174 is set to 200 nm, for example.

In the fourth step shown in FIG. 11D, surface layers of the first and second impurity diffusing regions 173 and 174 are oxidized by a thermal oxidation process to form a second insulating film 182 in the surface layer of the first impurity diffusing region 173 and form a third insulating film 183 in the surface layer of the second impurity diffusing region 174. The thickness of the second and third insulating films 182 and 183 is set to 140 nm, for example. In this case, a spacing between the second and third insulating films 182 and 183 becomes about 60 nm.

Then, the silicon nitride film 195 (a portion shown by a two-dot chain line in FIG. 11D) is etched off by dipping the same in a hot phosphoric acid solution, and the silicon oxide film 194 (a portion shown by a dashed line in FIG. 11D) is then etched off by dipping the same in a hydrofluoric acid solution. At this time, surface layers of the second and third insulating films 182 and 183 are also etched off. In this way, a base contact portion 184 is formed.

In the fifth step shown in FIG. 11E, an ion implantation mask 200 (shown by a two-dot chain line in FIG. 11E) is formed so as to cover the upper side of the second impurity diffusing region 174 by a photolithography process. Then, a second conduction type of impurity is introduced through the second insulating film 182 into the first impurity diffusing region 173 by an ion implantation process.

The ion implantation of the second conduction type of impurity is performed under the conditions that boron ions ($B^+$) are used as the second conduction type of impurity, an acceleration energy is set to 50 KeV, and a dose is set to $1 \times 10^{14}$–$3 \times 10^{14}/cm^2$.

Then, the ion implantation mask 200 is removed by an ashing process or the like.

Then, an annealing process is performed in an atmosphere of inert gas at 800° C. for 30 minutes to thereby uniformly diffuse the second conduction of impurity in the first impurity diffusing region 173.

Subsequently, an annealing process may be performed in an atmosphere of inert gas at 900° C. for about 10–20 minutes to thereby diffuse the second conduction type of impurity from the first impurity diffusing region 173 into the transistor forming region 172, thus preliminarily form a base region 176 in the transistor forming region 172.

In the sixth step shown in FIG. 11F, an ion implantation mask 201 (shown by a two-dot chain line) is formed on the whole upper surface except the upper side of the first impurity diffusing region 173 and the upper side of the second impurity diffusing region 174 by a photolithography process.

Then, a first conduction type of impurity is introduced through the second insulating film 182 into the first impurity diffusing region 173 and through the third insulating film 183 into the second impurity diffusing region 174 by an ion implantation process.

The ion implantation process of the first conduction type of impurity is performed under the conditions that arsenic ions (As+) are used as the first conduction type of impurity, an acceleration energy is set to 250 KeV, and a dose is set to $1 \times 10^{16} - 2 \times 10^{16}/cm^2$.

Then, the ion implantation mask 201 is removed by an ashing process or the like.

Then, an annealing process is performed in an atmosphere of inert gas at 800° C. for 30 minutes to thereby uniformly diffuse the first conduction type of impurity in the first impurity diffusing region 173 and the second impurity diffusing region 174.

Then, a diffusion process by rapid thermal anneal (RTA) is performed in an atmosphere of inert gas at 1000°–1100° C. for 10 seconds to diffuse the second conduction type of impurity from the first impurity diffusing region 173 into the transistor forming region 173, thereby forming a base region 176 in a portion of the transistor forming region 172 just under the base contact portion 184.

Simultaneously, the first conduction type of impurity contained in the first impurity diffusing region 173 is diffused into the transistor forming region 172, thereby forming an emitter region 175 in one side portion of the transistor forming region 172 adjacent to the base region 176 on the first impurity diffusing region 173 side.

Simultaneously, the first conduction type of impurity contained in the second impurity diffusing region 174 is diffused into the transistor forming region 172, thereby forming a collector contact region 177 in the other side portion of the transistor forming region 172 on the second impurity diffusing region 174 side.

The remaining portion of the transistor forming region 172 between the base region 176 and the collector contact region 177 is formed as a collector region 178 where no impurity has been diffused from the first and second impurity diffusing regions 173 and 174.

Figure 12:
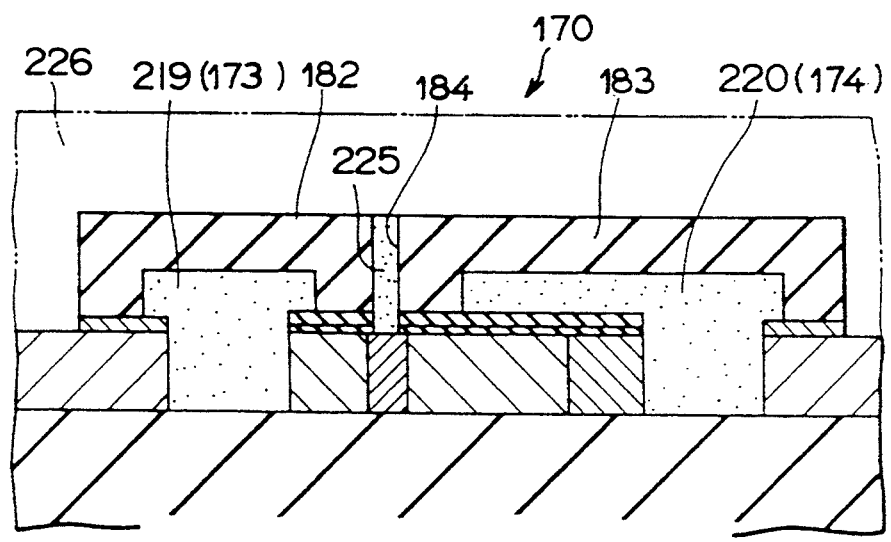
FIG. 12 is a schematic sectional view illustrating a manufacturing method for a base leading electrode in the lateral bipolar transistor shown in FIG. 10.

In the final step shown in FIG. 12, a polysilicon film 226 having a thickness of 200 nm is formed on the whole upper surface so as to cover the second and third insulating films 182 and 183 and fill the base contact portion 184 by an LPCVD process.

Then, a portion of the polysilicon film 226 shown by a two-dot chain line is removed by a photolithography and etching process to form a base leading electrode 225.

The first impurity diffusing region 173 serves as an emitter leading electrode 219, and the second impurity diffusing region 174 serves as a collector leading electrode 220.

In this way, a lateral bipolar transistor 170 shown in FIG. 12 is formed.

Since the second and third insulating films 182 and 183 are formed by oxidizing the surface layers of the first and second impurity diffusing regions 173 and 174, the spacing between the second and third insulating films 182 and 183 is smaller than that between the first and second impurity diffusing regions 173 and 174.

In the case where excimer laser is used in the photolithography process for forming the first and second impurity diffusing regions 173 and 174, the widths of the emitter region 175, the base region 176, the collector region 178 and the collector contact region 177 become 0.1 μm, 0.05 μm, 0.2 μm and 0.1 μm, respectively, for example.

Further, since the collector region 178 is formed as the remaining portion of the transistor forming region 172 where no high-concentration impurity has been diffused between the base region 176 and the collector contact region 177, a sufficient withstand voltage between the collector and the base can be ensured.

In the manufacturing method for the lateral bipolar transistor 170, the first conduction type of impurity and the second conduction type of impurity are introduced into the first impurity diffusing region 173, and thereafter diffused into the transistor forming region 172. Therefore, the width of the base region 176 is defined by a difference in diffusion coefficient between the first conduction type of impurity and the second conduction type of impurity. Accordingly, the width of the base region 176 can be easily controlled.

A second preferred embodiment of the present invention will be described with reference to FIG. 13.

Figure 13:
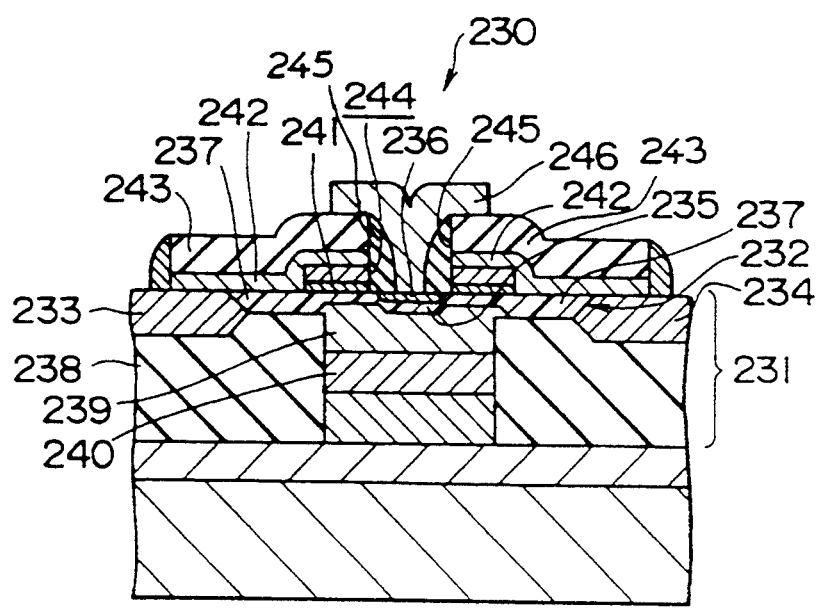
FIG. 13 is a schematic sectional view of a vertical bipolar transistor according to a second preferred embodiment of the present invention.

Referring to FIG. 13, reference numeral 230 generally designates a bipolar transistor according to the second preferred embodiment. The bipolar transistor 230 employs a thin film SOI substrate 231 as an SOI substrate. The thin film SOI substrate 231 is constituted of an insulating layer 238 and a silicon layer 232 of a first conduction type (to be defined as an n-type in this preferred embodiment). Element isolating regions 233 and 234 are formed in the n-type silicon layer 232. A base region 235 of a second conduction type (to be defined as a p-type in this preferred embodiment) is formed in an upper layer of the n-type silicon layer 232 between the element isolating regions 233 and 234.

An n+ emitter region 236 is formed in an upper layer of the p-type base region 235.

A p+ graft base region 237 is formed in the upper layer of the n-type silicon layer 232 on both sides of the p-type base region 235 so as to be connected with the p-type base region 235. Such a p+ graft base region may be formed on one side of the p-type base region 235.

An n-type collector region 239 is formed in the insulating layer 238 under the p-type base region 235 so as to be connected with the p-type base region 235.

An n+ collector leading electrode 240 is formed in the insulating layer 238 under the n-type collector region 239 so as to be connected with the n-type collector region 239.

An isolating pattern 241 is formed on an upper surface of the n-type silicon layer 232 at a portion thereof. A p+ base leading electrode 242 is formed on the element isolating regions 233 and 234 so as to overlap the isolating pattern 241 and be connected with the p+ graft base region 237. An insulating film 243 is formed on the p+ base leading electrode 242. An emitter contact portion 244 is formed through the insulating film 243 on the n+ emitter region 236. An emitter side wall insulating film 245 is formed on a side wall of the emitter contact portion 244. An n+ emitter leading electrode 246 is formed in the emitter contact portion 244 so as to be connected with the n+ emitter region 236.

Thus, the bipolar transistor 230 has the above construction.

Although the first conduction type and the second conduction type are defined as an n-type and a p-type, respectively, in the above description, the first conduction type and the second conduction type may be defined as a p-type and an n-type, respectively, according to the present invention.

In the above bipolar transistor 230, the n-type collector region 239 and the n+ collector leading electrode 240 are formed in the insulating layer 238 of the thin film SOI substrate 231, and the n-type silicon layer 232 of the thin film SOI substrate 231 is formed so as to be connected with the n-type collector region 239. Therefore, the bipolar transistor 230 is constructed of an intrinsic region (the p-type base region 235, the n+ emitter region 236 and the n-type collector region 239) and a minimum contact region (the p+ graft base region 237). Accordingly, a forming area of the bipolar transistor 230 can be reduced.

Further, since the bipolar transistor 230 is substantially surrounded by an insulator (the insulating layer 238), high performance can be ensured. In particular, since the structure of the p-type base region 235 and the n+ emitter region 236 is similar to that of a vertical bipolar transistor having a dual-layer polysilicon structure in the prior art, a high level of maximum cut-off frequency (e.g., about 32 GHz) can be obtained.

A manufacturing method for a bipolar transistor according to the second preferred embodiment will be described with reference to FIGS. 14A to 14I.

Figure 14A:
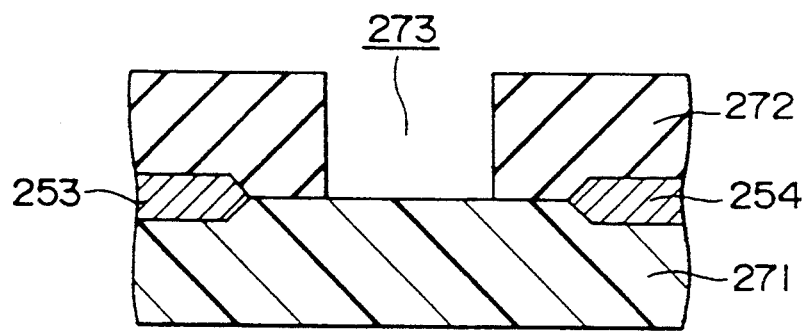
FIGS. 14A to 14I are schematic sectional views illustrating a manufacturing method for the vertical bipolar transistor shown in FIG. 13.

In the first step shown in FIG. 14A, element isolating regions 253 and 254 each having a thickness of 200 nm are formed in a surface layer of a silicon substrate 271 of a first conduction type (to be defined as an n-type) by a LOCOS process.

Then, a first insulating layer 272 of silicon nitride is formed on the whole upper surface of the n-type silicon substrate 271 so as to cover the element isolating regions 253 and 254 by a CVD process. Then, a resist is applied to the first insulating layer 272 to form a resist film (not shown) having a flat surface, and thereafter the resist film and an upper layer of the first insulating layer 272 are etched back to set the thickness of the first insulating layer 272 to 300–400 nm and flatten the surface of the first insulating layer 272.

Then, a groove 273 is formed through the first insulating layer 272 so as to reach the n-type silicon substrate 271 by a photolithography and etching process.

The etching process is performed under the condition that a selection ratio of silicon nitride to silicon is large.

Figure 14B:
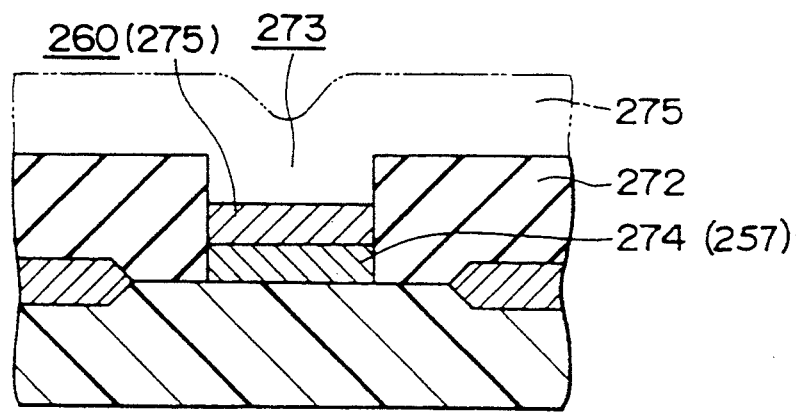

In the second step shown in FIG. 14B, an n-type silicon epitaxial layer 274 having a thickness of 300–350 nm where the thickness of the first insulating layer 272 is 400 nm is formed in the groove 273 by a selective epitaxial growth process.

Then, an n-type polysilicon film 275 is formed on the upper surface of the first insulating layer 272 so as to fill the groove 273 by a CVD process. Then, a resist is applied to the n-type polysilicon film 275 to form a resist film (not shown) having a flat surface, and thereafter the resist film and a portion of the polysilicon film 275 shown by a two-dot chain line are removed by an etchback process to form an n+ collector leading electrode 260 having a thickness of 50–100 nm in the groove 273 from the polysilicon film 275.

The n-type polysilicon film 275 may be obtained by forming a polysilicon film and thereafter introducing an n-type impurity such as arsenic ions (As+) into the polysilicon film by an ion implantation process.

Figure 14C:
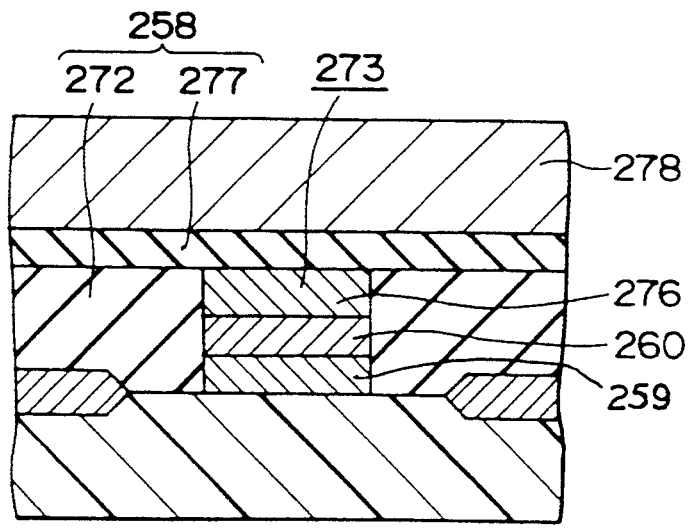

In the third step shown in FIG. 14C, a tungsten electrode 276 is formed on the n+ collector leading electrode 260 in the groove 273 by selective growth of tungsten (W), so as to reduce a resistance of the n+ collector leading electrode 260. In this case, the thickness of the first insulating layer 272 is set to be larger to enlarge the depth of the groove 273.

Then, a second insulating layer 277 of silicon oxide is formed on the whole upper surface of the first insulating layer 272 so as to cover the tungsten electrode 276 by a CVD process.

The first insulating layer 272 and the second insulating layer 277 constitute an insulating layer 258.

Then, the surface of the second insulating layer 277 is flat polished, and thereafter a monosilicon wafer 278 as a base wafer is bonded to the flat surface of the second insulating layer 277 by a usual wafer bonding method.

Figure 14D:
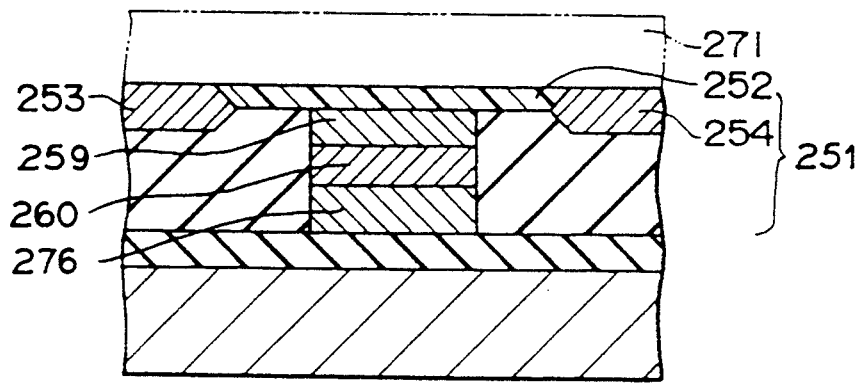

In the fourth step shown in FIG. 14D, a portion of the n-type silicon substrate 271 shown by a two-dot chain line is removed by a grinding and polishing (usual lapping) process so as to expose the element isolating regions 253 and 254. In the grinding and polishing process, the element isolating regions 253 and 254 serve as a polish stopper, and resultantly an n-type silicon layer 252 is formed between the element isolating regions 253 and 254. In this stage, the thickness of the n-type silicon layer 252 becomes about ½ of the thickness of the element isolating regions 253 and 254.

It is to be noted that the illustrations of FIGS. 14D to 14I are vertically inverted from the illustration of FIG. 14C.

Figure 14E:
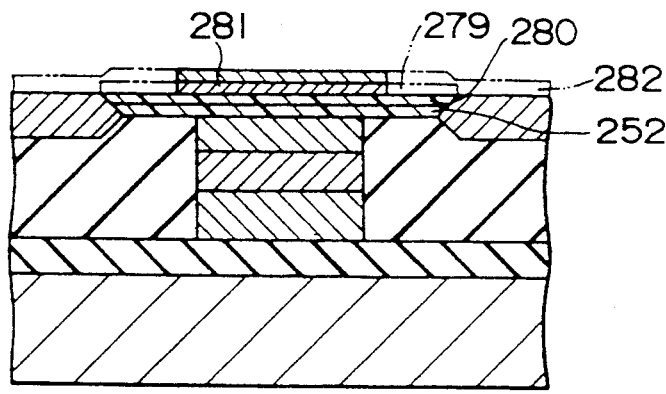

In the fifth step shown in FIG. 14E, an insulating film 279 of silicon oxide is formed in a surface layer of the n-type silicon layer 252 by a thermal oxidation process.

Then, a p-type impurity such as boron ions (B+) is introduced into the surface layer of the n-type silicon layer 252 by an ion implantation process to thereby form a p-type link base region 280.

Then, a portion of the insulating film 279 shown by a two-dot chain line is removed by a photolithography and etching process to form an isolating pattern 281.

Before the photolithography and etching process, a polysilicon film 282 may be formed on the insulating film 279, so as to prevent that any impurity will enter the insulating film 279 upon photolithography.

Figure 14F:
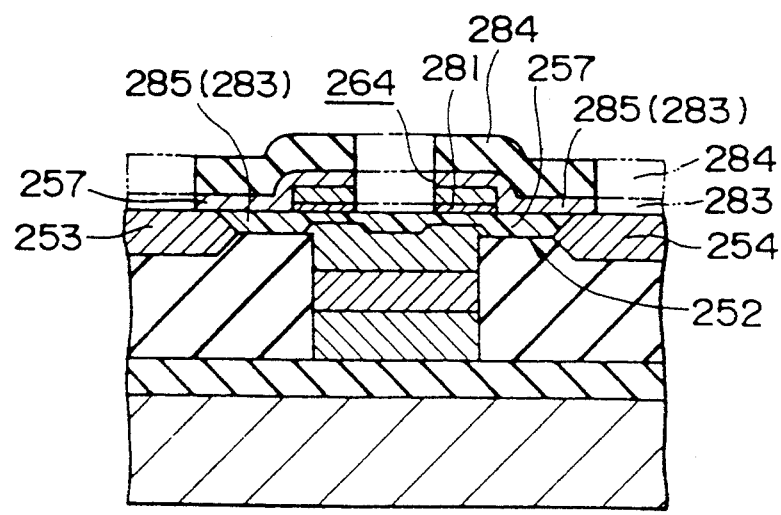

In the sixth step shown in FIG. 14F, a polysilicon film 283 is formed on the whole upper surface so as to cover the isolating pattern 281 by a CVD process.

Then, a p-type impurity such as boron ions (B+) is introduced into the polysilicon film 283 by an ion implantation process. Then, a diffusion process is performed to form a p+ graft base region 257 in the upper layer of the n-type silicon layer 252 at the opposite side portions thereof adjacent to the element isolating regions 253 and 254. Alternatively, the p+ graft base region 257 may be formed at one side portion of the n-type silicon layer 252 adjacent to either the element isolating region 253 or 254.

Then, an insulating film 284 of silicon oxide is formed on the upper surface of the polysilicon film 283 by a CVD process.

Then, portions of the insulating film 284, the polysilicon film 283 and the isolating pattern 281 shown by two-dot chain lines are removed by a photolithography and etching process to form an emitter contact portion 264 and simultaneously form a p+ base leading electrode 285 connected with the n-type silicon layer 252 from the polysilicon film 283.

Figure 14G:
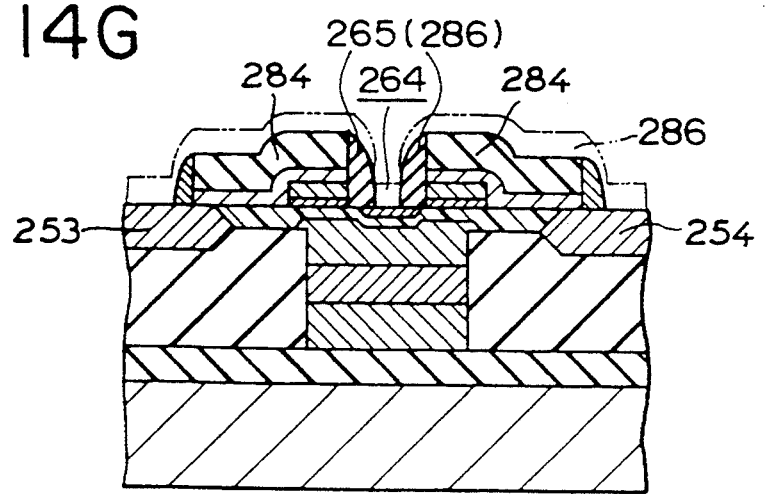

In the seventh step shown in FIG. 14G, an insulating film 286 of silicon oxide is formed on the whole upper surface so as to cover the surface of the insulating film 284 and an inner wall of the emitter contact portion 264 by a CVD process.

Then, a portion of the insulating film 286 shown by a two-dot chain line is removed by an etch-back process to form an emitter side wall insulating film 265 on the side wall of the emitter contact portion 264.

Figure 14H:
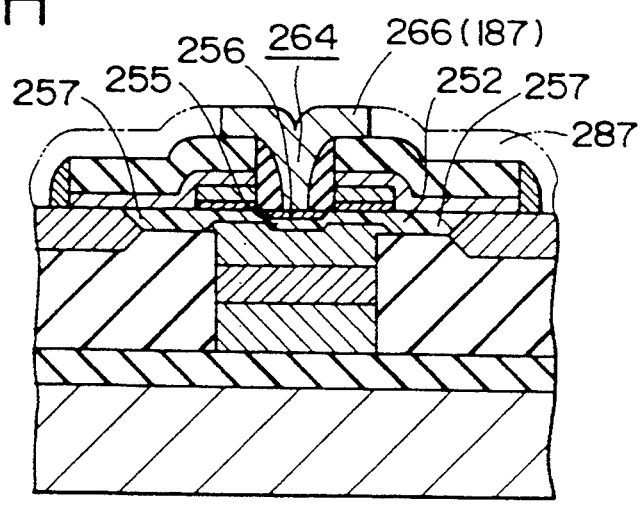

In the eighth step shown in FIG. 14H, a leading electrode forming film 287 of polysilicon is formed on the whole upper surface so as to fill the emitter contact portion 264 by a CVD process.

Then, a p-type impurity such as boron ions (B+) is introduced into the leading electrode forming film 287 by an ion implantation process. Then, an annealing process is performed to diffuse the p-type impurity from the leading electrode forming film 287 in the emitter contact portion 264 into the upper layer of the n-type silicon layer 252 and thereby form a p-type base region 255 connected with the p+ graft base region 257.

Then, an n-type impurity such as arsenic ions (As+) is introduced into the leading electrode forming film 287 by an ion implantation process. Then, an annealing process is performed to diffuse the n-type impurity from the leading electrode forming film 287 in the emitter contact portion 264 into an upper layer of the p-type base region 255 and thereby form an n+ emitter region 256.

Then, a portion of the leading electrode forming film 287 shown by a two-dot chain line is removed by a photolithography and etching process to form an n+ emitter leading electrode 266 connected with the n+ emitter region 256.

Alternatively, the p-type impurity and the n-type impurity in the leading electrode forming film 287 may be simultaneously diffused into the n-type silicon layer 252 by the same diffusion process to thereby form the p-type base region 255 and the n+ emitter region 256.

Figure 14I:
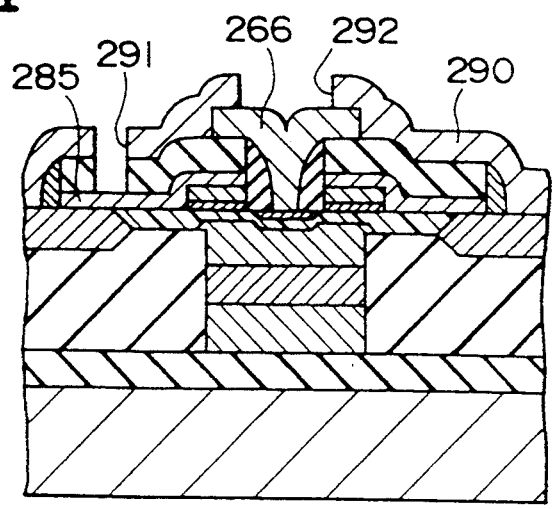

In the ninth step shown in FIG. 14I, an interlayer insulating film 290 of silicon oxide is formed on the whole upper surface so as to cover the n+ emitter leading electrode 266 by a CVD process. Then, contact holes 291 and 292 are formed on the p+ base leading electrode 285 and the n+ emitter leading electrode 266, respectively, by a photolithography and etching process. Thereafter, a base electrode (not shown) and an emitter electrode (not shown) are formed in the contact holes 291 and 292, respectively, by a usual method of forming a metal electrode.

In the above manufacturing method, the n-type collector region 259 and the n+ collector leading electrode 260 of the bipolar transistor are formed in the first insulating layer 272 of the thin film SOI substrate 251, and thereafter the n-type silicon layer 252 of the thin film SOI substrate 251 is formed. Therefore, the thickness of the n-type silicon layer 252 can be made small.

Although the first conduction type and the second conduction type are defined as an n-type and a p-type, respectively, in the above description, the first conduction type and the second conduction type may be defined as a p-type and an n-type, respectively, according to the present invention.

Figure 15:
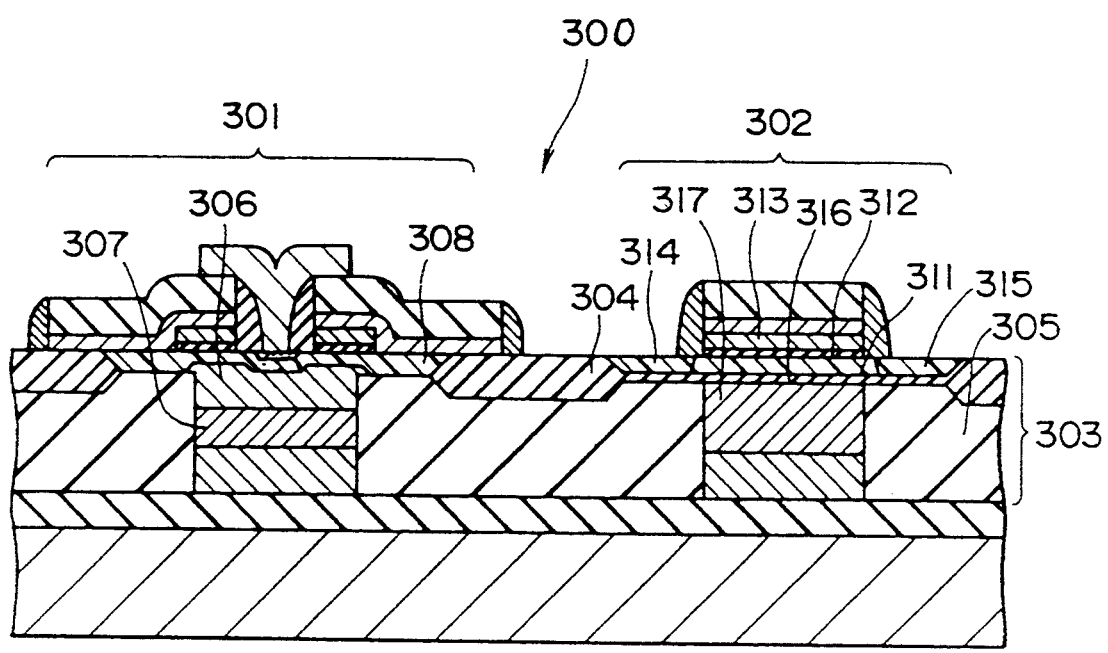
FIG. 15 is a schematic sectional view of a Bi-MOS transistor according to a third preferred embodiment of the present invention.

A third preferred embodiment of the present invention will be described with reference to FIG. 15 illustrating a semiconductor device including a bipolar transistor and a MOS transistor both mounted on a thin film SOI substrate.

Referring to FIG. 15, reference numeral 300 generally designates an semiconductor device. The semiconductor device 300 is comprised of a bipolar transistor 301 similar to the bipolar transistor described in the second preferred embodiment and a MOS transistor 302 to be hereinafter described, both being mounted on a common thin film SOI substrate 303.

The bipolar transistor 301 has substantially the same structure as that of the bipolar transistor described in the second preferred embodiment, and so the explanation thereof will be omitted herein.

The structure of the MOS transistor 302 will now be described.

An n-type first silicon layer 308 in which the bipolar transistor 301 is formed and an n-type second silicon layer 311 in which the MOS transistor 302 is formed are formed in an upper layer of the thin film SOI substrate 303 with an element isolating region 304 interposed therebetween.

A gate insulating film 312 of silicon oxide is formed on an upper surface of the second silicon layer 311.

A gate electrode 313 of polysilicon is formed on an upper surface of the gate insulating film 312.

A pair of p+ source and drain regions 314 and 315 are formed in the second silicon layer 311 on the opposite sides of the gate electrode 313.

A back gate insulating film 316 of silicon oxide is formed on a lower surface of the second silicon layer 311.

A back gate electrode 317 of polysilicon is formed in an insulating layer 305 of the thin film SOI substrate 303 so as to be connected with a lower surface of the back gate insulating film 316.

Thus, the MOS transistor 302 has the above construction.

As described above, the bipolar transistor 301 and the MOS transistor 302 are formed on the thin film SOI substrate 303 to constitute the semiconductor device 303.

Although the first conduction type and the second conduction type are defined as an n-type and a p-type, respectively, in the above description, the first conduction type and the second conduction type may be defined as a p-type and an n-type, respectively, according to the present invention.

In the bipolar transistor 301, an n-type collector region 306 and an n+ collector leading electrode 307 are formed in the insulating layer 305, thereby reducing the thickness of the first silicon layer 308 of the thin film SOI substrate 303. Accordingly, the thickness of the second silicon layer 311 can also be reduced to make it possible to form the MOS transistor 302 having a high-performance back gate structure in the second silicon layer 311.

Further, as similar to the second preferred embodiment, a forming area of the bipolar transistor 301 can be reduced, and the bipolar transistor 301 can be formed to have a high performance and a high level of maximum cut-off frequency.

Although the MOS transistor in the semiconductor device in this preferred embodiment is a PMOS transistor, an NMOS transistor may be similarly formed instead of the PMOS transistor. Further, an NMOS transistor may be similarly formed in addition to the PMOS transistor to thereby form a CMOS transistor. In this case, the semiconductor device becomes a Bi-CMOS device.

A manufacturing method for a semiconductor device according to the third preferred embodiment will be described with reference to FIGS. 16A to 16I.

Figure 16A:
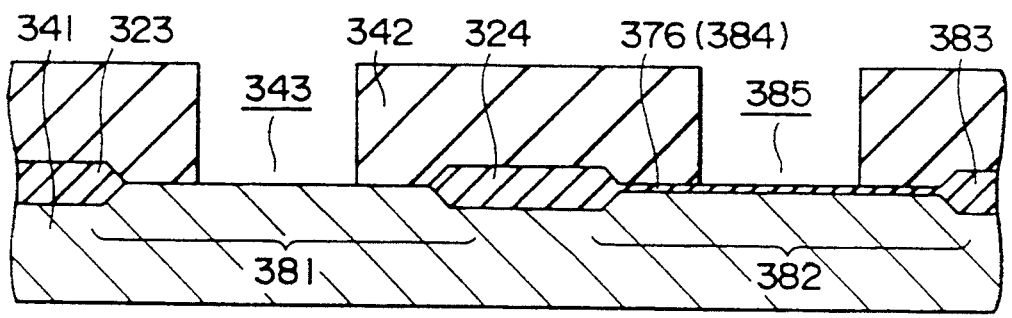
FIGS. 16A to 16I are schematic sectional views illustrating a manufacturing method for the Bi-MOS transistor shown in FIG. 15.

In the first step shown in FIG. 16A, element isolating regions 323, 324 and 383 each having a thickness of 200 nm for isolating a bipolar transistor forming region 381 and a MOS transistor forming region 382 from each other are formed in a surface layer of a silicon substrate 341 of a first conduction type (to be defined as an n-type) by a LOCOS process.

Then, an insulating film 384 is formed in a surface layer of the n-type silicon substrate 341 by a thermal oxidation process. Then, a portion of the insulating film 384 on the bipolar transistor forming region 381 is removed by a photolithography and etching process, thereby forming a back gate insulating film 376 as a remaining portion of the insulating film 384 on the MOS transistor forming region 382.

Then, a first insulating layer 342 of silicon nitride is formed on the whole upper surface of the n-type silicon substrate 341 so as to cover the element isolating regions 323, 324 and 383 and the back gate insulating film 376 by a CVD process. Then, a resist is applied to the first insulating layer 342 to form a resist film (not shown) having a flat surface, and thereafter the resist film and an upper layer of the first insulating layer 342 are etched back to set the thickness of the first insulating film 342 to 300–400 nm and flatten the surface of the first insulating layer 342.

Then, grooves 343 and 385 are formed through the first insulating layer 342 so as to reach the n-type silicon substrate 341 by a photolithography and etching process.

The etching process is performed under the condition that a selection ratio of silicon nitride to silicon is large.

Figure 16B:
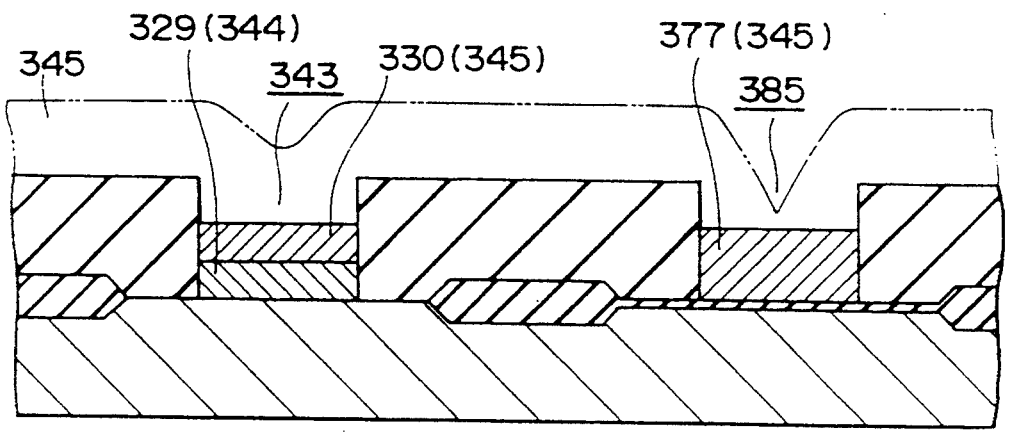

In the second step shown in FIG. 16B, an n-type silicon epitaxial layer 344 having a thickness of 300–350 nm where the thickness of the first insulating layer 342 is 400 nm is formed in the groove 343 by a selective epitaxial growth process. This n-type silicon epitaxial layer 344 is an n+ collector region 329.

Then, an n-type polysilicon film 345 is formed on the upper surface of the first insulating layer 342 so as to fill the grooves 343 and 385 by a CVD process. Then, a resist is applied to the n-type polysilicon film 345 to form a resist film (not shown) having a flat surface, and thereafter the resist film and a portion of the polysilicon film 345 shown by a two-dot chain line are removed by an etch-back process to form an n+ collector leading electrode 330 having a thickness of 50–100 nm in the groove 343 from the polysilicon film 345 and simultaneously form a back gate electrode 377 having a thickness of 300–400 nm in the groove 385 from the polysilicon film 345.

The n-type polysilicon film 345 may be obtained by forming a polysilicon film and thereafter introducing an n-type impurity such as arsenic ions (As+) into the polysilicon film by an ion implantation process.

Figure 16C:
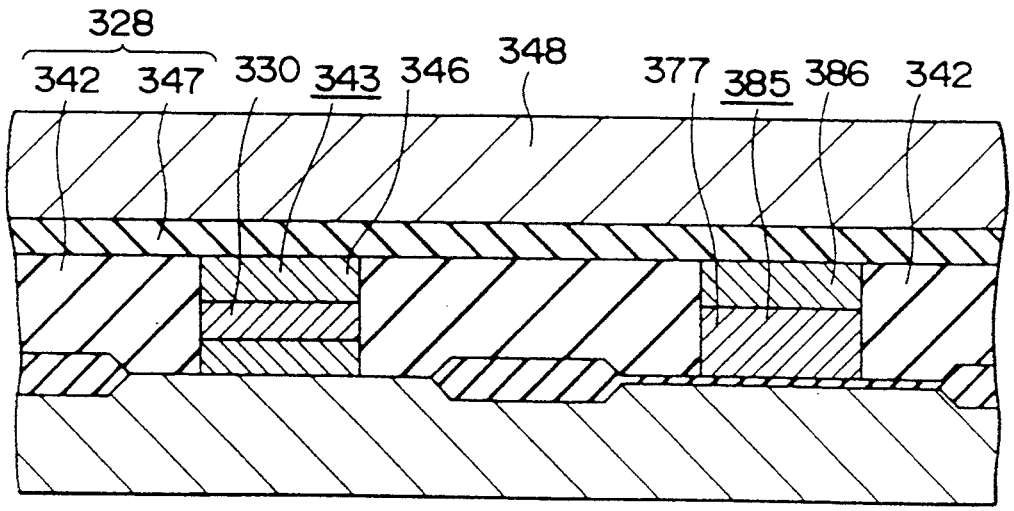

In the third step shown in FIG. 16C, tungsten electrodes 346 and 386 are formed on the n+ collector leading electrode 330 in the groove 343 and on the back gate electrode 377 in the groove 385, respectively, by selective growth of tungsten (W), so as to reduce resistances of the n+ collector leading electrode 330 and the back gate electrode 377. In this case, the thickness of the first insulating layer 342 is set to be larger to enlarge the depth of the grooves 343 and 3S5.

Then, a second insulating layer 347 of silicon oxide is formed on the whole upper surface of the first insulating layer 342 so as to cover the tungsten electrodes 346 and 386 by a CVD process.

The first insulating layer 342 and the second insulating layer 347 constitute an insulating layer 328.

Then, the surface of the second insulating layer 347 is flat polished, and thereafter a monosilicon wafer 348 as a base wafer is bonded to the flat surface of the second insulating layer 347 by a usual wafer bonding method.

Figure 16D:
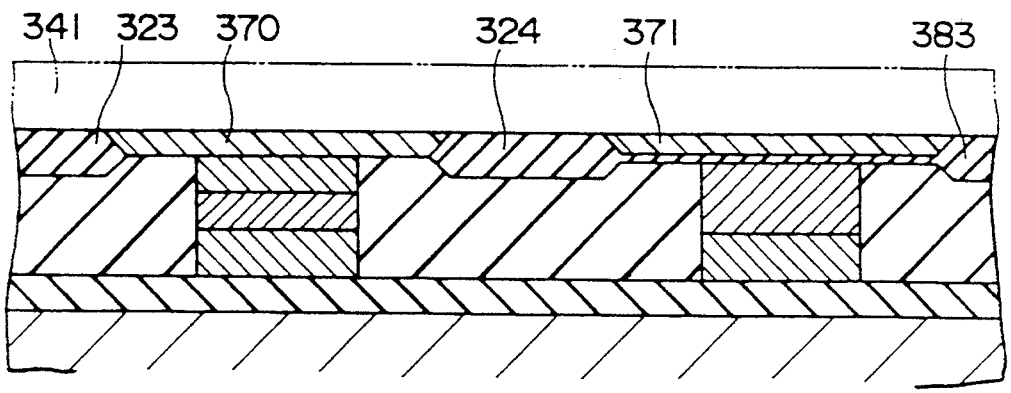

In the fourth step shown in FIG. 16D, a portion of the n-type silicon substrate 341 shown by a two-dot chain line is removed by a grinding and polishing (usual lapping) process so as to expose the element isolating regions 232, 324 and 383. In the grinding and polishing process, the element isolating regions 323, 324 and 383 serve as a polish stopper, and resultantly a first silicon layer 370 is formed between the element isolating regions 323 and 324. Simultaneously, a second silicon layer 371 is formed between the element isolating regions 324 and 383. In this stage, the thickness of the first and second silicon layers 370 and 371 become about ½ of the thickness of the element isolating regions 323, 324 and 383.

It is to be noted that the illustrations of FIGS. 16D to 16I are vertically inverted from the illustration of FIG. 16C.

Figure 16E:
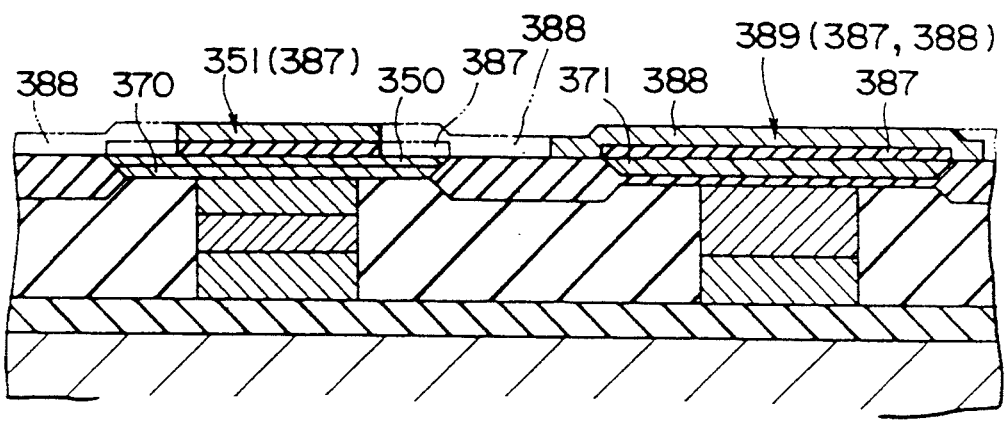

In the fifth step shown in FIG. 16E, an insulating film 387 is formed in each surface layer of the first and second silicon layers 370 and 371 by a thermal oxidation process. Then, a gate electrode forming film 388 of polysilicon is formed on the whole upper surface so as to cover the insulating film 387 by a CVD process.

Then, a p-type impurity such as boron ions (B+) is introduced into the surface layer of the first silicon layer 370 only by an ion implantation process to thereby form a p-type link base region 350.

Then, a portion of the insulating film 387 shown by a two-dot chain line and a portion of the gate electrode forming film 388 shown by a two-dot chain line are removed by a photolithography and etching process to form an isolating pattern 351 on a portion of the upper surface of the first silicon layer 370 from the insulating film 387 and simultaneously form a gate forming pattern 389 so as to cover the second silicon layer 371 from the insulating film 387 and the gate electrode forming film 388.

Figure 16F:
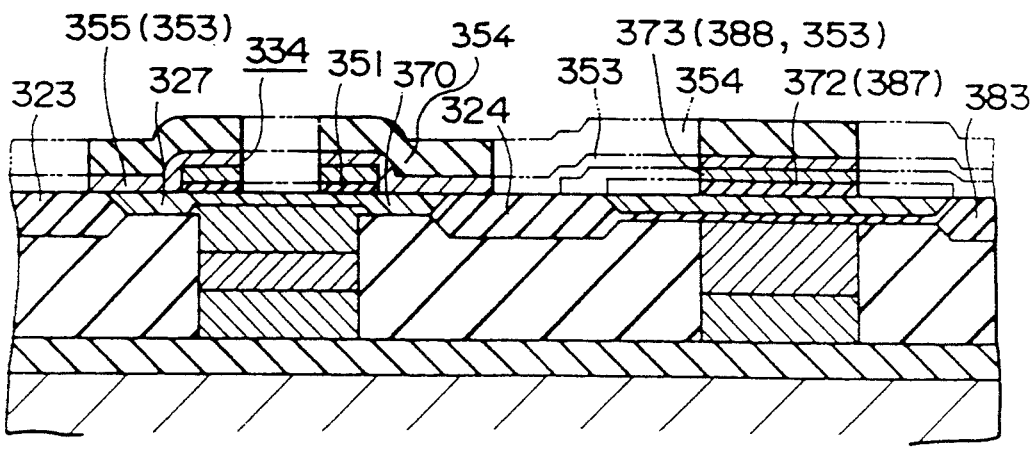

In the sixth step shown in FIG. 16F, a polysilicon film 353 is formed on the whole upper surface so as to cover the isolating pattern 351 and the gate forming pattern 389 by a CVD process.

Then, a p-type impurity such as boron ions (B+) is introduced into the polysilicon film 353 by an ion implantation process. Then, a diffusion process is performed to form a p+ graft base region 327 in the upper layer of the first silicon layer 370 at the opposite side portions thereof adjacent to the element isolating regions 323 and 324. Alternatively, the p+ graft base region 327 may be formed at one side portion of the first silicon layer 370 adjacent to either the element isolating region 323 or 324.

Then, an insulating film 354 of silicon oxide is formed on the upper surface of the polysilicon film 353 by a CVD process.

Then, portions of the insulating film 354, the polysilicon film 353, the gate forming pattern 389 and the isolating pattern 351 shown by two-dot chain lines are removed by a photolithography and etching process to form an emitter contact portion 334. Simultaneously, a p+ base leading electrode 355 connected with the first silicon layer 370 is formed from the polysilicon film 353. Simultaneously, a gate electrode 373 is formed from the polysilicon film 353 and the gate electrode forming film 388, and a gate insulating film 372 is formed from the insulating film 387.

Figure 16G:
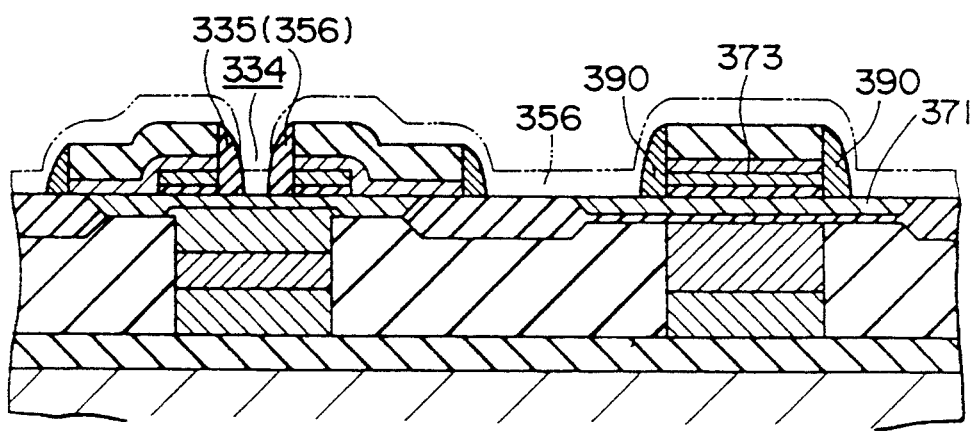

In the seventh step shown in FIG. 16G, an insulating film 356 of silicon oxide is formed on the whole upper surface so as to cover the surface of the insulating film 354 and an inner wall of the emitter contact portion 334 by a CVD process.

Then, a portion of the insulating film 356 shown by a two-dot chain line is removed by an etch-back process to form an emitter side wall insulating film 335 on a side wall of the emitter contact portion 334 and simultaneously form a gate side wall insulating film 390 on a side wall of the gate electrode 373.

In the case of forming an LDD structure in the MOS transistor, ion implantation for forming an LDD is performed in the second silicon layer 371 on the opposite sides of the gate electrode 373 before forming the insulating film 356.

Figure 16H:
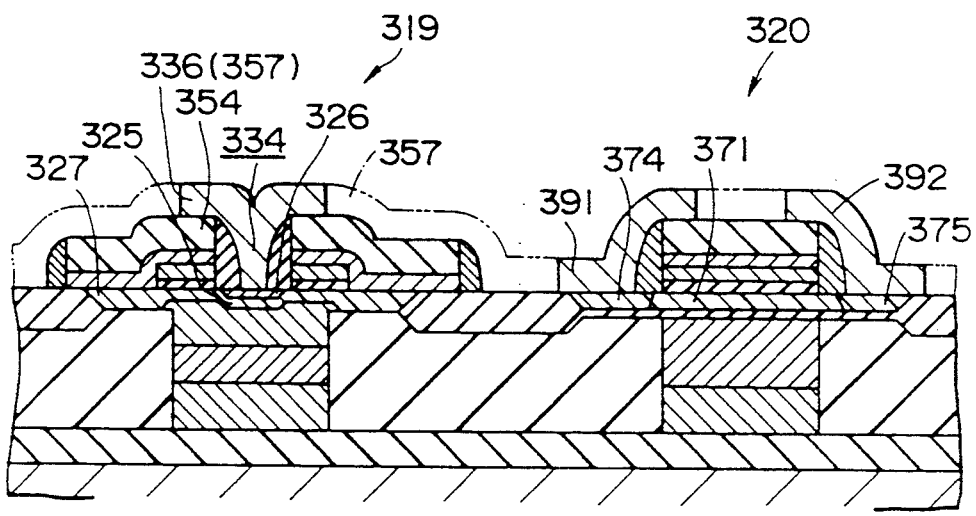

In the eighth step shown in FIG. 16H, a leading electrode forming film 357 of polysilicon is formed on the whole upper surface so as to fill the emitter contact portion 334 and cover the insulating film 354 by a CVD process.

Then, a p-type impurity such as boron ions (B+) is introduced into the leading electrode forming film 357 by an ion implantation process. Then, an annealing process is performed to diffuse the p-type impurity from the leading electrode forming film 357 in the emitter contact portion 334 into the upper layer of the first silicon layer 370 and thereby form a p-type base region 325 connected with the p+ graft base region 327. Simultaneously, the p-type impurity is diffused from the leading electrode forming film 357 on the opposite sides of the gate electrode 373 into the second silicon layer 371 to thereby form p+ source and drain regions 374 and 375.

Then, an n-type impurity such as arsenic ions (As+) is introduced into the leading electrode forming film 357 on the p-type base region 325 by an ion implantation process. Then, an annealing process is performed to diffuse the n-type impurity from the leading electrode forming film 357 in the emitter contact portion 334 into an upper layer of the p-type base region 325 and thereby form an n+ emitter region 326.

Further, a p-type impurity such as boron ions (B+) is introduced into the leading electrode forming region 357 on the p+ source and drain regions 374 and 375 by an ion implantation process.

Then, a portion of the leading electrode forming film 357 shown by a two-dot chain line is removed by a photolithography and etching process to form an n+ emitter leading electrode 336 connected with the n+ emitter region 326 and simultaneously form p+ source and drain electrodes 391 and 392 respectively connected with the p+ source and drain regions 374 and 375.

In this way, a bipolar transistor 319 and a MOS transistor 320 are formed as shown in FIG. 16H.

In forming the p-type base region 325 and the n+ emitter region 326, the p-type impurity and the n-type impurity in the leading electrode forming film 357 may be simultaneously diffused into the first silicon layer 370 by the same diffusion process to thereby form the p-type base region 325 and the n+ emitter region 326.

Figure 16I:
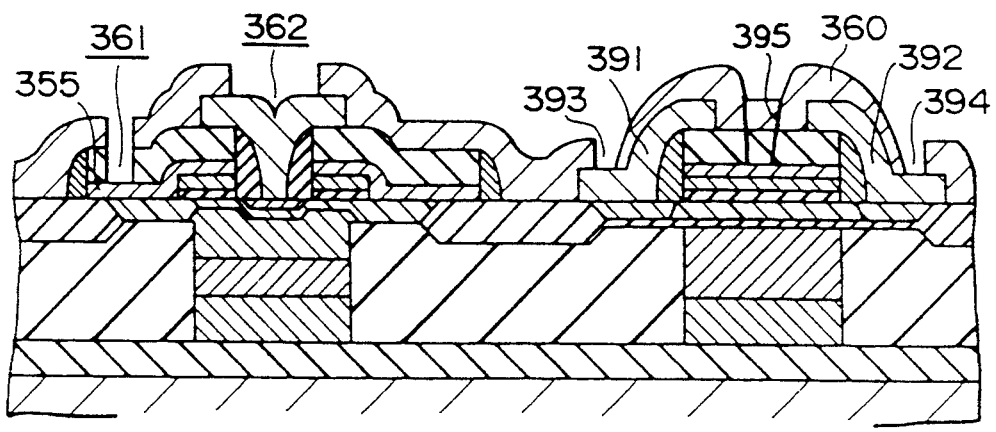

In the ninth step shown in FIG. 16I, an interlayer insulating film 360 of silicon oxide is formed on the whole upper surface so as to cover the emitter leading electrode 336 and the p+ source and drain leading electrodes 391 and 392 by a CVD process. Then, contact holes 361 and 362 are formed on the p+ base leading electrode 345 and the n+ emitter leading electrode 336, respectively, by a photolithography and etching process. Simultaneously, contact holes 393, 394 and 395 are similarly formed on the p+ source and drain leading electrodes 391 and 392 and the gate electrode 373, respectively. Thereafter, a base electrode (not shown) and an emitter electrode (not shown) are formed in the contact holes 361 and 362, respectively, by a usual method of forming a metal electrode. Simultaneously, source and drain electrodes (not shown) and a gate electrode (not shown) are similarly formed in the contact holes 393, 394 and 395, respectively.

In the above manufacturing method, the n-type collector region 329 and the n+ collector leading electrode 330 of the bipolar transistor 319 and the back gate electrode 377 of the MOS transistor 320 are formed in the first insulating layer 342 of the thin film SOI substrate 321, and thereafter the first and second silicon layers 370 and 371 of the thin film SOI substrate 321 are formed. Therefore, the thickness of the first and second silicon layers 370 and 371 can be made small.

Although the first conduction type and the second conduction type are defined as an n-type and a p-type, respectively, in the above description, the first conduction type and the second conduction type may be defined as a p-type and an n-type, respectively, according to the present invention.

Although the MOS transistor in the semiconductor device in this preferred embodiment is a PMOS transistor, an NMOS transistor may be similarly formed instead of the PMOS transistor. Further, an NMOS transistor may be similarly formed in addition to the PMOS transistor to thereby form a CMOS transistor. In this case, the semiconductor device becomes a Bi-CMOS device.

A fourth preferred embodiment of the present invention will be described with reference to FIG. 17.

Figure 17:
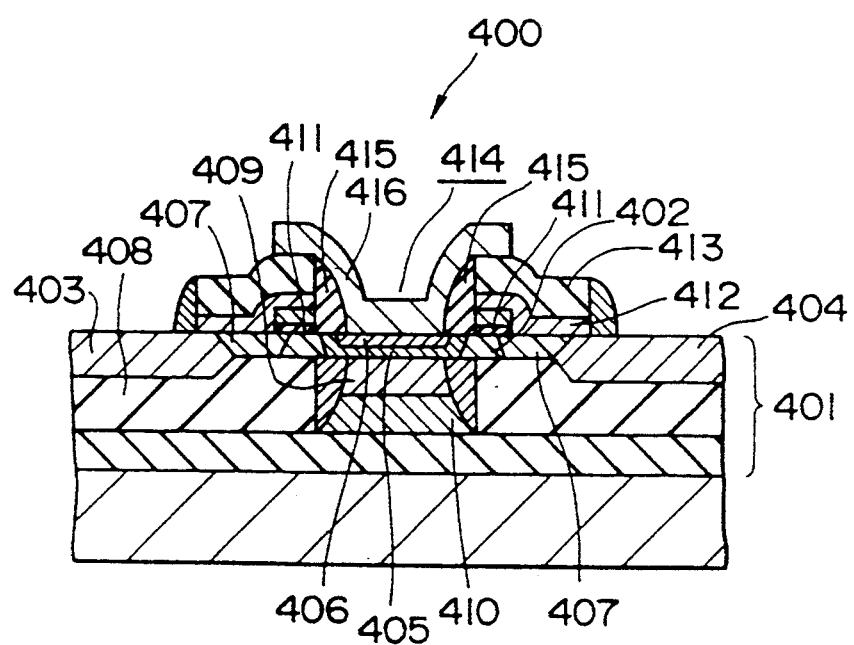
FIG. 17 is a schematic sectional view of a bipolar transistor according to a fourth preferred embodiment of the present invention.

Referring to FIG. 17, reference numeral 400 generally designates a bipolar transistor according to the fourth preferred embodiment. The bipolar transistor 400 employs a thin film SOI substrate 401 as an SOI substrate. The thin film SOI substrate 401 is constituted of an insulating layer 408 and a silicon layer 402 of a first conduction type (to be defined as an n-type in this preferred embodiment). Element isolating regions 403 and 404 are formed in the n-type silicon layer 402. A base region 405 of a second conduction type (to be defined as a p-type in this preferred embodiment) is formed in a portion of the n-type silicon layer 402 between the element isolating regions 403 and 404.

An n+ emitter region 406 is formed in an upper layer of the p-type base region 405.

An n+ collector region 407 is formed in the n-type silicon layer 402 on both sides of the p-type base region 405 so that a portion of the n-type silicon layer 402 is left between the n+ collector region 407 and the p-type base region 405. Such an n+ collector region may be formed on one side of the p-type base region 405.

A p+ base leading electrode 409 is formed in the insulating layer 408 under the p-type base region 405 so as to be connected with the p-type base region 405.

A resistance reducing layer 410 is formed in the insulating layer 408 under the p+ base leading electrode 409 so as to be connected with the p+ base leading electrode 409.

An isolating pattern 411 is formed on an upper surface of the n-type silicon layer 402 at a portion thereof. An n+ collector leading electrode 412 is formed on the element isolating regions 403 and 404 so as to overlap the isolating pattern 411 and be connected with the n+ collector region 407. An insulating film 413 is formed on the n+ collector leading electrode 412. An emitter contact portion 414 is formed through the insulating film 413 on the n+ emitter region 406. An emitter side wall insulating film 415 is formed on a side wall of the emitter contact portion 414. An n+ emitter leading electrode 416 is formed in the emitter contact portion 414 so as to be connected with the n+ emitter region 406.

Thus, the bipolar transistor 400 has the above construction.

Although the first conduction type and the second conduction type are defined as an n-type and a p-type, respectively, in the above description, the first conduction type and the second conduction type may be defined as a p-type and an n-type, respectively, according to the present invention.

In the above bipolar transistor 400, the p+ base leading electrode 409 is formed in the insulating layer 408 of the thin film SOI substrate 401, and the n-type silicon layer 402 of the thin film SOI substrate 401 is formed so as to be connected with the p+ base leading electrode 409. Therefore, the bipolar transistor 400 is constructed of an intrinsic region (the p-type base region 405, the n+ emitter region 406 and the n+ collector region 407) and a minimum contact region (the p+ base leading electrode 409). Accordingly, a forming area of the bipolar transistor 400 can be reduced.

Further, since the bipolar transistor 400 is substantially surrounded by an insulator (the insulating layer 408), high performance can be ensured.

A manufacturing method for a bipolar transistor according to the fourth preferred embodiment will be described with reference to FIGS. 18A to 18I.

Figure 18A:
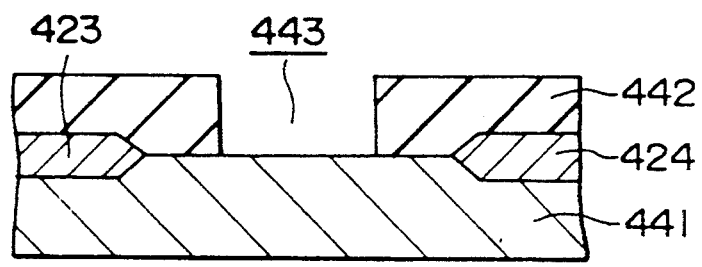
FIGS. 18A to 18I are schematic sectional views illustrating a manufacturing method for the bipolar transistor shown in FIG. 17.

In the first step shown in FIG. 18A, element isolating regions 423 and 424 each having a thickness of 200 nm are formed in a surface layer of a silicon substrate 441 of a first conduction type (to be defined as an n-type) by a LOCOS process.

Then, a first insulating layer 442 of silicon nitride is formed on the whole upper surface of the n-type silicon substrate 441 so as to cover the element isolating regions 423 and 424 by a CVD process. Then, a resist is applied to the first insulating layer 442 to form a resist film (not shown) having a flat surface, and thereafter the resist film and an upper layer of the first insulating layer 442 are etched back to set the thickness of the first insulating layer 442 to 300–400 nm and flatten the surface of the first insulating layer 442.

Then, a groove 443 is formed through the first insulating layer 442 so as to reach the n-type silicon substrate 441 by a photolithography and etching process.

The etching process is performed under the condition that a selection ratio of silicon nitride to silicon is large.

Figure 18B:
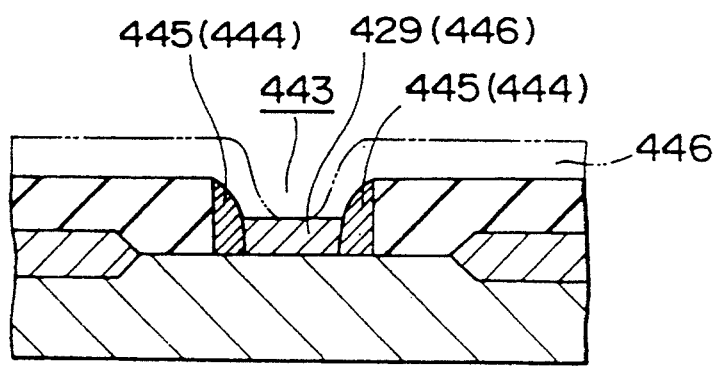

In the second step shown in FIG. 18B, a silicon oxide film 444 is formed in the groove 443 by a CVD process. Then, the silicon oxide film 444 is etched back to form a side wall film 445 on a side wall of the groove 443.

The side wall film 445 is provided to allow for alignment between a p-type base region 425 and a p+ base leading electrode 429 to be hereinafter described.

Then, a p-type polysilicon film 446 is formed on the upper surface of the first insulating layer 442 so as to fill the groove 443 by a CVD process. Then, a resist is applied to the p-type polysilicon film 446 to form a resist film (not shown) having a flat surface, and thereafter the resist film and a portion of the polysilicon film 446 shown by a two-dot chain line are removed by an etch-back process to form an p+ base leading electrode 429 having a thickness of 50–100 nm in the groove 443 from the polysilicon film 446.

The p-type polysilicon film 446 may be obtained by forming a polysilicon film and thereafter introducing a p-type impurity such as boron ions (B+) into the polysilicon film by an ion implantation process.

Figure 18C:
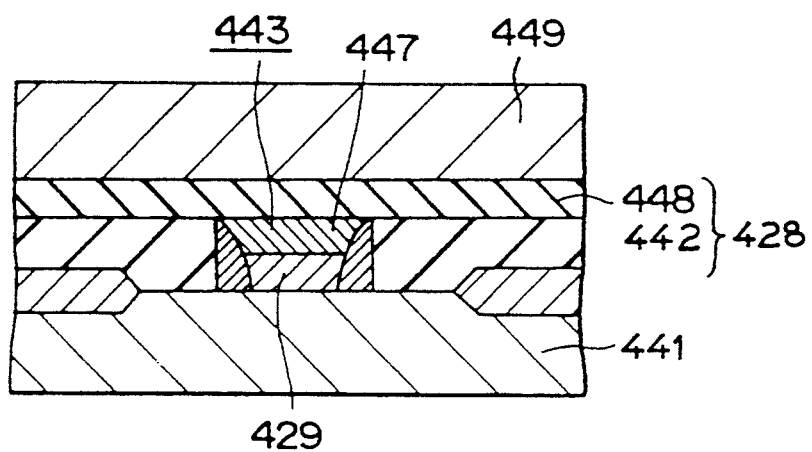

In the third step shown in FIG. 18C, a tungsten electrode 447 is formed on the p+ base leading electrode 429 in the groove 443 by selective growth of tungsten (W), so as to reduce a resistance of the p+ base leading electrode 429.

Then, a second insulating layer 448 of silicon oxide is formed on the whole upper surface of the first insulating layer 442 so as to cover the tungsten electrode 447 by a CVD process.

The first insulating layer 442 and the second insulating layer 448 constitute an insulating layer 428.

Then, the surface of the second insulating layer 448 is flat polished, and thereafter a monosilicon wafer 449 as a base wafer is bonded to the flat surface of the second insulating layer 448 by a usual wafer bonding method.

Figure 18D:
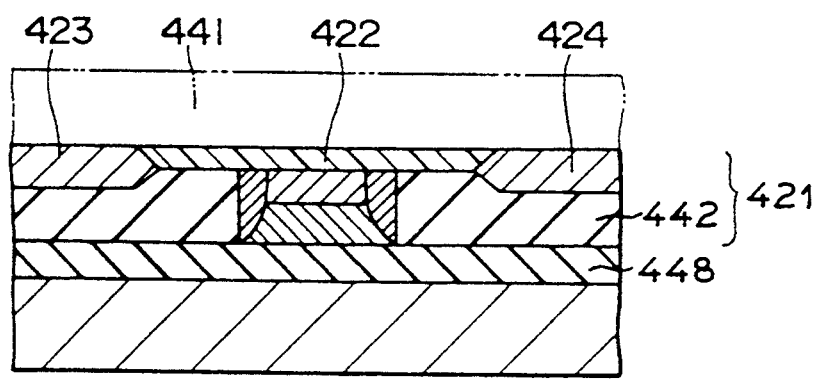

In the fourth step shown in FIG. 18D, a portion of the n-type silicon substrate 441 shown by a two-dot chain line is removed by a grinding and polishing (usual lapping) process so as to expose the element isolating regions 423 and 424. In the grinding and polishing process, the element isolating regions 423 and 424 serve as a polish stopper, and resultantly an n-type silicon layer 422 is formed between the element isolating regions 423 and 424. In this stage, the thickness of the n-type silicon layer 422 becomes about ½ of the thickness of the element isolating regions 423 and 424.

It is to be noted that the illustrations of FIGS. 18D to 18I are vertically inverted from the illustration of FIG. 18C.

Figure 18E:
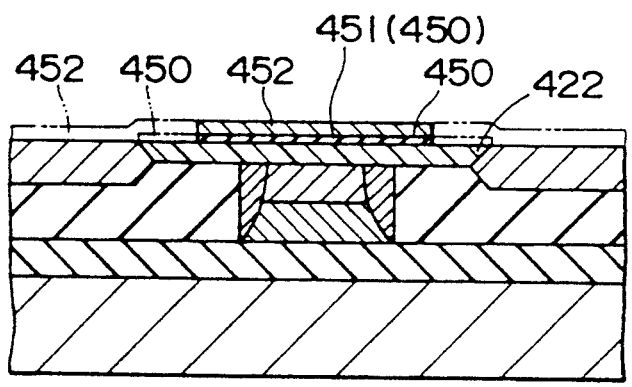

In the fifth step shown in FIG. 18E, an insulating film 450 of silicon oxide is formed in a surface layer of the n-type silicon layer 422 by a thermal oxidation process.

Then, a portion of the insulating film 450 shown by a two-dot chain line is removed by a photolithography and etching process to form an isolating pattern 451.

Before the photolithography and etching process, a polysilicon film 452 may be formed on the insulating film 450, so as to prevent that any impurity will enter the insulating film 450 upon photolithography.

Figure 18F:
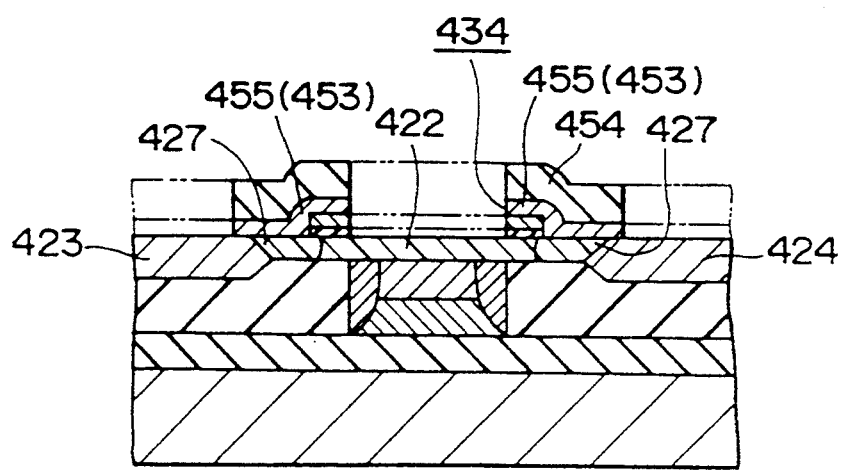

In the sixth step shown in FIG. 18F, a polysilicon film 453 is formed on the whole upper surface so as to cover the isolating pattern 451 by a CVD process.

Then, an n-type impurity such as arsenic ions (As+) is introduced into the polysilicon film 453 by an ion implantation process. Then, a diffusion process is performed to form an n+ collector region 427 in the upper layer of the n-type silicon layer 422 at the opposite side portions thereof adjacent to the element isolating regions 423 and 424. Alternatively, the n+ collector region 427 may be formed at one side portion of the n-type silicon layer 422 adjacent to either the element isolating region 423 or 424.

Then, an insulating film 454 of silicon oxide is formed on the upper surface of the polysilicon film 453 by a CVD process.

Then, portions of the insulating film 454, the polysilicon film 453 and the isolating pattern 451 shown by two-dot chain lines are removed by a photolithography and etching process to form an emitter contact portion 434 and simultaneously form an n+ collector leading electrode 455 connected with the n-type silicon layer 422 from the polysilicon film 453.

Figure 18G:
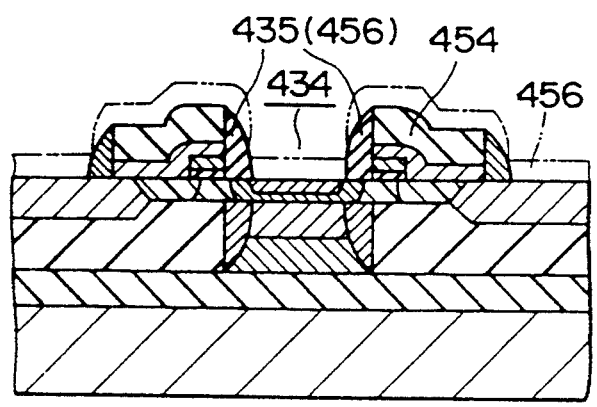

In the seventh step shown in FIG. 18G, an insulating film 456 of silicon oxide is formed on the whole upper surface so as to cover the surface of the insulating film 454 and an inner wall of the emitter contact portion 434 by a CVD process.

Then, a portion of the insulating film 456 shown by a two-dot chain line is removed by an etch-back process to form an emitter side wall insulating film 435 on the side wall of the emitter contact portion 434.

Figure 18H:
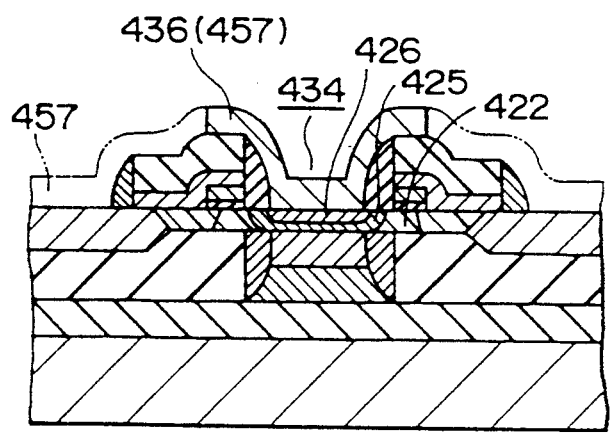

In the eighth step shown in FIG. 18H, a leading electrode forming film 457 of polysilicon is formed on the whole upper surface so as to fill the emitter contact portion 434 by a CVD process.

Then, a p-type impurity such as boron ions (B+) is introduced into the leading electrode forming film 457 by an ion implantation process. Then, an annealing process is performed to diffuse the p-type impurity from the leading electrode forming film 457 in the emitter contact portion 434 into the upper layer of the n-type silicon layer 422 and thereby form a p-type base region 425.

Then, an n-type impurity such as arsenic ions (As+) is introduced into the leading electrode forming film 457 by an ion implantation process. Then, an annealing process is performed to diffuse the n-type impurity from the leading electrode forming film 457 in the emitter contact portion 434 into an upper layer of the p-type base region 425 and thereby form an n+ emitter region 426.

Then, a portion of the leading electrode forming film 457 shown by a two-dot chain line is removed by a photolithography and etching process to form an n+ emitter leading electrode 436 connected with the n+ emitter region 426.

Alternatively, the p-type impurity and the n-type impurity in the leading electrode forming film 457 may be simultaneously diffused into the n-type silicon layer 422 by the same diffusion process to thereby form the p-type base region 425 and the n+ emitter region 426.

Figure 18I:
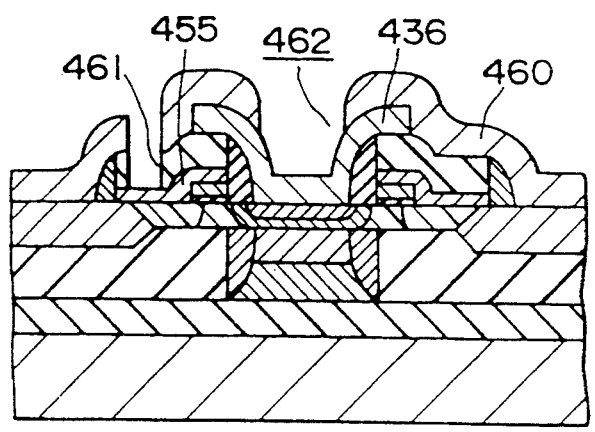

In the ninth step shown in FIG. 18I, an interlayer insulating film 460 of silicon oxide is formed on the whole upper surface so as to cover the n+ emitter leading electrode 436 by a CVD process. Then, contact holes 461 and 462 are formed on the n+ collector leading electrode 455 and the n+ emitter leading electrode 436, respectively, by a photolithography and etching process. Thereafter, a base electrode (not shown) and an emitter electrode (not shown) are formed in the contact holes 461 and 462, respectively, by a usual method of forming a metal electrode.

In the above manufacturing method, the p+ base leasing electrode 429 of the bipolar transistor is formed in the first insulating layer 442 of the thin film SOI substrate 421, and thereafter the n-type silicon layer 422 of the thin film SOI substrate 421 is formed. Therefore, the thickness of the n-type silicon layer 422 can be made small.

Although the first conduction type and the second conduction type are defined as an n-type and a p-type, respectively, in the above description, the first conduction type and the second conduction type may be defined as a p-type and an n-type, respectively, according to the present invention.

Figure 19:
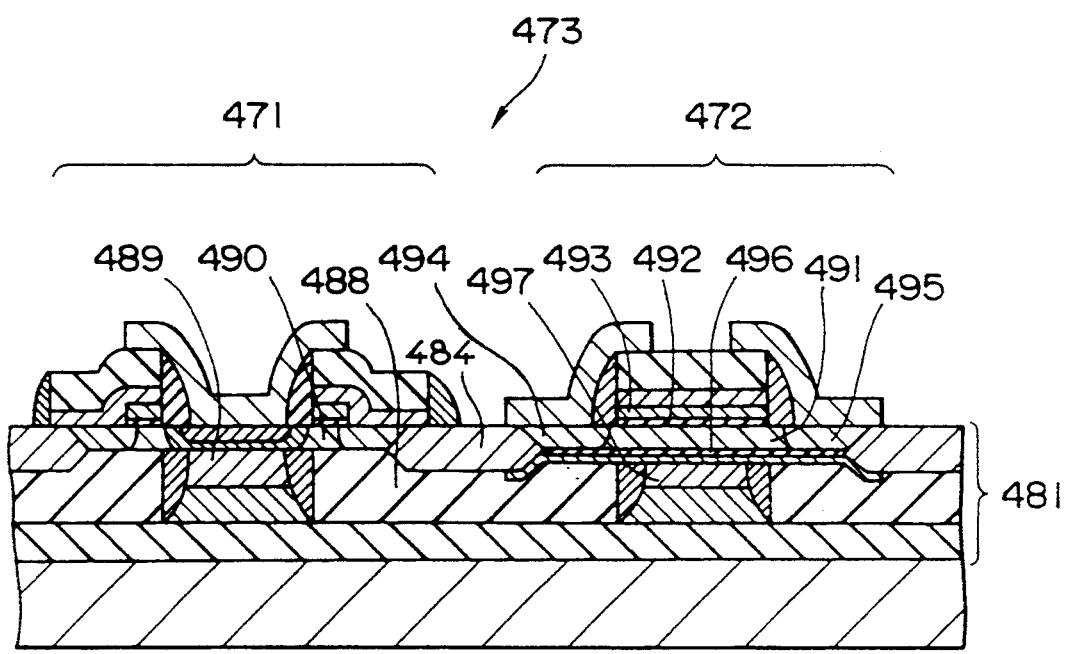
FIG. 19 is a schematic sectional view of a Bi-MOS transistor according to a fifth preferred embodiment of the present invention.

A fifth preferred embodiment of the present invention will be described with reference to FIG. 19 illustrating a semiconductor device including a bipolar transistor and a MOS transistor both mounted on a thin film SOI substrate.

Referring to FIG. 19, reference numeral 473 generally designates an semiconductor device. The semiconductor device 473 is comprised of a bipolar transistor 471 similar to the bipolar transistor described in the fourth preferred embodiment and a MOS transistor 472 to be hereinafter described, both being mounted on a common thin film SOI substrate 481.

The bipolar transistor 471 has substantially the same structure as that of the bipolar transistor described in the fourth preferred embodiment, and so the explanation thereof will be omitted herein.

The structure of the MOS transistor 472 will now be described.

An n-type first silicon layer 490 in which the bipolar transistor 471 is formed and an n-type second silicon layer 491 in which the MOS transistor 472 is formed are formed in an upper layer of the thin film SOI substrate 481 with an element isolating region 484 interposed therebetween.

A gate insulating film 492 of silicon oxide is formed on an upper surface of the second silicon layer 491.

A gate electrode 493 of polysilicon is formed on an upper surface of the gate insulating film 492.

A pair of p+ source and drain regions 494 and 495 are formed in the second silicon layer 491 on the opposite sides of the gate electrode 493.

A back gate insulating film 496 of silicon oxide is formed on a lower surface of the second silicon layer 491.

A back gate electrode 497 of polysilicon is formed in an insulating layer 488 of the thin film SOI substrate 481 so as to be connected with a lower surface of the back gate insulating film 496.

Thus, the MOS transistor 472 has the above construction.

As described above, the bipolar transistor 471 and the MOS transistor 472 are formed on the thin film SOI substrate 481 to constitute the semiconductor device 473.

Although the first conduction type and the second conduction type are defined as an n-type and a p-type, respectively, in the above description, the first conduction type and the second conduction type may be defined as a p-type and an n-type, respectively, according to the present invention.

In the bipolar transistor 471, a p+ base leading electrode 489 is formed in the insulating layer 488, thereby reducing the thickness of the first silicon layer 490 of the thin film SOI substrate 481. Accordingly, the MOS transistor 472 having a high-performance back gate structure can be formed on the common thin film SOI substrate 481.

Further, as similar to the fourth preferred embodiment, a forming area of the bipolar transistor 471 can be reduced.

Although the MOS transistor in the semiconductor device in this preferred embodiment is a PMOS transistor, an NMOS transistor may be similarly formed instead of the PMOS transistor. Further, an NMOS transistor may be similarly formed in addition to the PMOS transistor to thereby form a CMOS transistor. In this case, the semiconductor device becomes a Bi-CMOS device.

A manufacturing method for a semiconductor device according to the fifth preferred embodiment will be described with reference to FIGS. 20A to 20J.

Figure 20A:
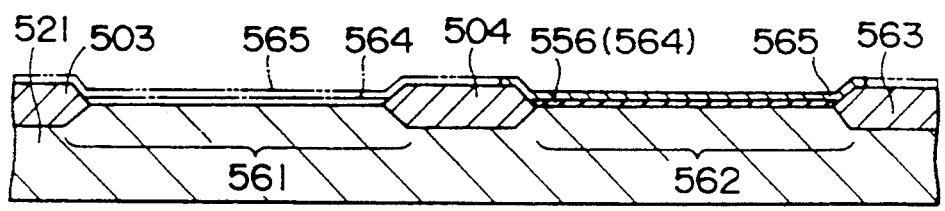
FIGS. 20A to 20J are schematic sectional views illustrating a manufacturing method for the Bi-MOS transistor shown in FIG. 19.

In the first step shown in FIG. 20A, element isolating regions 503, 504 and 563 each having a thickness of 200 nm for isolating a bipolar transistor forming region 561 and a MOS transistor forming region 562 from each other are formed in a surface layer of a silicon substrate 521 of a first conduction type (to be defined as an n-type) by a LOCOS process.

Then, an insulating film 564 is formed in a surface layer of the n-type silicon substrate 521 by a thermal oxidation process.

Then, a polysilicon film 565 is formed on the whole upper surface of the insulating film 564 by a CVD process, so as to prevent that the insulating film 564 will be contaminated by a resist in a photolithography step to be performed later.

Then, a portion of the polysilicon film 565 shown by a two-dot chain line and a portion of the insulating film 564 shown by a one-dot chain line on the bipolar transistor forming region 561 are removed by a photolithography and etching process, thereby forming a back gate insulating film 556 as a remaining portion of the insulating film 564 on the MOS transistor forming region 562.

Figure 20B:
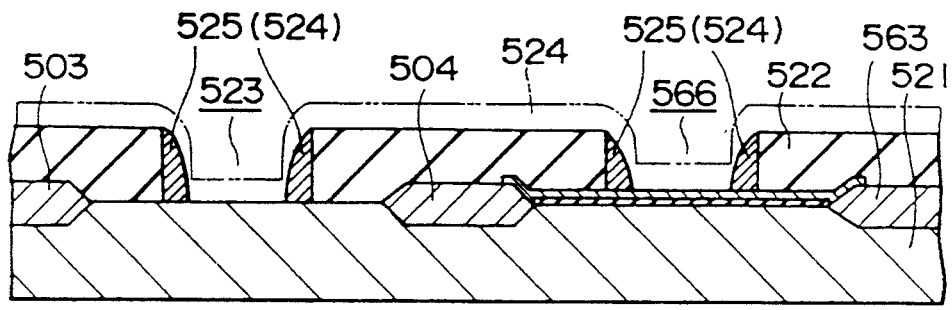

In the second step shown in FIG. 20B, a first insulating layer 522 of silicon nitride is formed on the whole upper surface of the n-type silicon substrate 521 so as to cover the element isolating regions 503, 504 and 563 and the back gate insulating film 556 by a CVD process. Then, a resist is applied to the first insulating layer 522 to form a resist film (not shown) having a flat surface, and thereafter the resist film and an upper layer (shown by a two-dot chain line) of the first insulating layer 522 are etched back to set the thickness of the first insulating film 522 to 300–400 nm and flatten the surface of the first insulating layer 522.

Then, grooves 523 and 566 are formed through the first insulating layer 522 so as to reach the n-type silicon substrate 521 by a photolithography and etching process.

The etching process is performed under the condition that a selection ratio of silicon nitride to silicon is large.

Then, a silicon oxide film 524 is formed on the whole upper surface of the first insulating film 522 so as to fill the grooves 523 and 566. Then, a portion of the silicon oxide film 524 shown by a two-dot chain line is removed by an etch-back process to form a side wall film 525 on each side wall of the grooves 523 and 566.

Figure 20C:
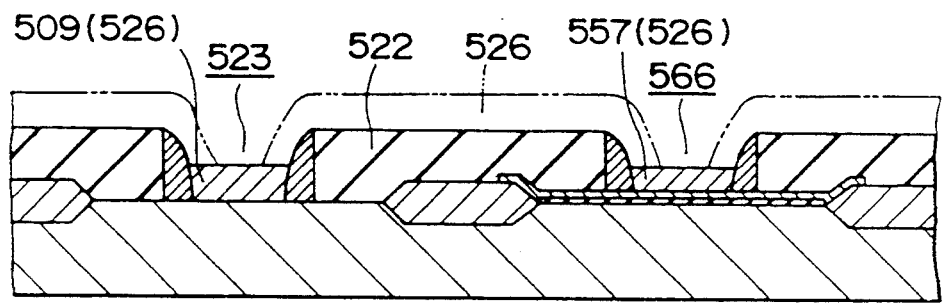

In the third step shown in FIG. 20C, a p-type polysilicon film 526 is formed on the upper surface of the first insulating layer 522 so as to fill the grooves 523 and 566 by a CVD process. Then, a resist is applied to the n-type polysilicon film 526 to form a resist film (not shown) having a flat surface, and thereafter the resist film and a portion of the polysilicon film 526 shown by a two-dot chain line are removed by an etch-back process to form a p+ base leading electrode 509 having a thickness of 50–100 nm in the groove 523 from the polysilicon film 526 and simultaneously form a back gate electrode 557 having a thickness of 300–400 nm in the groove 566 from the polysilicon film 526.

The p-type polysilicon film 526 may be obtained by forming a polysilicon film and thereafter introducing a p-type impurity such as boron ions (B+) into the polysilicon film by an ion implantation process.

Figure 20D:
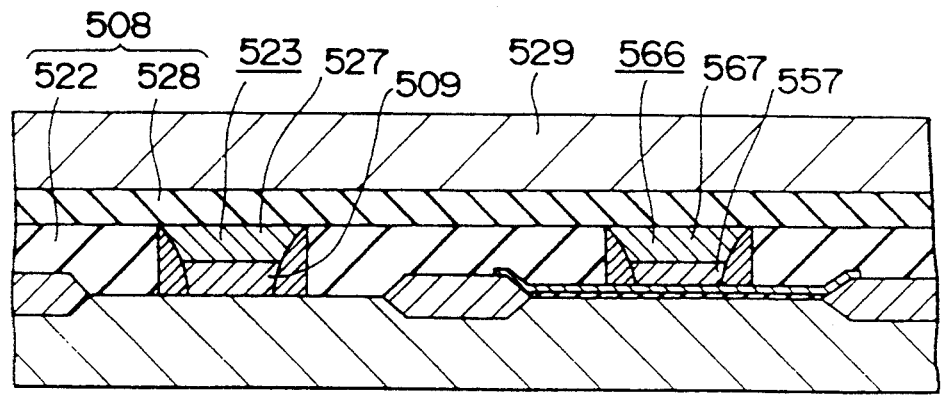

In the fourth step shown in FIG. 20D, tungsten electrodes 527 and 567 are formed on the p+ base leading electrode 509 in the groove 523 and on the back gate electrode 557 in the groove 566, respectively, by selective growth of tungsten (W), so as to reduce resistances of the p+ base leading electrode 509 and the back gate electrode 557. In this case, the thickness of the first insulating layer 522 is set to be larger to enlarge the depth of the grooves 523 and 566.

Then, a second insulating layer 528 of silicon oxide is formed on the whole upper surface of the first insulating layer 522 so as to cover the tungsten electrodes 527 and 567 by a CVD process.

The first insulating layer 522 and the second insulating layer 528 constitute an insulating layer 508.

Then, the surface of the second insulating layer 528 is flat polished, and thereafter a monosilicon wafer 529 as a base wafer is bonded to the flat surface of the second insulating layer 528 by a usual wafer bonding method.

Figure 20E:
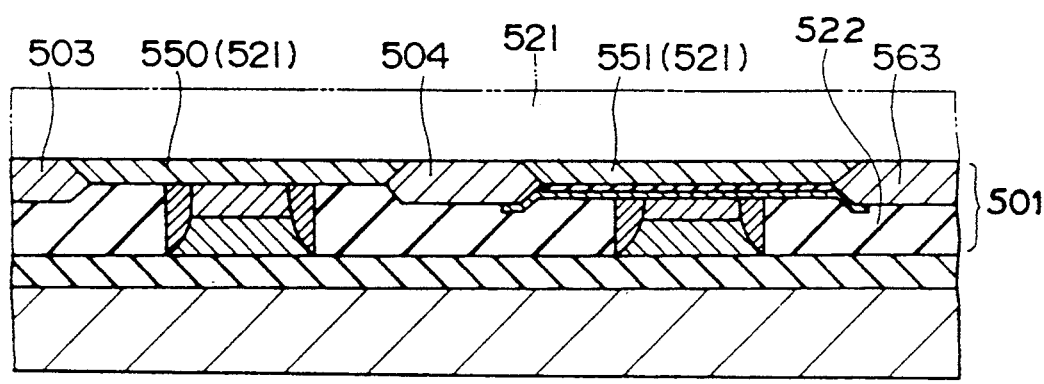

In the fifth step shown in FIG. 20E, a portion of the n-type silicon substrate 521 shown by a two-dot chain line is removed by a grinding and polishing (usual lapping) process so as to expose the element isolating regions 503, 504 and 563. In the grinding and polishing process, the element isolating regions 503, 504 and 563 serve as a polish stopper, and resultantly a first silicon layer 550 is formed between the element isolating regions 503 and 504. Simultaneously, a second silicon layer 551 is formed between the element isolating regions 504 and 563. In this stage, the thickness of the first and second silicon layers 550 and 551 become about ½ of the thickness of the element isolating regions 503, 504 and 563.

It is to be noted that the illustrations of FIGS. 20E to 20J are vertically inverted from the illustration of FIG. 20D.

Figure 20F:
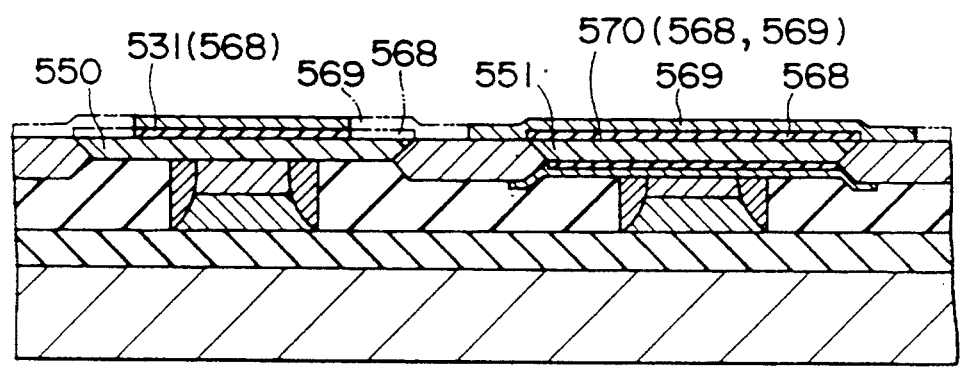

In the sixth step shown in FIG. 20F, an insulating film 568 is formed in each surface layer of the first and second silicon layers 550 and 551 by a thermal oxidation process. Then, a gate electrode forming film 569 of polysilicon is formed on the whole upper surface so as to cover the insulating film 568 by a CVD process.

Then, a portion of the insulating film 568 shown by a two-dot chain line and a portion of the gate electrode forming film 569 shown by a two-dot chain line are removed by a photolithography and etching process to form an isolating pattern 531 on a portion of the upper surface of the first silicon layer 550 from the insulating film 568 and simultaneously form a gate forming pattern 570 so as to cover the second silicon layer 551 from the insulating film 568 and the gate electrode forming film 569.

Figure 20G:
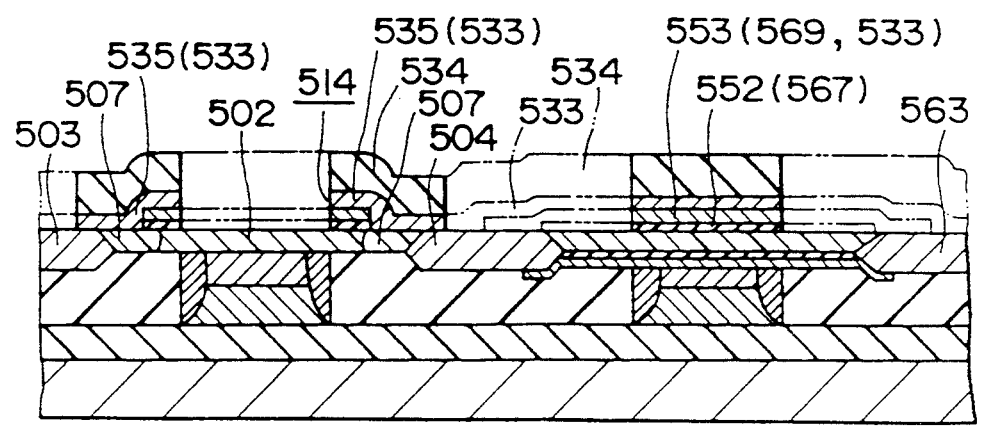

In the seventh step shown in FIG. 20G, a polysilicon film 533 is formed on the whole upper surface so as to cover the isolating pattern 531 and the gate forming pattern 570 by a CVD process.

Then, an n-type impurity such as arsenic ions (As+) is introduced into the polysilicon film 533 by an ion implantation process. Then, a diffusion process is performed to form an n+ collector region 507 in the upper layer of the first silicon layer 550 at the opposite side portions thereof adjacent to the element isolating regions 503 and 504. Alternatively, the n+ collector region 507 may be formed at one side portion of the first silicon layer 550 adjacent to either the element isolating region 503 or 504.

Then, an insulating film 534 of silicon oxide is formed on the upper surface of the polysilicon film 533 by a CVD process.

Then, portions of the insulating film 534, the polysilicon film 533, the gate forming pattern 570 and the isolating pattern 531 shown by two-dot chain lines are removed by a photolithography and etching process to form an emitter contact portion 514. Simultaneously, an n+ collector leading electrode 535 connected with the first silicon layer 550 is formed from the polysilicon film 533. Simultaneously, a gate electrode 553 is formed from the polysilicon film 533 and the gate electrode forming film 569, and a gate insulating film 552 is formed from the insulating film 568.

Figure 20H:
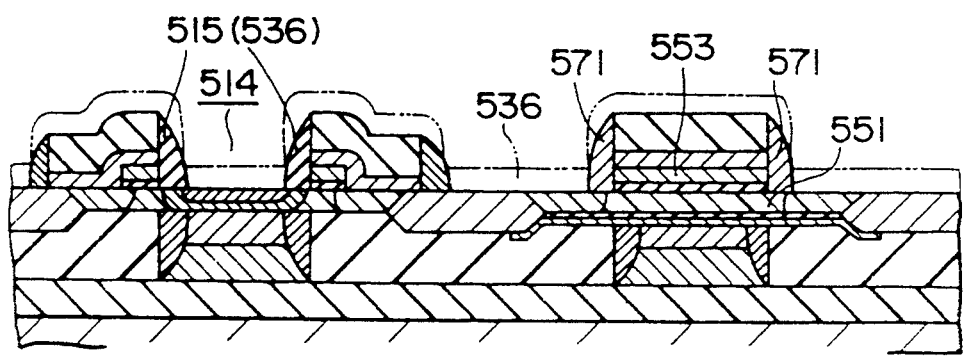

In the eighth step shown in FIG. 20H, an insulating film 536 of silicon oxide is formed on the whole upper surface so as to cover the surface of the insulating film 534 and an inner wall of the emitter contact portion 514 by a CVD process.

Then, a portion of the insulating film 5.36 shown by a two-dot chain line is removed by an etch-back process to form an emitter side wall insulating film 515 on a side wall of the emitter contact portion 514 and simultaneously form a gate side wall insulating film 571 on a side wall of the gate electrode 553.

In the case of forming an LDD structure in the MOS transistor, ion implantation for forming an LDD is performed in the second silicon layer 551 on the opposite sides of the gate electrode 553 before forming the insulating film 536.

Figure 20I:
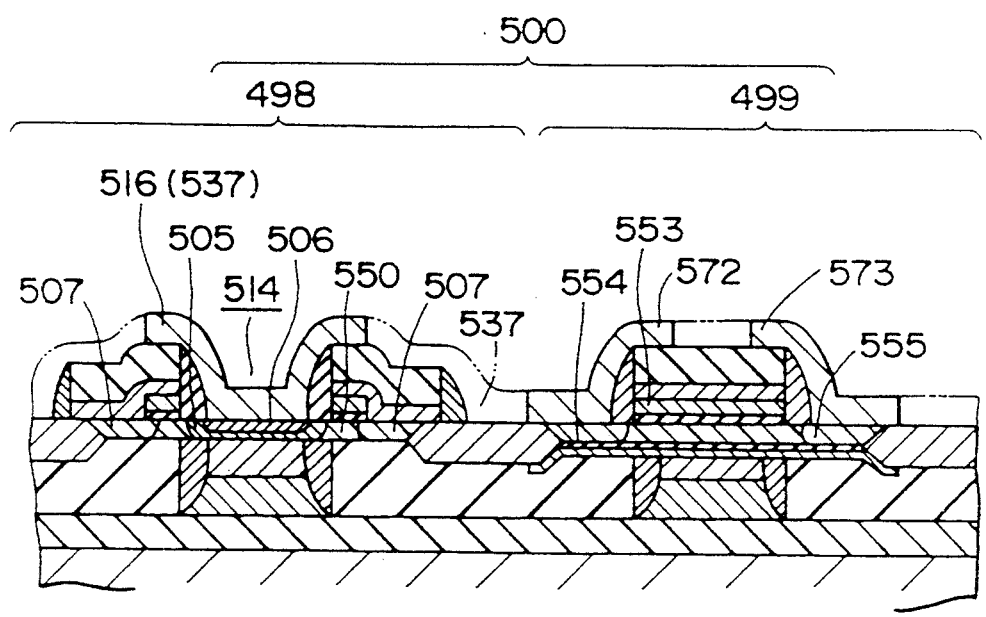

In the ninth step shown in FIG. 20I, a leading electrode forming film 537 of polysilicon is formed on the whole upper surface so as to fill the emitter contact portion 514 and cover the insulating film 534 by a CVD process.

Then, a p-type impurity such as boron ions (B+) is introduced into the leading electrode forming film 537 by an ion implantation process. Then, an annealing process is performed to diffuse the p-type impurity from the leading electrode forming film 537 in the emitter contact portion 514 into the upper layer of the first silicon layer 550 and thereby form a p-type base region 505 so that a portion of the first silicon layer 550 is left between the n+ collector region 507 and the p-type base region 505. Simultaneously, the p-type impurity is diffused from the leading electrode forming film 537 on the opposite sides of the gate electrode 553 into the second silicon layer 551 to thereby form p+ source and drain regions 554 and 555.

Then, an n-type impurity such as arsenic ions (As+) is introduced into the leading electrode forming film 537 on the p-type base region 505 by an ion implantation process. Then, an annealing process is performed to diffuse the n-type impurity from the leading electrode forming film 537 in the emitter contact portion 514 into an upper layer of the p-type base region 505 and thereby form an n+ emitter region 506.

Further, a p-type impurity such as boron ions (B+) is introduced into the leading electrode forming region 537 on the p+ source and drain regions 554 and 555 by an ion implantation process.

Then, a portion of the leading electrode forming film 537 shown by a two-dot chain line is removed by a photolithography and etching process to form an n+ emitter leading electrode 516 connected with the n+ emitter region 506 and simultaneously form p+ source and drain electrodes 572 and 573 respectively connected with the p+ source and drain regions 554 and 555.

In this way, a bipolar transistor 498 and a MOS transistor 499 are formed as shown in FIG. 20I.

In forming the p-type base region 505 and the n+ emitter region 506, the p-type impurity and the n-type impurity in the leading electrode forming film 537 may be simultaneously diffused into the first silicon layer 550 by the same diffusion process to thereby form the p-type base region 505 and the n+ emitter region 506.

Figure 20J:
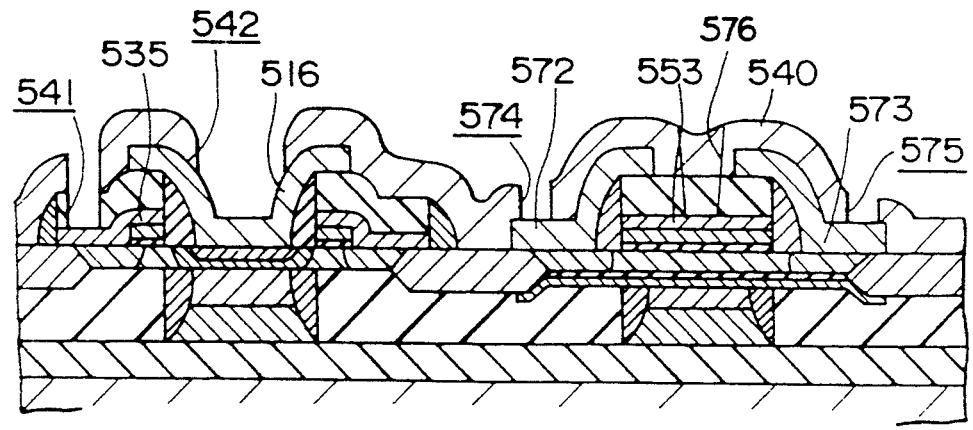

In the tenth step shown in FIG. 20J, an interlayer insulating film 540 of silicon oxide is formed on the whole upper surface so as to cover the emitter leading electrode 516 and the p+ source and drain leading electrodes 572 and 573 by a CVD process. Then, contact holes 541 and 542 are formed on the n+ collector leading electrode 535 and the n+ emitter leading electrode 516, respectively, by a photolithography and etching process. Simultaneously, contact holes 574, 575 and 576 are similarly formed on the p+ source and drain leading electrodes 572 and 573 and the gate electrode 553, respectively. Thereafter, a collector electrode (not shown) and an emitter electrode (not shown) are formed in the contact holes 541 and 542, respectively, by a usual method of forming a metal electrode. Simultaneously, source and drain electrodes (not shown) and a gate electrode (not shown) are similarly formed in the contact holes 574, 575 and 576, respectively.

In the above manufacturing method, the p+ base leading electrode 509 of the bipolar transistor 498 and the back gate electrode 557 of the MOS transistor 499 are formed in the first insulating layer 522 of the thin film SOI substrate 501, and thereafter the first and second silicon layers 550 and 551 of the thin film SOI substrate 501 are formed. Therefore, the thickness of the first and second silicon layers 550 and 551 can be made small.

Although the first conduction type and the second conduction type are defined as an n-type and a p-type, respectively, in the above description, the first conduction type and the second conduction type may be defined as a p-type and an n-type, respectively, according to the present invention.

Although the MOS transistor in the semiconductor device in this preferred embodiment is a PMOS transistor, an NMOS transistor may be similarly formed instead of the PMOS transistor. Further, an NMOS transistor may be similarly formed in addition to the PMOS transistor to thereby form a CMOS transistor. In this case, the semiconductor device becomes a Bi-CMOS device.

A sixth preferred embodiment of the present invention will be described with reference to FIGS. 21A to 21E illustrating a manufacturing method for a Bi-MOS transistor.

In the first step shown in FIG. 21A, a silicon substrate 600 with a crystal orientation of <100> is oxidized by LOCOS to form field oxide films (SiO$_2$) 601 for element isolation. These field oxide films 601 also serve as a polish stopper in a wafer polishing step to be hereinafter described.

The thickness of a thin silicon layer constituting a thin film SOI substrate to be formed later is about ½ of the thickness of each field oxide film. For example, when the thickness of each field oxide film is set to 200 nm, the thickness of the thin silicon layer becomes about 100 nm.

Then, a back gate oxide film 602a is formed on the upper surface of the silicon substrate 600, and then a polysilicon film 603a is formed on the back gate oxide film 602a. Then, the polysilicon film 603a and the back gate oxide film 602a on a bipolar transistor forming region only are removed.

Then, an insulating layer (SiO$_2$) 602 is formed by CVD on the upper surface of the silicon substrate 600, and then the upper surface of the insulating layer 602 is flattened by etch-back after resist coating. The thickness of the insulating layer 602 after flattened is about 100–200 nm.

Then, grooves 611 and 612 are formed through the insulating layer 602 at the bipolar transistor forming region and a MOS FET forming region, respectively.

Then, side wall films (SiO$_2$) 602' are formed on side walls of the grooves 611 and 612 by CVD and RIE. These side wall films 602' serve to allow for alignment between a base region (intrinsic base) and a base contact of the bipolar transistor and between a back gate electrode and a gate electrode of the MOS FET.

In the second step shown in FIG. 21B, a monosilicon film 592 is formed in the groove 611 so as to be connected with the silicon substrate 600 by selective epitaxial growth using SiH$_4$ and HCl. The thickness of the monosilicon film 592 is set to about 100–200 nm. Then, a polysilicon film 603b is formed by CVD on the upper surface of the insulating layer 602 so as to fill the grooves 611 and 612, and then the polysilicon film 603b is removed by etch-back after resist coating to form a base leading electrode of the bipolar transistor and a back gate electrode of the MOS FET in the grooves 611 and 612, respectively.

The formation of the base leading electrode and the back gate electrode may be effected by selective CVD. The thickness of each polysilicon film 603b formed in the grooves 611 and 612 is about 50–100 nm.

Then, as required, a suitable conduction type of impurity is introduced into the polysilicon film 603b and diffused therein by ion implantation and annealing. For example, when forming an NPN bipolar transistor, the polysilicon film 603b in the groove 611 is doped with a p-type impurity; when forming a PMOS FET, the polysilicon film 603b in the groove 612 is doped with a p-type impurity; and when forming an NMOS FET, the polysilicon film 603b in the groove 612 is doped with an n-type impurity.

Then, tungsten (W) electrodes 604a are formed in the grooves 611 and 612 by selective CVD, so as to reduce wiring resistances of the base leading electrode and the back gate electrode. Then, an insulating film (SiO$_2$) 604 is formed by CVD on the insulating film 602.

Figure 3A:
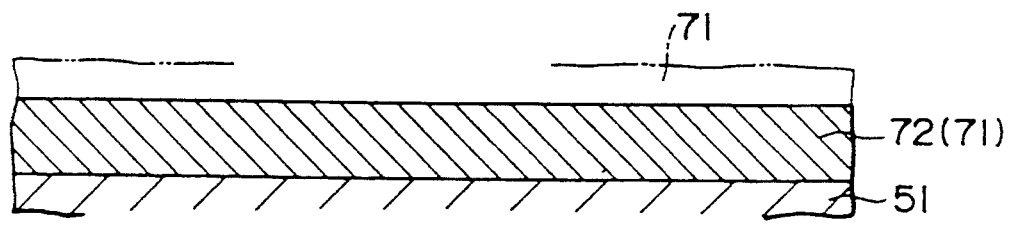
FIGS. 3A to 3E are schematic sectional views illustrating a manufacturing method for the lateral bipolar transistor shown in FIG. 2.
Figure 3B:
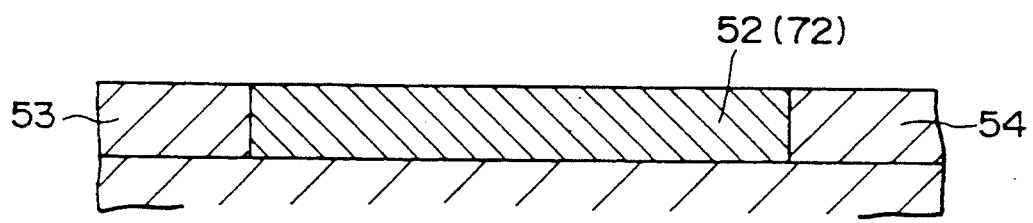
Figure 3C:
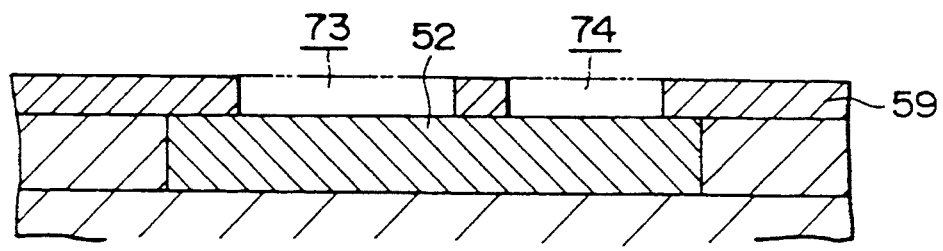
Figure 3D:
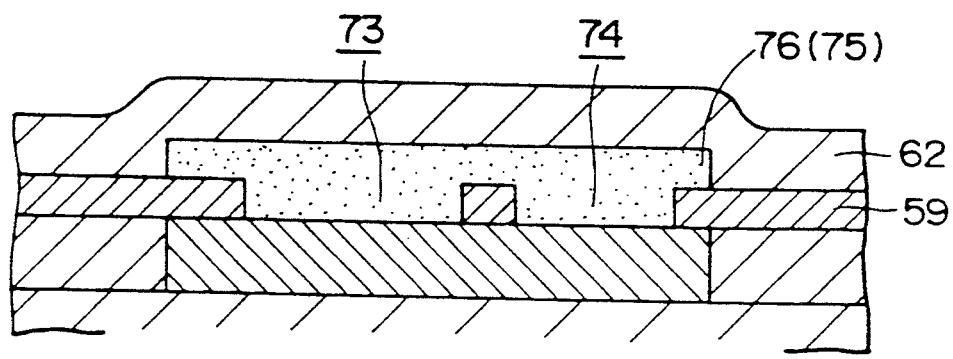
Figure 3E:
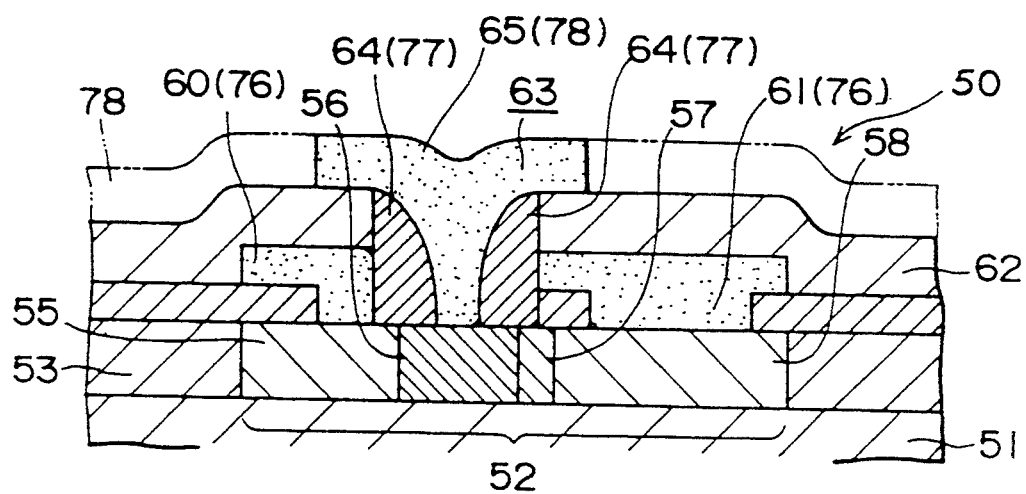
Figure 4:
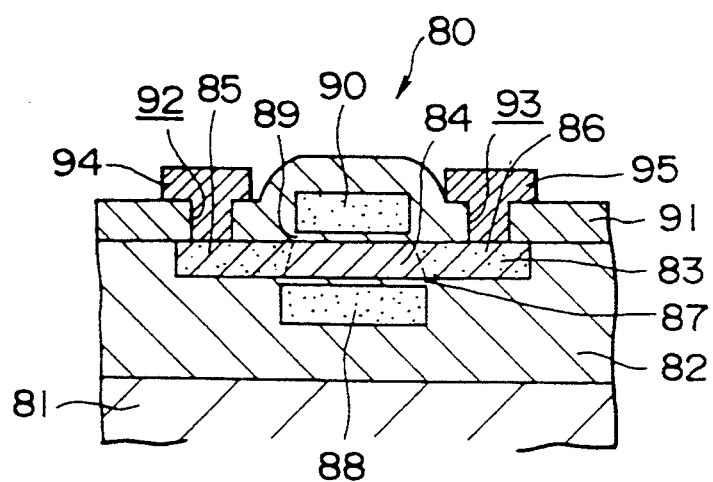
FIG. 4 is a schematic sectional view of a MOS FET as a third example in the prior art.
Figure 5:
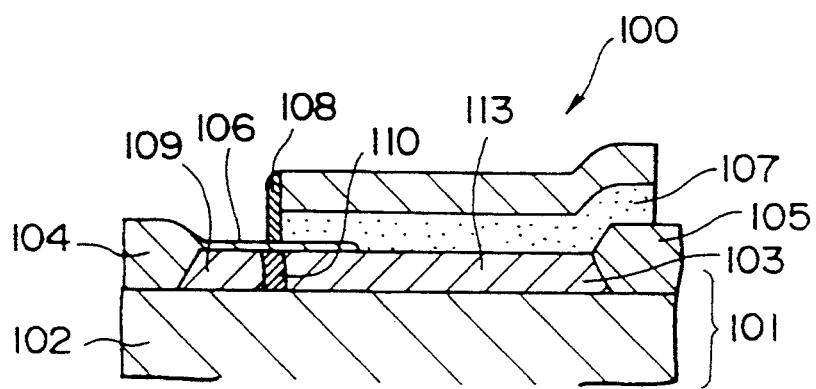
FIG. 5 is a schematic sectional view of a lateral NPN bipolar transistor as a fourth example in the prior art.
Figure 6:
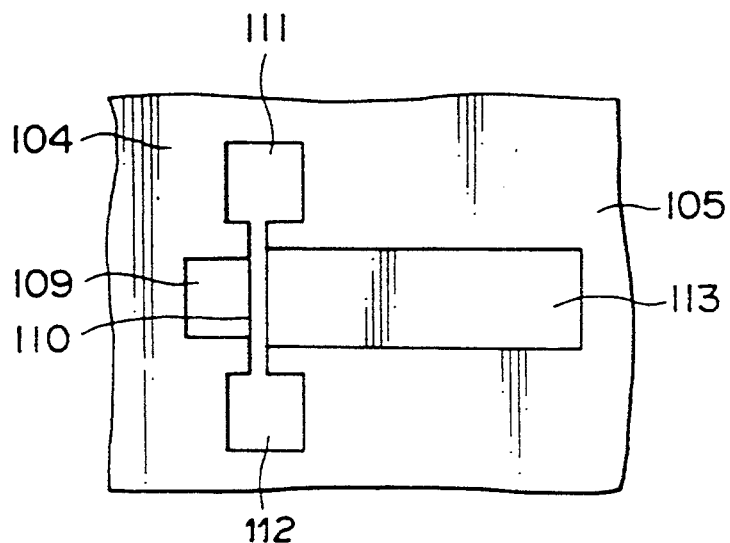
FIG. 6 is a schematic view illustrating a layout of the lateral NPN bipolar transistor shown in FIG. 5.
Figure 7:
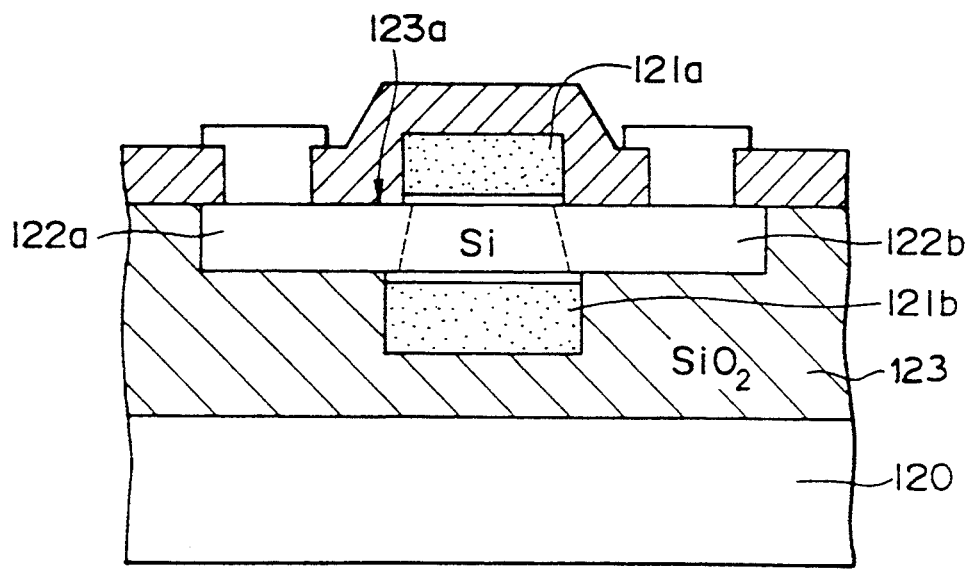
FIG. 7 is a schematic sectional view of a double gate type MOS transistor manufactured by using a bonding technique as a fifth example in the prior art.
Figure 8A:
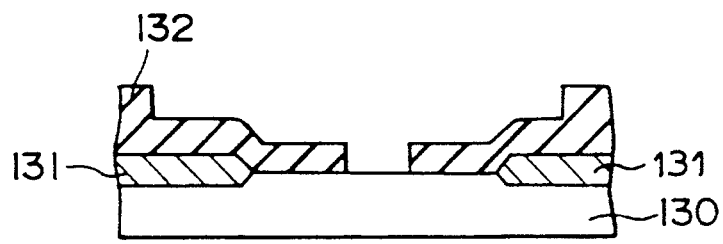
FIGS. 8A to 8F are schematic sectional views illustrating a manufacturing method for the double gate type MOS transistor shown in FIG. 7.
Figure 8B:
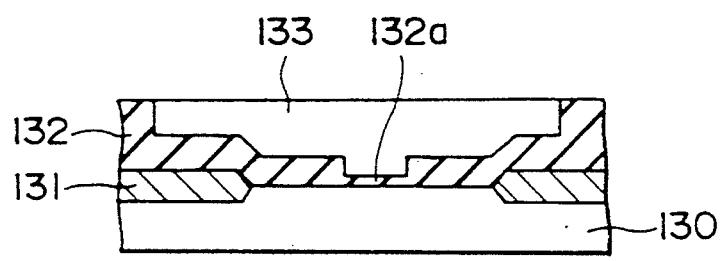
Figure 8C:
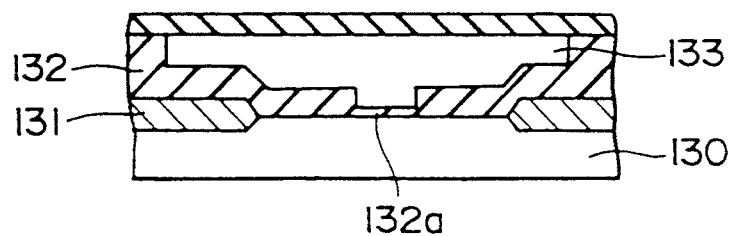
Figure 8D:
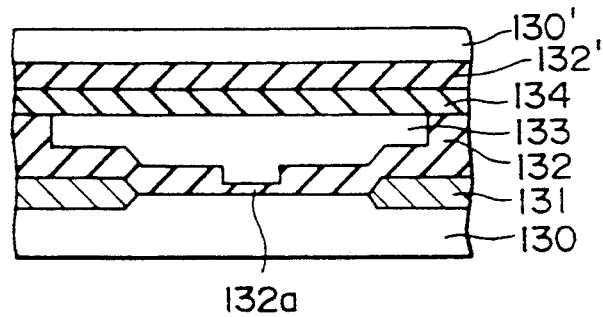
Figure 8E:
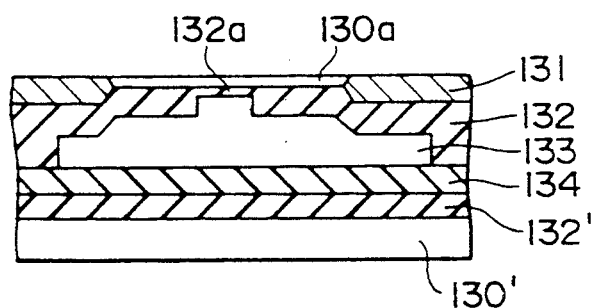
Figure 8F:
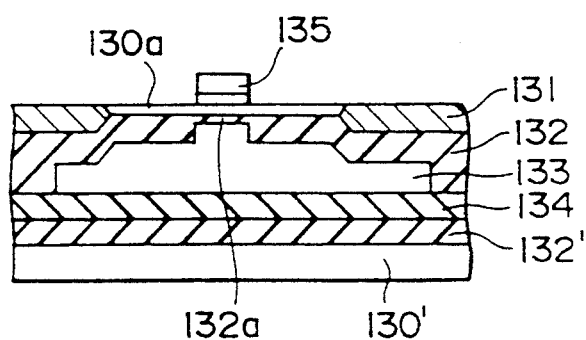
Figure 9C:
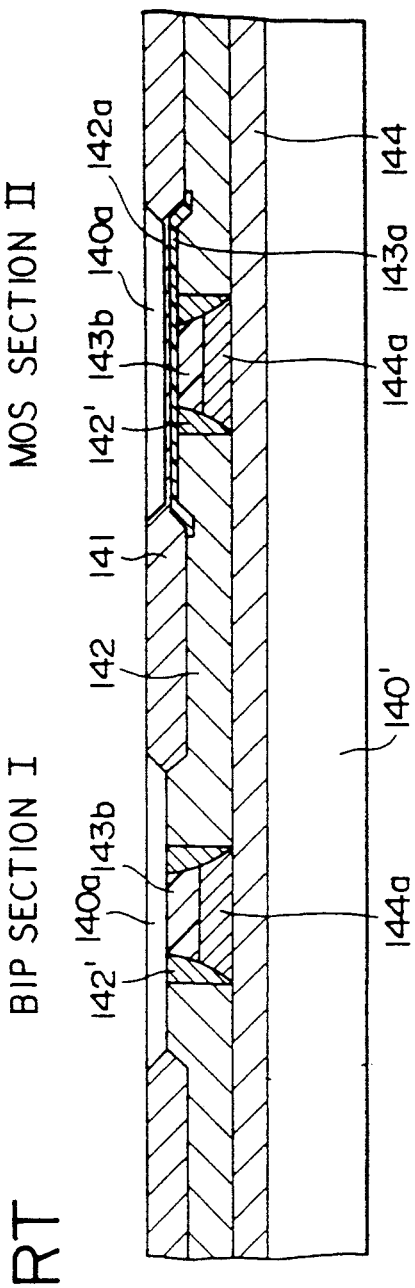
Figure 9D:
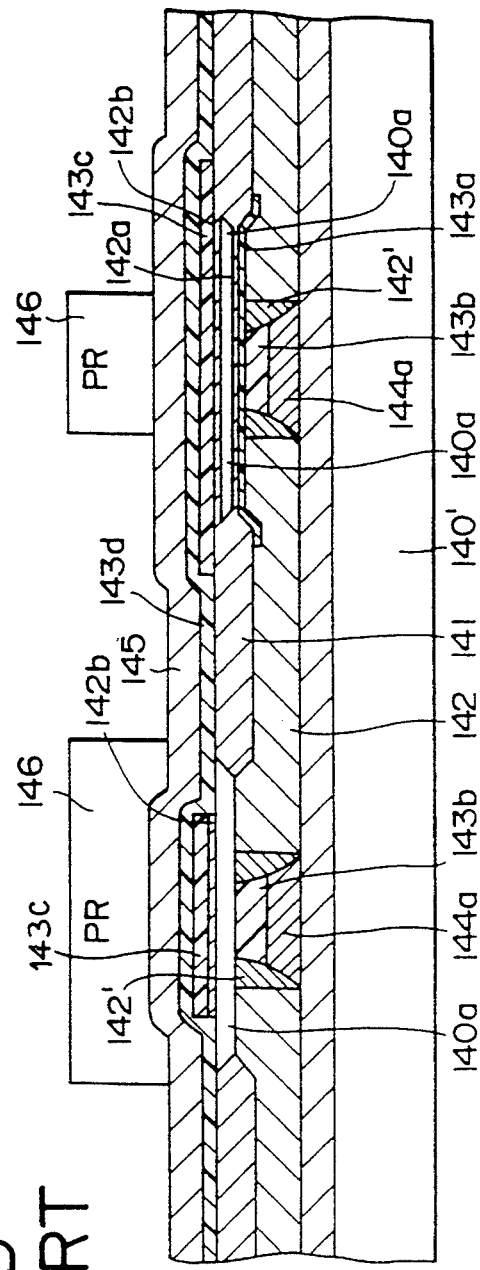
Figure 9E:
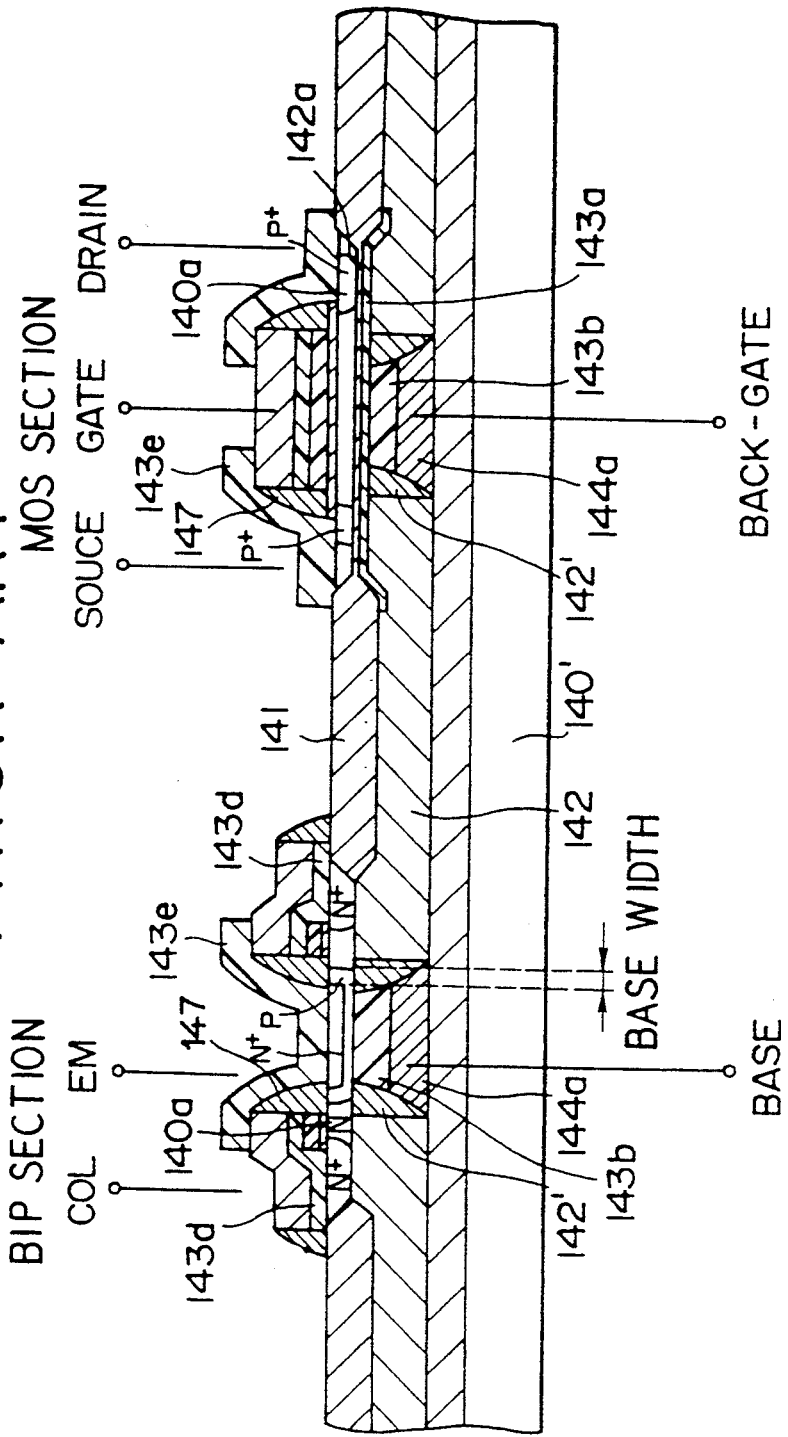

Thus, the laminated structure of a base leading electrode portion buried in the groove 611 is constituted of the monosilicon film 592, the polysilicon film 603b and the tungsten film 604a. This structure differs from that shown in FIG. 9B in the point that the monosilicon film 592 is interposed between the polysilicon film 603b and the silicon substrate 600.

In the third step shown in FIG. 21C (vertically inverted from FIG. 21B), a silicon substrate 600' as a back wafer is bonded to a back surface of the insulating film 604, and then the silicon substrate 600 is polished from its upper surface as viewed in FIG. 21C until the field oxide films 601 are exposed, so that thin silicon layers 600a as SOI regions are residually formed between the field oxide films 601.

In the fourth step shown in FIG. 21D, a gate oxide film 602b is formed on the thin silicon layers 600a by thermal oxidation, and then a polysilicon film 603c is formed on the gate oxide film 602b by CVD. Then, the polysilicon film 603c and the gate oxide film 602b are etched by RIE with a resist mask covering an emitter and base region forming area and a MOS FET forming area.

Then, a polysilicon film 603d is formed so as to fully cover the polysilicon film 603c patterned above. The polysilicon films 603c and 603d function as a collector leading electrode of the bipolar transistor and a gate electrode of the MOS FET. Then, as required, a suitable conduction type of impurity is introduced into the polysilicon film 603d and diffused therein by ion implantation and annealing. For example, when forming an NPN bipolar transistor, the polysilicon film 603d for the collector leading electrode is doped with an n-type impurity; when forming a PMOS FET, the polysilicon film 603d for the gate electrode is doped with a p-type impurity; and when forming an NMOS FET, the polysilicon film 603d is doped with an n-type impurity.

Then, an insulating film (SiO$_2$) 605 is formed by CVD on the polysilicon film 603d. Then, a resist mask 606 is formed on the insulating film 605 so as to cover the bipolar transistor forming region and a gate electrode forming region.

In the fifth step shown in FIG. 21E, the insulating film 605 and the polysilicon film 603d are etched by RIE with the resist mask 606.

Then, the insulating film 605, the polysilicon film 603d, the polysilicon film 603c and the gate oxide film 602b existing on the bipolar transistor forming region are etched by RIE to form an emitter contact hole.

Then, side wall insulating films (SiO$_2$) 607 are formed by CVD and RIE on side walls of the emitter contact hole and the gate electrode. In the case of making an LDD structure in the MOS FET, ion implantation for forming an LDD is performed before forming the side wall insulating films 607. In this case, the side wall insulating film 607 on the side wall of the gate electrode also serves as an LDD spacer.

Then, a polysilicon film 603e is formed on the whole upper surface. The polysilicon film 603e on the bipolar transistor forming region functions as an emitter leading electrode, and the polysilicon film 603e on the MOS FET forming region functions as source and drain leading electrodes.

Then, in the case of an NPN bipolar transistor, a p-type impurity such as boron ions (B$^+$) is implanted into the polysilicon film 603e on the bipolar transistor forming region, and then annealing is performed to form a p-type base region in the thin silicon layer 600a. Then, an n-type impurity such as arsenic ions (As$^+$) is implanted into the polysilicon film 603e on the bipolar transistor forming region, and then annealing is performed to form an n$^+$ emitter region in the thin silicon layer 600a on the p-type base region. Further, in the case of a PMOS FET, a p-type impurity such as boron ions (B+) is implanted into the polysilicon film 603e on the MOS FET forming region, and then annealing is performed to form p+ source and drain regions in the thin silicon layer 600a, while in the case of an NMOS FET, an n-type impurity such as arsenic ions (As+) is implanted into the polysilicon film 603e on the MOS FET forming region, and then annealing is performed to form n+ source and drain regions in the thin silicon layer 600a.

Then, the polysilicon film 603e is etched to form the emitter leading electrode and the source and drain leading electrodes.

Then, although not shown, an insulating film (SiO$_2$) is formed on the whole upper surface, and then contact holes are formed through the insulating film so as to expose the emitter leading electrode, the collector leading electrode, the source leading electrode and the drain leading electrode. Then, metal electrodes are formed in the contact holes from Ti/TiN/Al-Si, polysilicon/tungsten silicide, etc.

In this manner, the thin film SOI type bipolar transistor and the double gate thin film SOI type MOS FET are simultaneously formed on the same substrate. This bipolar transistor is constituted of an intrinsic region and a minimum contact region, and is substantially surrounded by an insulator, thus effecting high performance and high integration.

Furthermore, the base contact can be formed just under the base region, and the adverse effects on the characteristics of the bipolar transistor as mentioned previously can be eliminated because the monosilicon film as the base contact is interposed between the base leading electrode and the base region.

In the sixth preferred embodiment, the base contact is formed by selective epitaxial growth of monosilicon. As a modification, the base contact may be formed by laser annealing of polysilicon. More specifically, in the step corresponding to that shown in FIG. 22B, a first polysilicon film is formed by CVD on the whole upper surface of the insulating film 602 so as to fill the groove 611. Then, the first polysilicon film is removed by etchback after resist coating so as to remain in the groove 611. The thickness of the first polysilicon film formed in the groove 611 is set to about 10-20 nm.

Then, the first polysilicon film is irradiated by excimer laser with the energy of 500 mJ/cm$^2$ to be converted into a monosilicon film.

Thereafter, a second polysilicon film corresponding to the polysilicon film 603b shown in FIG. 22B is similarly formed on the monosilicon film obtained above.

The other steps are the same as those of the sixth preferred embodiment.

As described above, the base contact can be formed just under the base region, and the adverse effects on the characteristics of the bipolar transistor can be eliminated to thereby realize the formation of a high-performance lateral bipolar transistor. Further, since such a high-performance lateral bipolar transistor and a double gate thin film SOI type MOS FET can be simultaneously formed on the same substrate, a high-performance and high-integration semiconductor device can be realized.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A manufacturing method for a lateral bipolar transistors comprising:
   the first step of forming a transistor forming region on an upper surface of an insulating substrate;
   the second step of forming a first insulating film on an upper surface of said transistor forming region;
   the third step of forming a first impurity diffusing region on one side of said transistor forming region; and
   the fourth step of introducing a second conduction type of impurity into said first impurity diffusing region, then introducing a first conduction type of impurity into said first impurity diffusing region, then diffusing said second conduction type of impurity from said first impurity diffusing region into a first portion of said transistor forming region near said first impurity diffusing region to form a base region in said first portion, and simultaneously diffusing said first conduction type of impurity from said first impurity diffusing region into a second portion of said transistor forming region between said first portion and said first impurity diffusing region to form an emitter region in said second portion.

2. A manufacturing method for a lateral bipolar transistor, comprising:
   the first step of forming a transistor forming region on an upper surface of an insulating substrate;
   the second step of forming a first insulating film on an upper surface of said transistor forming region;
   the third step of forming a first impurity diffusing region on one side of said transistor forming region;
   the fourth step of introducing a second conduction type of impurity into said first impurity diffusing region, and then diffusing said second conduction type of impurity from said first impurity diffusing region into a first portion of said transistor forming region near said first impurity diffusing region to form a base region in said first portion; and
   the fifth step of introducing a first conduction type of impurity into said first impurity diffusing region, and then diffusing said first conduction type of impurity from said first impurity diffusing region into a second portion of said transistor forming region between said first portion and said first impurity diffusing region to form an emitter region in said second portion.

3. A manufacturing method for a lateral bipolar transistor, comprising:
   the first step of forming a transistor forming region of a first conduction type on an upper surface of an insulating substrate:
   the second step of forming a first insulating film on an upper surface of said transistor forming region;
   the third step of forming a first impurity diffusing region on one side of said transistor forming region and forming a second impurity diffusing region on the other side of said transistor forming region;
   the fourth step of forming a second insulating film on a surface of said first impurity diffusing region and forming a third insulating film on a surface of said second impurity diffusing region; and
   the fifth step of introducing a second conduction type of impurity into said first impurity diffusing region, then introducing a first conduction type of impurity into said first impurity diffusing region and said second impurity diffusing region, then diffusing said second conduction type of impurity from said first impurity diffusing region into a first portion of said transistor forming region near said first impurity diffusing region to form a base region in said first portion, simultaneously diffusing said first conduction type of impurity from said first impurity diffusing region into a second portion of said transistor forming region between said first portion and said first impurity diffusing region to form an emitter region in said second portion, and simultaneously diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion.

4. A manufacturing method for a lateral bipolar transistor, comprising:
the first step of forming a transistor forming region of a first conduction type on an upper surface of an insulating substrate;
the second step of forming a first insulating film on an upper surface of said transistor forming region;
the third step of forming a first impurity diffusing region on one side of said transistor forming region and forming a second impurity diffusing region on the other side of said transistor forming region;
the fourth step of forming a second insulating film on a surface of said first impurity diffusing region and forming a third insulating film on a surface of said second impurity diffusing region;
the fifth step of introducing a second conduction type of impurity into said first impurity diffusing region and then diffusing said second conduction type of impurity from said first impurity diffusing region into a first portion of said transistor forming region near said first impurity diffusing region to form a base region in said first portion; and
the sixth step of introducing a first conduction type of impurity into said first impurity diffusing region and said second impurity diffusing region, then diffusing said first conduction type of impurity from said first impurity diffusing region into a second portion of said transistor forming region between said first portion and said first impurity diffusing region to form an emitter region in said second portion, and simultaneously diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion.

5. A manufacturing method for a lateral bipolar transistor, comprising:
the first step of forming a transistor forming region on an upper surface of an insulating substrate;
the second step of forming a first insulating film on an upper surface of said transistor forming region;
the third step of forming a first impurity diffusing region on one side of said transistor forming region and forming a second impurity diffusing region on the other side of said transistor forming region;
the fourth step of forming a second insulating film on a surface of said first impurity diffusing region and forming a third insulating film on a surface of said second impurity diffusing region in a self-alignment manner: and
the fifth step of diffusing a second conduction type of impurity from said first impurity diffusing region into a first portion of said transistor forming region below a spacing between said second insulating film and said third insulating film to form a base region in said first portion, diffusing a first conduction type of impurity from said first impurity diffusing region into a second portion of said transistor forming region adjacent to said first impurity diffusing region to form an emitter region in said second portion, diffusing said first conduction type of impurity from said second impurity diffusing region into a third portion of said transistor forming region adjacent to said second impurity diffusing region to form a collector contact region in said third portion with a collector region being formed as a remaining portion of said transistor forming region between said first portion and said third portion, forming a base contact portion through said first insulating film in said spacing between said second insulating film and said third insulating film, and forming a base leading electrode in said base contact portion.

6. A manufacturing method for a bipolar transistor, comprising:
the first step of forming first and second element isolating regions spaced from each other in a surface layer of a silicon substrate, then forming a first insulating layer on an entire surface where said first and second element isolating regions are formed, and then forming a groove reaching said silicon substrate through said first insulating layer;
the second step of forming a collector region connected with said silicon substrate in said groove, then forming a collector leading electrode connected with said collector region in said groove, and then forming a second insulating layer on an entire surface where said collector leading electrode is formed;
the third step of partially removing said silicon substrate to such an extent that said first and second element isolating regions are exposed, and thereby forming a silicon layer from said silicon substrate remaining between said first and second element isolating regions;
the fourth step of forming an isolating pattern on a portion of said silicon layer over said collector region;
the fifth step of forming a polysilicon film and an insulating film on an entire surface where said isolating pattern is formed, then forming a graft base region in an upper layer of said silicon layer at a portion thereof adjacent to at least one of said first and second element isolating regions, and then partially removing said insulating film, said polysilicon film and said isolating pattern on a portion of said silicon layer to form an emitter contact portion; and the sixth step of forming an emitter side wall insulating film on a side wall of said emitter contact portion, then forming a leading electrode forming film in said emitter contact portion, then diffusing an impurity from said leading electrode forming film into the upper layer of said silicon layer to form a base region connected with said graft base region and form an emitter region in an upper layer of said base region, and then forming an emitter leading electrode from said leading electrode forming film.

7. A manufacturing method for a semiconductor device having a bipolar transistor and a MOS transistor, comprising:

the first step of forming first, second and third element isolating elements spaced from each other for isolating a bipolar transistor forming region from a MOS transistor forming region in a surface layer of a silicon substrate, then forming a back gate insulating film on an entire surface of said silicon substrate in said MOS transistor forming region, then forming a first insulating layer on an entire surface where said first, second and third element isolating regions are formed, and then forming first and second grooves reaching said silicon substrate through said first insulating layer in said bipolar transistor forming region and said MOS transistor forming region, respectively;

the second step of forming a collector region connected with said silicon substrate in said first groove, then forming a collector leading electrode connected with said collector region in said first groove and a back gate electrode in said second groove, and then forming a second insulating layer on an entire surface where said first insulating layer is formed;

the third step of partially removing said silicon substrate to such an extent that said first, second and third element isolating regions are exposed, and thereby forming a first silicon layer from said silicon substrate remaining between said first and second element isolating regions and a second silicon layer from said silicon substrate remaining between said second and third element isolating regions;

the fourth step of forming an isolating pattern on a portion of said first silicon layer over said collector region and simultaneously forming a gate insulator forming film on an upper surface of said second silicon layer to thereafter form a gate electrode forming film on said gate insulator forming film;

the fifth step of forming a polysilicon film and an insulating film on an entire surface where said isolating pattern and said gate electrode forming film are formed, then forming a graft base region in an upper layer of said first silicon layer at a portion thereof adjacent to at least one of said first and second element isolating regions, then partially removing said insulating film, said polysilicon film and said isolating pattern on a portion of said first silicon layer to there form an emitter contact portion and a base leading electrode from said polysilicon film, and simultaneously partially removing said insulating film, said polysilicon film, said gate electrode forming film and said gate insulator forming film on a portion of said second silicon layer to thereby form a gate electrode from said polysilicon film and said gate electrode forming film and a gate insulating film from said gate insulator forming film; and the sixth step of forming an emitter side wall insulating film on a side wall of said emitter contact portion, then forming a leading electrode forming film on an entire surface where said insulating film is formed, then forming a base region connected with said graft base region in the upper layer of said first silicon layer, an emitter region in an upper layer of said base region, and a pair of source and drain regions in said second silicon layer on both sides of said gate electrode, and then forming an emitter leading electrode in said emitter contact portion from said leading electrode forming film and a pair of source and drain leading electrodes respectively connected with said source and drain regions on both sides of said gate electrode from said leading electrode forming film.

8. A manufacturing method for a bipolar transistor, comprising:

the first step of forming first and second element isolating regions spaced from each other in a surface layer of a silicon substrate, then forming a first insulating layer on an entire surface where said first and second element isolating regions are formed, and then forming a groove reaching said silicon substrate through said first insulating layer;

the second step of forming a base leading electrode connected with said silicon substrate in said groove, and then forming a second insulating layer on an entire surface where said base leading electrode is formed:

the third step of partially removing said silicon substrate to such an extent that said first and second element isolating regions are exposed, and thereby forming a silicon layer from said silicon substrate remaining between said first and second element isolating regions;

the fourth step of forming an isolating pattern on a portion of said silicon layer over said base leading electrode;

the fifth step of forming a polysilicon film and an insulating film on an entire surface where said isolating pattern is formed, then forming a collector region in said silicon layer at a portion thereof adjacent to at least one of said first and second element isolating regions, and then partially removing said insulating film, said polysilicon film and said isolating pattern on a portion of said silicon layer to form an emitter contact portion; and the sixth step of forming an emitter side wall insulating film on a side wall of said emitter contact portion, then forming a leading electrode forming film in said emitter contact portion, then diffusing an impurity from said leading electrode forming film into said silicon layer to form a base region connected with said base leading electrode and form an emitter region in an upper layer of said base region, and then forming an emitter leading electrode from said leading electrode forming film.

9. A manufacturing method for a semiconductor device having a bipolar transistor and a MOS transistor, comprising:

the first step of forming first, second and third element isolating elements spaced from each other for isolating a bipolar transistor forming region from a MOS transistor forming region in a surface layer of a silicon substrate, then forming a back gate insulating film on an entire surface of said silicon substrate in said MOS transistor forming region, then forming a first insulating layer on an entire surface where said first, second and third element isolating regions are formed, and then forming first and second grooves reaching said silicon substrate through said first insulating layer in said bipolar transistor forming region and said MOS transistor forming region, respectively;

the second step of forming a base leading electrode connected with said silicon substrate in said first groove and a back gate electrode in said second groove, and then forming a second insulating layer on an entire surface where said first insulating layer is formed;

the third step of partially removing said silicon substrate to such an extent that said first, second and third element isolating regions are exposed, and thereby forming a first silicon layer from said silicon substrate remaining between said first and second element isolating regions and a second silicon layer from said silicon substrate remaining between said second and third element isolating regions;

the fourth step of forming an isolating pattern on a portion of said first silicon layer over said base leading electrode and simultaneously forming a gate insulator forming film on an upper surface of said second silicon layer to thereafter form a gate electrode forming film on said gate insulator forming film;

the fifth step of forming a polysilicon film and an insulating film on an entire surface where said isolating pattern and said gate electrode forming film are formed, then forming a collector region in said first silicon layer at a portion thereof adjacent to at least one of said first and second element isolating regions, then partially removing said insulating film, said polysilicon film and said isolating pattern on a portion of said first silicon layer to there form an emitter contact portion and a collector leading electrode from said polysilicon film, and simultaneously partially removing said insulating film, said polysilicon film, said gate electrode forming film and said gate insulator forming film on a portion of said second silicon layer to thereby form a gate electrode from said polysilicon film and said gate electrode forming film and a gate insulating film from said gate insulator forming film; and the sixth step of forming an emitter side wall insulating film on a side wall of said emitter contact portion and a gate side wall insulating film on a side wall of said gate electrode, then forming a leading electrode forming film on an entire surface where said insulating film is formed, then forming a base region in said first silicon layer, an emitter region in an upper layer of said base region, and a pair of source and drain regions in said second silicon layer on both sides of said gate electrode, and then forming an emitter leading electrode in said emitter contact portion from said leading electrode forming film and a pair of source and drain leading electrodes respectively connected with said source and drain regions on both sides of said gate electrode from said leading electrode forming film.

10. A manufacturing method for a semiconductor device having a bipolar transistor and a MOS transistor, comprising:

the first step of forming a back gate insulating film on a silicon substrate in a MOS transistor forming region, then forming a first insulating layer on said silicon substrate, and then forming first and second grooves through said first insulating layer in a bipolar transistor forming region and said MOS transistor forming region, respectively;

the second step of forming a monosilicon layer in said first groove, then forming first and second polysilicon layers in said first and second grooves to simultaneously form a base leading electrode and a back gate electrode, respectively, and then forming a second insulating layer on said first insulating layer;

the third step of bonding a back wafer to said second insulating layer, then polishing said silicon substrate to form first and second silicon layers in said bipolar transistor forming region and said MOS transistor forming region, respectively;

the fourth step of forming a gate insulating film on said first and second silicon layers, then forming third and fourth polysilicon layers on said gate insulating film over said first and silicon layers, respectively, then forming a collector region in said first silicon layer, then forming a collector leading electrode and a gate electrode from said third and fourth polysilicon layers, respectively, then forming a base region in said first silicon layer and source and drain regions in said second silicon layer by diffusion of an impurity from said third and fourth polysilicon layers, respectively, and then forming an emitter region in an upper layer of said base region by diffusion of an impurity from said third polysilicon layer.

11. The manufacturing method according to claim 10, wherein said monosilicon layer is formed by selective epitaxial growth of monosilicon.

12. The manufacturing method according to claim 10, wherein said monosilicon layer is formed by conversion of polysilicon into monosilicon.

13. The manufacturing method according to claim 12, wherein said conversion of polysilicon into monosilicon comprises the steps of forming a polysilicon film by CVD and then applying heat to said polysilicon film.

* * * * *